United States Patent
Wakui et al.

(10) Patent No.: US 7,633,132 B2
(45) Date of Patent: Dec. 15, 2009

(54) MAGNETIC SENSOR AND MANUFACTURING METHOD THEREFOR

(75) Inventors: Yukio Wakui, Iwata-gun (JP); Susumu Yoshida, Hamamatsu (JP); Kokichi Aiso, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 11/704,366

(22) Filed: Feb. 9, 2007

(65) Prior Publication Data
US 2007/0210792 A1    Sep. 13, 2007

Related U.S. Application Data

(62) Division of application No. 10/891,451, filed on Jul. 15, 2004, now Pat. No. 7,394,086.

(30) Foreign Application Priority Data

| Jul. 18, 2003 | (JP) | 2003-199280 |
| Jul. 18, 2003 | (JP) | 2003-199281 |
| Dec. 18, 2003 | (JP) | 2003-421236 |

(51) Int. Cl.
*H01L 29/82* (2006.01)
*G11C 11/02* (2006.01)

(52) U.S. Cl. ............ 257/422; 257/421; 438/3; 365/157; 365/171; 360/324.1

(58) Field of Classification Search ............ 257/1–5, 257/367, 387, 295, 407, 421–427; 438/800, 438/900, 3; 365/232, 157–158, 171–173; 324/252; 360/324–326, 313
See application file for complete search history.

(56) References Cited

U.S. PATENT DOCUMENTS

| 4,251,795 A | 2/1981 | Shibasaki et al. |
| 4,967,598 A | 11/1990 | Wakatsuki et al. |
| 5,055,786 A | 10/1991 | Wakatsuki et al. |
| 5,235,169 A | 8/1993 | Wakaumi et al. |
| 5,585,719 A | 12/1996 | Endo et al. |

(Continued)

FOREIGN PATENT DOCUMENTS

| JP | 4-332181 A | 11/1992 |
| JP | 09-161235 A | 6/1997 |
| JP | 10-312515 A | 11/1998 |
| JP | 11-120526 A | 4/1999 |
| JP | 2000-137906 A | 5/2000 |

(Continued)

OTHER PUBLICATIONS

Japanese Notification of Reason(s) for Refusal, mailed Jun. 2, 2009, directed to Japanese Patent Application No. 2004-210308; 3 pages.

*Primary Examiner*—Bradley K Smith
*Assistant Examiner*—Jami M Valentine
(74) *Attorney, Agent, or Firm*—Smith Patent Office

(57) ABSTRACT

A magnetic sensor comprises a substrate, magnetoresistive element of a spin-valve type, a bias magnetic layer (or a permanent magnet film), and a protective film, wherein the bias magnetic layer is connected with both ends of the magnetoresistive element and the upper surface thereof is entirely covered with the lower surface of the magnetoresistive element at both ends. Herein, distances between the side surfaces of the both ends of the magnetoresistive element and the side surfaces of the bias magnetic layer viewed from the protective film do not exceed 3 μm. In addition, a part of the bias magnetic layer can be covered with both ends of the magnetoresistive element, and an intermediate layer is arranged in relation to the magnetoresistive element, bias magnetic layer, and protective film so as to entirely cover the upper surface of the bias magnetic layer.

4 Claims, 51 Drawing Sheets

U.S. PATENT DOCUMENTS

| | | |
|---|---|---|
| 5,637,235 A | 6/1997 | Kim et al. |
| 5,668,688 A | 9/1997 | Dykes et al. |
| 6,111,722 A | 8/2000 | Fukuzawa et al. |
| 6,134,091 A | 10/2000 | Toki et al. |
| 6,338,899 B1 | 1/2002 | Fukuzawa et al. |
| 6,577,477 B1 | 6/2003 | Lin |
| 6,583,970 B1 | 6/2003 | Sakata |
| 6,665,156 B2 | 12/2003 | Miyazawa et al. |
| 6,700,371 B2 | 3/2004 | Witcraft et al. |
| 6,904,669 B2 | 6/2005 | Sato et al. |
| 2001/0000603 A1 | 5/2001 | Ju et al. |
| 2001/0021087 A1 | 9/2001 | Guo et al. |
| 2001/0033463 A1 | 10/2001 | Mizuguchi |
| 2001/0033949 A1* | 10/2001 | Abarra et al. ............... 428/694 |
| 2002/0085321 A1* | 7/2002 | Carey et al. ............ 360/324.11 |
| 2002/0142490 A1* | 10/2002 | Sato et al. ...................... 438/3 |
| 2003/0057938 A1 | 3/2003 | Goetz |
| 2005/0054120 A1 | 3/2005 | Wakui et al. |

FOREIGN PATENT DOCUMENTS

| | | |
|---|---|---|
| JP | 2000-206217 A | 7/2000 |
| JP | 2000-298162 A | 10/2000 |
| JP | 2001-67627 A | 3/2001 |
| JP | 2001-168415 A | 6/2001 |
| JP | 2001-273612 A | 10/2001 |
| JP | 2001-284680 A | 10/2001 |
| JP | 2002-299728 A | 10/2002 |
| JP | 2002-324307 A | 11/2002 |
| JP | 2002-374018 A | 12/2002 |
| JP | 2003-92439 A | 3/2003 |
| JP | 2004-006752 A | 1/2004 |

* cited by examiner

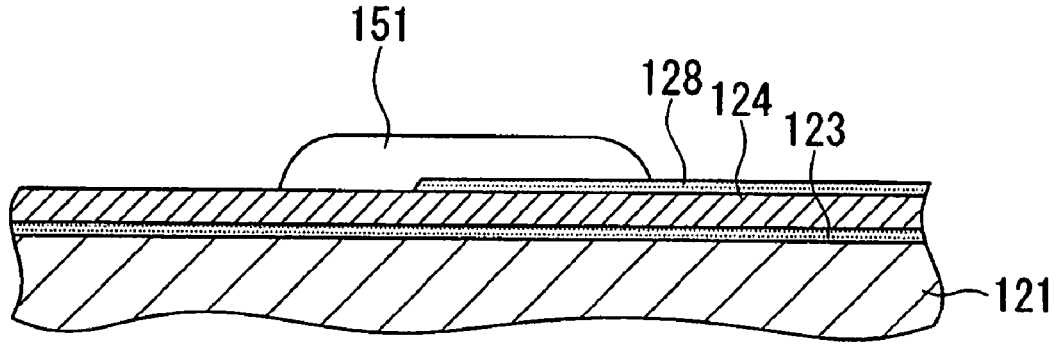
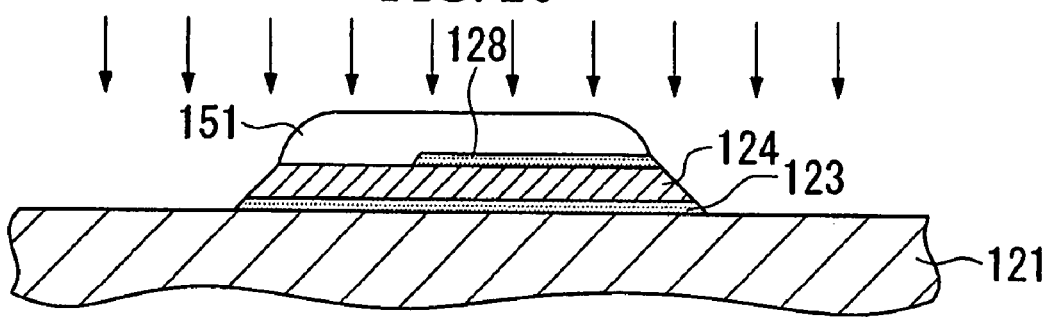
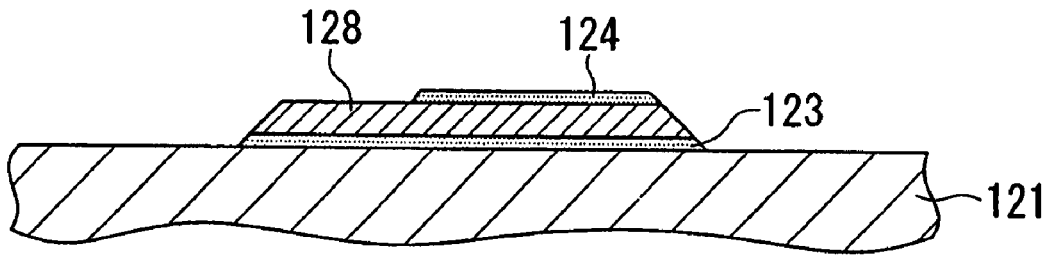

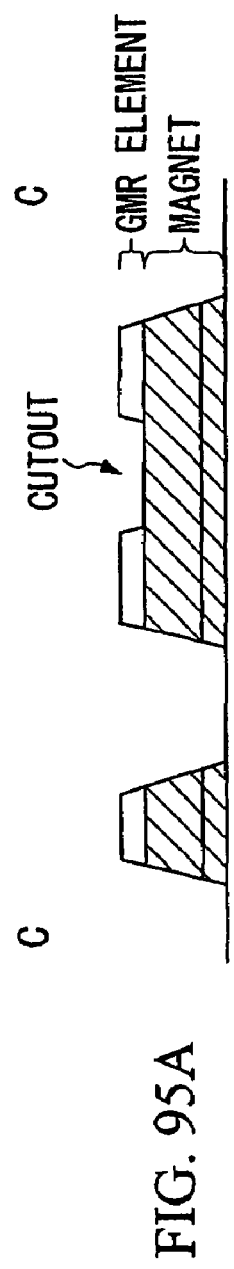
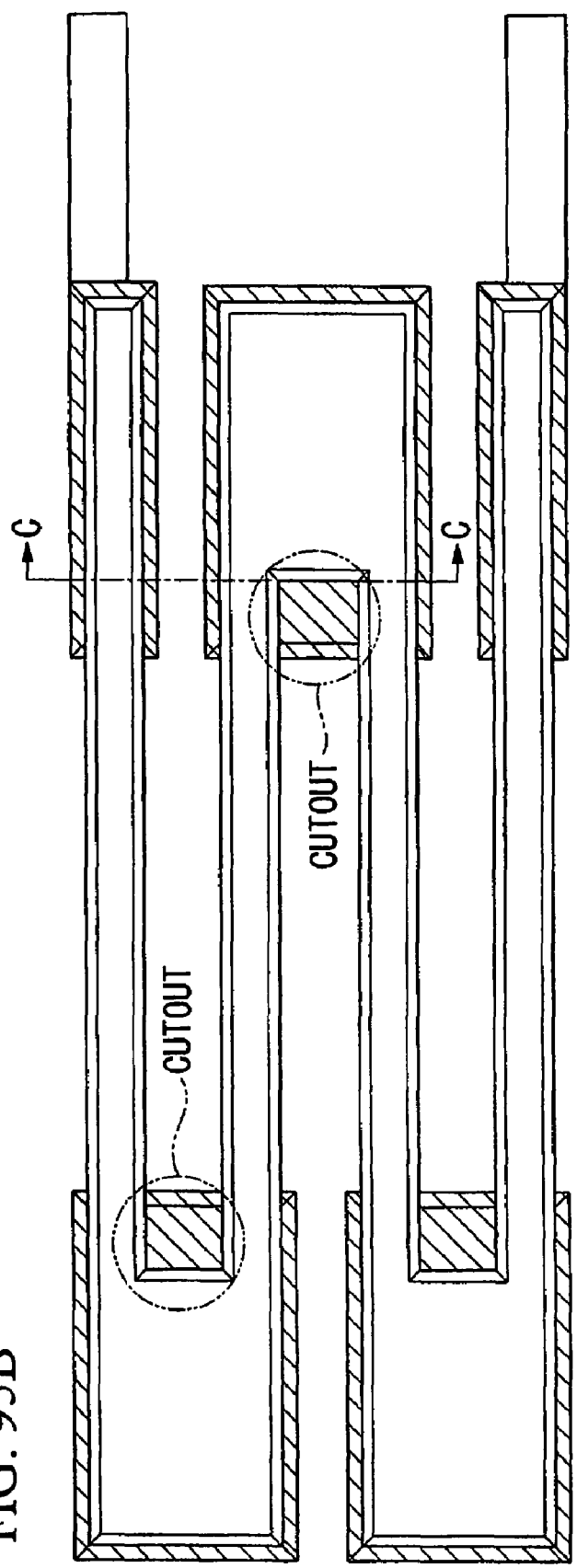
FIG. 95A
FIG. 95B

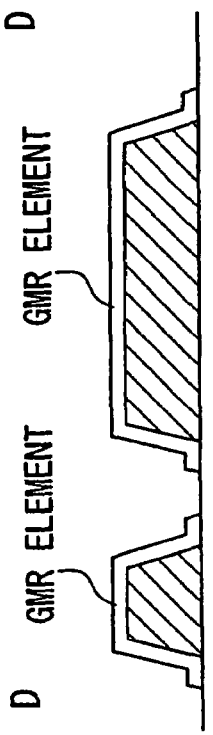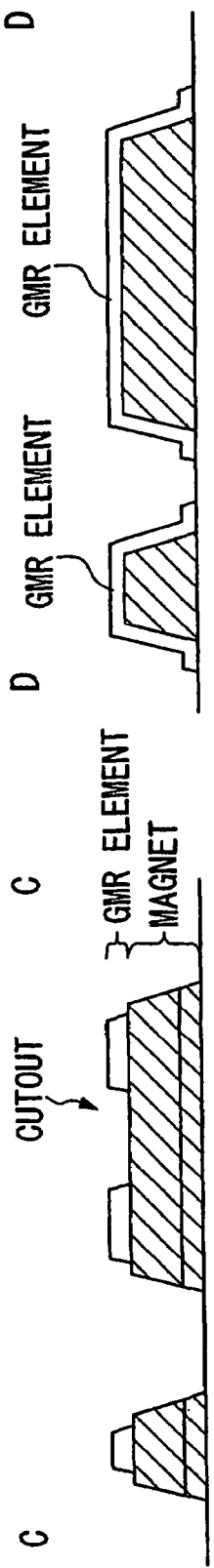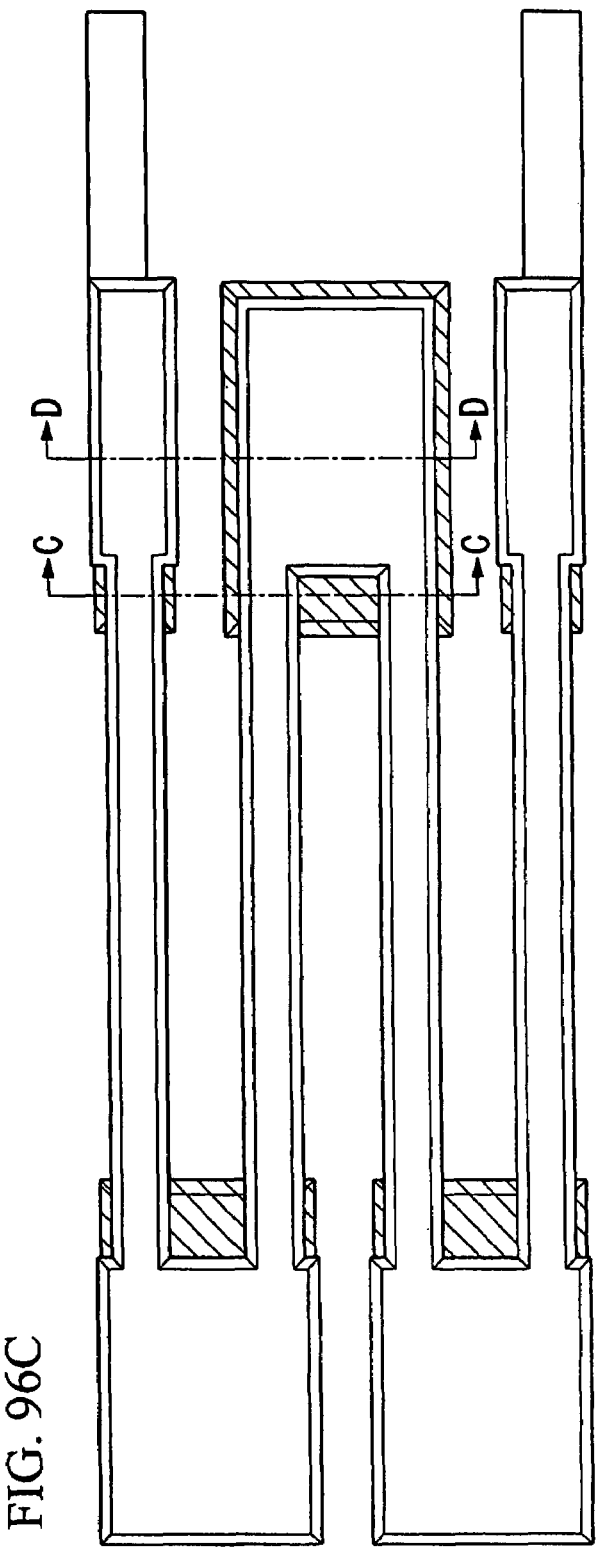
FIG. 96A
FIG. 96B
FIG. 96C

MAGNETIC SENSOR AND MANUFACTURING METHOD THEREFOR

CROSS REFERENCE TO RELATED APPLICATIONS

This application is a divisional application of U.S. patent application Ser. No. 10/891,451 filed on Jul. 15, 2004 now U.S. Pat. No. 7,394,086. The disclosure of U.S. patent application Ser. No. 10/891,451 is hereby incorporated by reference.

BACKGROUND OF THE INVENTION

1. Field of the Invention

This invention relates to magnetic sensors of the spin-valve type using giant magnetoresistive elements (or GMR elements) and manufacturing methods therefor.

This application claims priority on Japanese Patent Application Nos. 2003-421236, 2003-199280, and 2003-199281, the contents of which are incorporated herein by reference.

2. Description of the Related Art

Conventionally, various types of magnetic sensors, which use spin-valve type magnetoresistive elements such as giant magnetoresistive elements (or GMR elements) whose resistances change when exposed to magnetic fields, have been developed and put into practical uses.

For example, a GMR element comprises a pinned layer whose magnetization direction is pinned in a prescribed direction and a free layer whose magnetization direction changes in response to an external magnetic field, wherein it presents a resistance responding to a relative relationship between the pinned layer and free layer in the magnetization direction, whereby it is possible to detect the external magnetic field by measuring the resistance thereof.

The GMR element included in the magnetic sensor is formed by fine line patterns, which are folded in a zigzag manner multiple times, whereby it is possible to increase the overall path length within a very small area and to thereby increase the impedance, by which it is possible to reduce an electric current being consumed.

In the aforementioned GMR element having zigzag patterns, folded portions (or bent portions) of fine lines are formed by magnetoresistive films, which may make the sensitivity direction of the GMR element non-uniform; in other words, this damages the linear relationship (or linearity) between the external magnetic field and the resistance of the magnetoresistive element; hence, it becomes difficult to accurately measure the intensity of the magnetic field.

In consideration of the aforementioned drawback, there has been developed a magnetic sensor using a GMR element having zigzag patterns in which the bent portions are formed by nonmagnetic films. Examples of conventionally-known magnetic sensors are disclosed in Japanese Patent Application Publication No. 2000-206217 and Japanese Patent Application Publication No. 2002-299728.

Compared with the magnetic sensor whose bent portions of GMR elements are constituted by magnetoresistive films, the aforementioned magnetic sensor can accurately measure the intensity of the magnetic field, whereas it may be insufficient for the aforementioned magnetic sensor to maintain the uniaxial anisotropy in the free layer of the magnetoresistive film due to the nonmagnetic films corresponding to the bent portions. For this reason, when a disturbance magnetic field having a relatively high intensity is applied to the magnetic field from the exterior, the magnetization direction of the free layer may not match (or restore) the initial magnetization direction thereof; thus, it may not be always possible for the magnetic sensor to measure the intensity of the external magnetic field with a good reproducibility.

In addition, there has been developed another magnetic sensor in which in order to maintain the uniaxial anisotropy in the free layer of the GMR element, a bias magnetic layer (corresponding to a permanent magnet film composed of a ferromagnetic substance) is arranged in contact with both ends of the magnetoresistive film in proximity to the bent portions of the GMR element.

In the aforementioned magnetic sensor, the GMR element having zigzag patterns is constituted by the magnetoresistive film and nonmagnetic film, wherein the permanent magnet film is arranged in proximity to the bent portions in the resistance circuitry thereof. That is, this magnetic sensor is very complicated in structure and is very difficult to manufacture.

FIG. 49 is a cross-sectional view diagrammatically showing the constitution of a conventionally-known magnetic sensor, which is disclosed in Japanese Patent Application Publication No. H12-137906, for example.

The magnetic sensor of FIG. 49 comprises a substrate 201 composed of a quartz or silicon wafer having a prescribed thickness, a magnetoresistive element 202 composed of a GMR element arranged on the substrate 201, an embedded film 203 composed of a nonmagnetic material arranged on the substrate 201, a bias magnetic layer 204 composed of a permanent magnet film, which is connected to both ends of the magnetoresistive element 202 and is arranged on the substrate 201 via the embedded film 203, a first protective film 205 composed of a silicon oxide film and a second protective film 206 composed of a silicon nitride film by which the overall surface of the magnetoresistive element 202 and the bias magnetic layer 204 is covered.

The first protective film 205 and the second protective film 206 can be collectively referred to as a protective film 207.

In the aforementioned magnetic sensor, the overall upper surface of the bias magnetic layer 204 is not entirely covered with the lower surface of the magnetoresistive element 202 at its both ends. For this reason, the magnetoresistive element 202 is connected in such a way that it overhangs a part of the upper surface of the bias magnetic layer 204. This magnetic sensor may cause a separation of the protective film 207 in the interface between the bias magnetic layer 204 and the protective film 207 during a heat-cool cycling test (or a thermal cycling test), for example. That is, it is demanded to provide a magnetic sensor having a sufficiently high degree of environmental durability.

SUMMARY OF THE INVENTION

It is an object of the invention to provide a magnetic sensor that can accurately measure the intensity of the external magnetic field without damaging the linear relationship (or linearity) between the resistance of a magnetoresistive film and the intensity of an external magnetic field, that can measure the intensity of the external magnetic field with good reproducibility by maintaining the uniaxial anisotropy in a free layer of the magnetoresistive film, and that can be manufactured by a relatively simple manufacturing process.

It is another object of the invention to provide a magnetic sensor that is improved in environmental durability.

In a first aspect of the present invention, a magnetic sensor comprises a magnetoresistive element of a spin-valve type, both ends of which are connected with a bias magnetic layer composed of a permanent magnet film, wherein a protective film is formed to cover the magnetoresistive element and the bias magnetic layer. This magnetic sensor is characterized in that the upper surface of the bias magnetic layer is entirely covered with the lower surface of the magnetoresistive element at both ends.

In the above, it is preferable that the distances between the sides surfaces of the both ends of the magnetoresistive element and the side surfaces of the bias magnetic layer not exceed 3 µm, wherein the distance is measured upon viewing the magnetoresistive element from the protective film in the peripheral portion of the magnetic sensor.

In a second aspect of the invention, a magnetic sensor comprises a magnetoresistive element of a spin-valve type, which is arranged on a substrate, wherein a bias magnetic layer composed of a permanent magnet film is connected with both ends of the magnetoresistive element, and a protective film is arranged to cover the upper surfaces of the magnetoresistive element and bias magnetic layer. Herein, it is characterized by providing an intermediate layer between the protective film and the bias magnetic layer.

The aforementioned magnetic sensor can be partially modified such that the both ends of the magnetoresistive element are arranged to partially cover the bias magnetic layer, wherein the intermediate layer is arranged in relation to the magnetoresistive element, protective film, and bias magnetic layer in such a way that it entirely covers the upper surface of the bias magnetic layer.

In the above, the intermediate layer can be arranged to cover a part of the upper surface of the bias magnetic layer, which is not covered with the magnetoresistive element. In addition, the intermediate layer can be arranged to cover the upper surface and side surfaces of the magnetoresistive element.

In a third aspect of the invention, a magnetic sensor comprises a plurality of. magnetoresistive films each having a band-like shape, which are arranged roughly in parallel with each other, a plurality of permanent magnet films, which are arranged in proximity to both ends of the magnetoresistive films, wherein one end of magnetoresistive film is connected with the adjacent magnetoresistive film via the permanent magnet film, and the other end of the magnetoresistive film is connected with the adjacent magnetoresistive film via the other permanent magnet film, whereby the magnetoresistive films join the permanent magnet films in zigzag patterns.

In the above, the magnetoresistive film is constituted by sequentially laminating a pinning layer, a pinned layer, a spacer layer, and a free layer on a substrate, wherein the direction of the uniaxial anisotropy of the free layer matches the longitudinal direction of the magnetoresistive film and the magnetization direction of the permanent magnet film.

In addition, the permanent magnet films are arranged to join the magnetoresistive films in such a way that the overall aspect ratio of the arrangement of the permanent magnet films is set to '1' or more, and the longitudinal direction of the permanent magnet film matches the longitudinal direction of the magnetoresistive film.

The permanent magnet film is composed of a conductive material so as to establish an electrical connection between corresponding ends of adjacent magnetoresistive films.

In a fourth aspect of the invention, a magnetic sensor comprises at least one magnetoresistive element (i.e., a GMR element) and at least one permanent magnet, both of which are arranged on a substrate, wherein the magnetoresistive element comprises a free layer, a space layer formed on the free layer, and a pinned layer formed on the spacer layer, and wherein the width of the magnetoresistive element ranges from 6 µm to 8 µm, and the thickness of the spacer layer ranges from 28 A° to 34 A°. It is preferable that the thickness of the free layer is 125 A°, and the thickness of the pinned layer is 30 A°.

In the above, it is possible to suppress the occurrence of a magnetic hysteresis while securing a high sensitivity in the GMR element, wherein the sensitivity direction (or sensitivity angle) can be controlled in consideration of the dimensions of the GMR element, that is, the width of the GMR element, the thickness of the free layer, the thickness of the spacer layer, and the thickness of the pinned layer. Through experiments and studies, it can be determined that the sensitivity of the magnetic sensor can be increased while suppressing the occurrence of the magnetic hysteresis by adequately setting dimensions such that the width of the GMR element ranges from 6 µm to 8 µm, and the thickness of the spacer layer ranges from 28 A° to 34 A°. Herein, it is possible to reduce the deviation of the sensitivity direction approximately to 0°.

The aforementioned magnetic sensor is characterized by increasing the width of the GMR element and the thickness of the spacer layer in consideration of the sensitivity dependency of Cu; hence, it is possible to substantially eliminate the magnetic hysteresis, which is caused to occur by reducing the anisotropic magnetic field (Hk); and it is therefore possible to produce the magnetic sensor having a high sensitivity, which can be suppressed in the deviation of the sensitivity direction. That is, this magnetic sensor can work effectively as an electronic compass whose accuracy in direction measurement meet sixteen directions to be measured in units of degrees, for example.

In a fifth aspect of the invention, a manufacturing method is provided for a magnetic sensor in which magnetoresistive elements (or GMR elements) each having a band-like shape are arranged on the substrate, and bias magnetic layers are arranged and connected with both ends of the GMR elements, wherein it basically comprises three steps, i.e., a first step for applying a resist onto the GMR element so as to form a prescribed pattern, a second step for forcing the resist to reflow so as to form a resist film having a slanted shape, and a third step for applying an ion beam onto the substrate in a slanted direction so as to performing milling on the GMR element, whereby the side surfaces of the band-like shape of the GMR element is tapered in the longitudinal direction thereof.

In the above, a fourth step is performed after the third step in such a way that the ion beam is applied to the substrate in the vertical direction so as to perform further milling on the GMR element. Due to the formation of the tapered side surfaces in the band-like shape of the GMR element, the magnetization direction of the free layer of the GMR element, which is not exposed to the external magnetic field, is forced to align in the longitudinal direction of the band-like shape of the GMR element.

That is, due to the formation of the tapered side surfaces in the band-like shape of the GMR element along its longitudinal direction, it is possible to prevent magnetic walls (or edge curling walls) from being formed on the both ends of the GMR element, it is possible to sufficiently control the magnetic anisotropy of the GMR element rendering the external magnetic field; hence, it is possible to secure uniformity in magnetizing the free layer, thus securing the output stability of the magnetic sensor rendering the external magnetic field. Thus, even after an intense magnetic field is applied to the magnetic sensor, it is possible for the magnetic sensor to precisely restore the original magnetization direction established in the initial state of the free layer.

According to the aforementioned manufacturing method of the magnetic sensor, it is possible to improve the output stability of the magnetic sensor rendering the external magnetic field without substantially changing the structure of the GMR element and the formation pattern of the magnetic sensor.

The aforementioned manufacturing method is characterized in that the ion beam is applied to the substrate in the slanted direction so as to perform milling on the GMR element, whereby it is possible to prevent milled materials from being unexpectedly re-adhered to the GMR element; hence, it is possible to actualize high accuracy processing, thus noticeably improving the throughput in manufacturing.

BRIEF DESCRIPTION OF THE DRAWINGS

These and other objects, aspects, and embodiments of the present invention will be described in more detail with reference to the following drawings, in which:

FIG. 25 is a cross-sectional view showing the structure for use in manufacture of the magnetic sensor of the third embodiment in step E-5;

FIG. 26 is a cross-sectional view showing the structure for use in manufacture of the magnetic sensor of the third embodiment in step E-6;

FIG. 27 is a cross-sectional view showing the structure for use in manufacture of the magnetic sensor of the third embodiment in step E-7;

FIG. 95A is a cross-sectional view showing a GMR element along line C-C in accordance with a third modification of the seventh embodiment;

FIG. 95B is a plan view showing an arrangement pattern of GMR elements in accordance with the third modification of the seventh embodiment;

FIG. 96A is a cross-sectional view showing a GMR element along line C-C in accordance with a fourth modification of the seventh embodiment;

FIG. 96B is a cross-sectional view showing a GMR element along line D-D in accordance with a fourth modification of the seventh embodiment; and FIG. 96C is a plan view showing an arrangement pattern of GMR elements in accordance with the fourth modification of the seventh embodiment.

DESCRIPTION OF THE PREFERRED EMBODIMENTS

This invention will be described in further detail by way of examples with reference to the accompanying drawings.

1. First Embodiment

Figure 1:
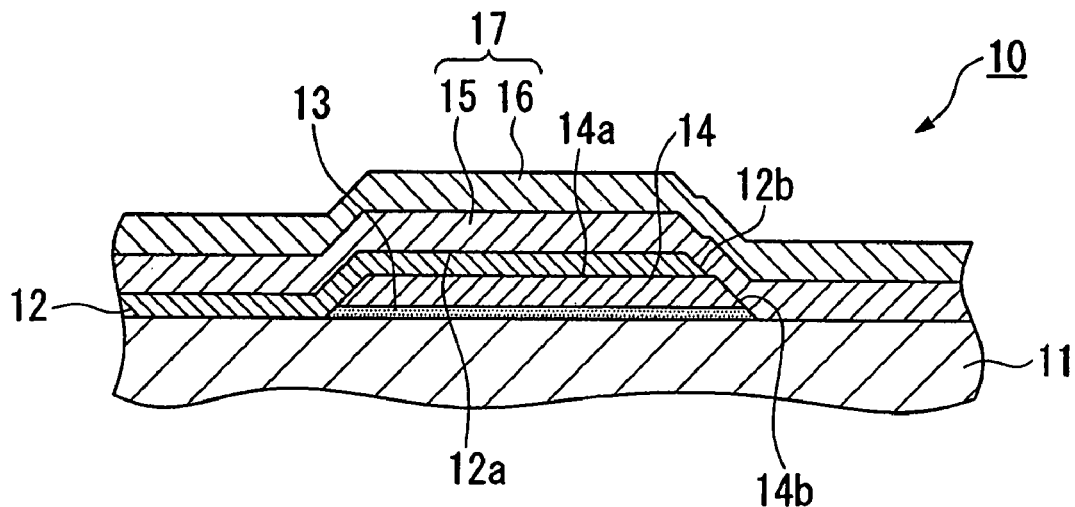
FIG. 1 is a cross-sectional view diagrammatically showing the constitution of a magnetic sensor in accordance with a first embodiment of the invention.
Figure 2A:
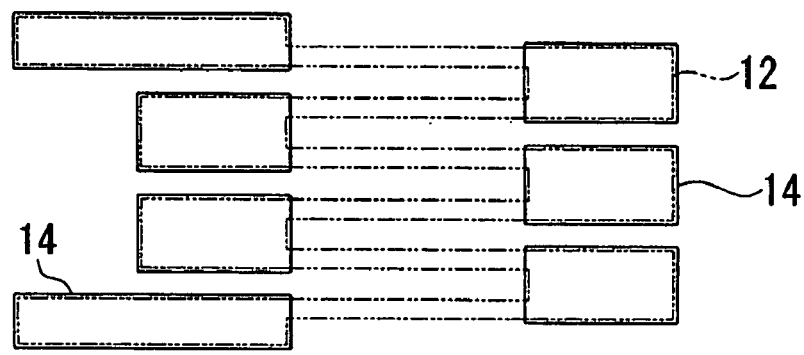
FIG. 2A is a plan view diagrammatically showing an arrangement of a magnetoresistive element and a bias magnetic layer, included in the magnetic sensor shown in FIG. 1, being viewed from a protective film.
Figure 2B:
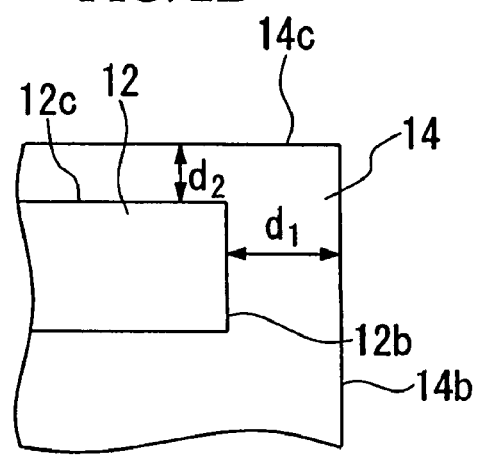
FIG. 2B is a fragmentary plan view diagrammatically showing the peripheral portion of the bias magnetic layer.

FIG. 1 is a cross-sectional view diagrammatically showing the constitution of a magnetic sensor in accordance with a first embodiment of the invention. FIGS. 2A and 2B provide illustrations showing a magnetoresistive element viewed from a protective film in the magnetic sensor shown in FIG. 1, wherein FIG. 2A is an overall illustration, and FIG. 2B is a fragmental illustration showing the peripheral portion of a bias magnet.

In FIG. 1, a magnetic sensor 10 comprises a substrate 11 composed of a quartz or silicon wafer having a prescribed thickness, a magnetoresistive element 12 composed of a GMR element arranged on the substrate 11, an embedded film 13 composed of a nonmagnetic material arranged on the substrate 11, a bias magnetic layer 14 composed of a permanent magnet film, which is connected to both ends of the magnetoresistive element 12 and is arranged on the substrate 11 via the embedded film 13, a first protective film 15 for covering the overall upper surface of the bias magnetic layer 14, a second protective film arranged on the upper surface of the first protective film 15.

Both of the first protective film 15 and the second protective film 16 can be collectively referred to as protective film 17.

The aforementioned magnetic sensor 10 is characterized in that a lower surface 12a of the magnetoresistive element 12 at its both ends roughly entirely cover an upper surface 14a of the bias magnetic layer 14.

The aforementioned technical feature of the magnetic sensor 10 in which the lower surface 12a of the magnetoresistive element 12 entirely covers the upper surface 14a of the bias magnetic layer 14 will be described with reference to FIGS. 2A and 2B. That is, in a peripheral portion 14d of the bias magnetic layer 14 shown in FIG. 2B, a side surface 12b of the magnetoresistive element 12 is not arranged in the same plane of a side surface 14b of the bias magnetic layer 14; a side surface 12c of the magnetoresistive element 12 is not arranged in the same plane of a side surface 14c of the bias magnetic layer 14; and the lower surface 12a of the magnetoresistive element 12 at its both ends covers the upper surface 14a of the bias magnetic layer 14.

When viewing the magnetoresistive element 12 from the protective film 17 with respect to the peripheral portion 14d of the bias magnetic layer 14, the lower surface 12a of the magnetoresistive element 12 at its both ends cover the upper surface 14a of the bias magnetic layer 14 in such a way that the distances between the side surfaces of the magnetoresistive element 12 at its both ends and the side surfaces of the bias magnetic layer 14 does not exceed 3 μm. That is, as shown in FIG. 2B, in the peripheral portion 14d of the bias magnetic layer 14, both of a distance $d_1$ between the side surface 12b of the magnetoresistive element 12 and the side surface 14b of the bias magnetic layer 14 and a distance $d_2$ between the side surface 12c of the magnetoresistive element 12 and the side surface 14c of the bias magnetic layer do not exceed 3 μm.

When the distances between the side surfaces of the magnetoresistive element 12 at its both ends and the side surfaces of the bias magnetic layer 14 exceed 3 µm, the adhesion between the bias magnetic layer 14 and the projective film 17 becomes insufficient and small; therefore, when shearing stress is repeatedly applied from the exterior in a heat-cool cycling test (or a thermal cycling test), for example, a separation of the protective film 17 may occur in the interface between the bias magnetic layer 14 and the protective film 17.

The magnetoresistive element 12 is constituted by sequentially laminating a free layer, a spacer layer having conductivity composed of copper (Cu), a pinned layer composed of a cobalt-iron (CoFe) alloy, a pinning layer composed of a platinum-manganese (PtMn) alloy, and a capping layer composed of a thin metal film of titanium (Ti), tantalum (Ta), and the like.

The free layer changes magnetization direction thereof in response to a direction of an external magnetic field. For example, it comprises a cobalt-zirconium-niobium (CoZrNb) amorphous magnetic layer, a nickel-iron (NiFe) magnetic layer laminated on the CoZrNb amorphous magnetic layer, and a cobalt-iron (CoFe) layer laminated on the NiFe magnetic layer.

In order to maintain a uniaxial anisotoropy in the free layer, the bias magnetic layer 14 applies a bias magnetic field in a prescribed direction.

Both the CoZrNb amorphous magnetic layer and the NiFe magnetic layer are soft ferromagnetic substances; and the CoFe layer is provided to avoid diffusion of nickel in the NiFe magnetic layer and diffusion of copper in the spacer layer.

The spacer layer is a thin metal film composed of copper or a copper alloy.

The pinned layer is made of a cobalt-iron (CoFe) magnetic layer. This CoFe magnetic layer is subjected to backing to an antiferromagnetic film in a switched-connection manner, so that it is pinned (or fixed) in a magnetization direction thereof.

The pinning layer is made of an antiferromagnetic film that is composed of a PtMn alloy including platinum of 45-55 mol % laminated on the CoFe magnetic layer.

The pinned layer and pinning layer will be collectively referred to as a pin layer.

The embedded layer 13 is made of a thin metal film of chromium (Cr) whose thickness is 40 nm or so.

The bias magnetic layer 14 is made of a thin metal film composed of a cobalt-platinum-chromium (CoCrPt) alloy whose thickness is 90 nm or so.

The first protective film 15 is a thin film composed of silicon oxide (referred to as a SiOx film).

The second protective film 16 is a thin film composed of silicon nitride (referred to as a SiN film).

Next, the manufacturing method of the magnetic sensor of the present embodiment will be described with reference to FIGS. 3 to 9 and FIG. 46.

Figure 46:
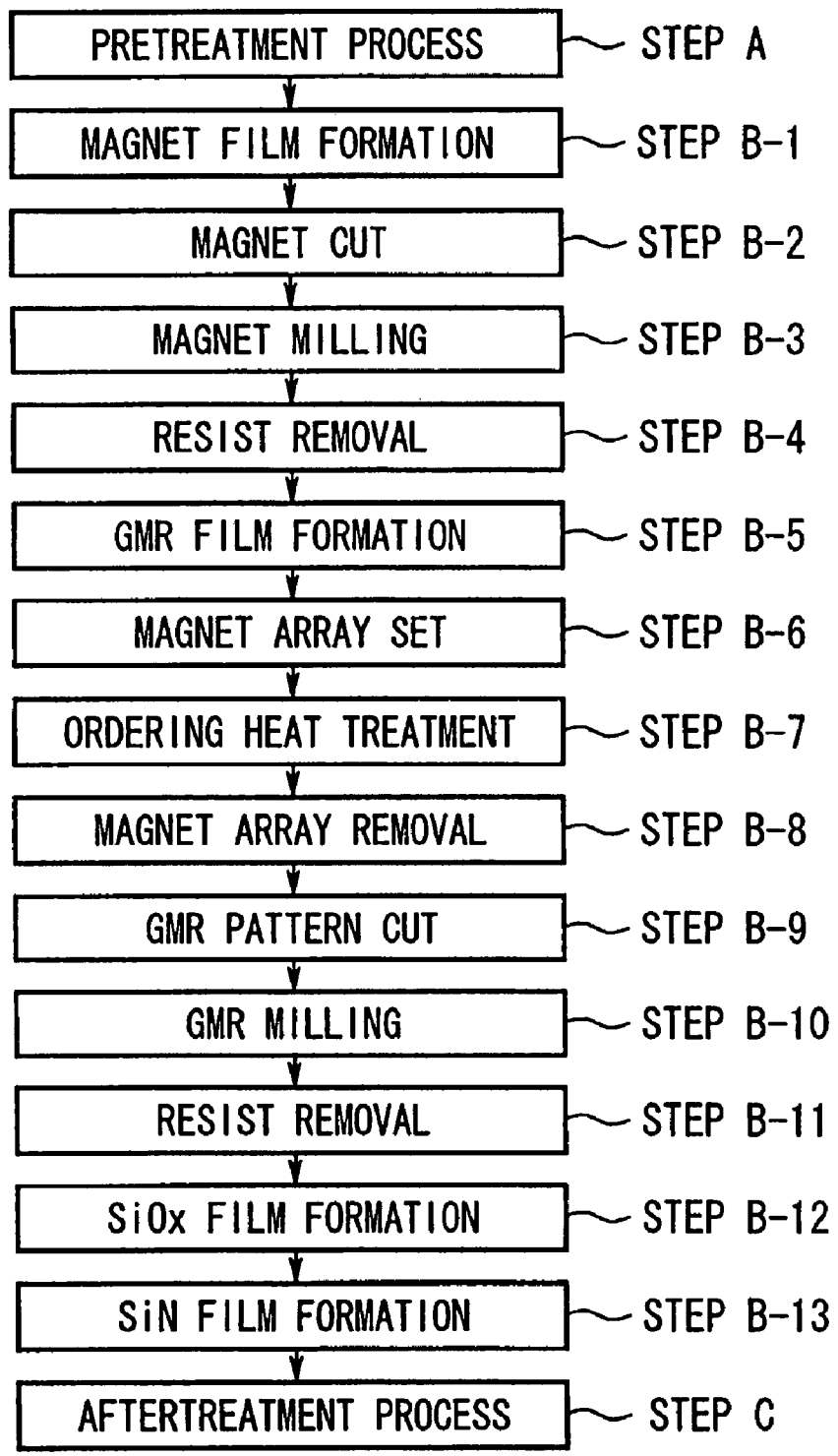
FIG. 46 is a flowchart showing steps for manufacturing the magnetic sensors shown in FIGS. 1 and 10 in accordance with the first and second embodiments of the invention.

FIG. 46 is a flowchart showing steps A, B-1 to B-13, and C in the manufacturing method of the magnetic sensor of the present embodiment, and FIGS. 3 to 9 are cross-sectional views diagrammatically showing layered structures for explaining the manufacturing method of the magnetic sensor of the present embodiment.

In the manufacturing method, there is firstly provided a substrate 11 composed of a quartz or silicon wafer. It is possible to form an LSI portion for controlling the magnetic sensor on the substrate 11 in advance. That is, in step A (showing a pretreatment process), transistor components, wiring, insulation films, and contacts are formed in accordance with the known method so as to form a protective film, in which openings are formed for use in connections.

Figure 3:
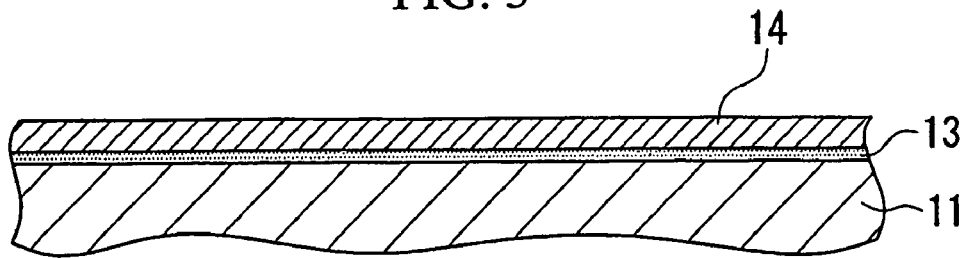
FIG. 3 is a cross-sectional view showing the structure for use in manufacture of the magnetic sensor of the first embodiment in step B-1.

Next, as shown in FIG. 3, an embedded film 13 of chromium whose thickness is 40 nm or so is formed on the upper surface of the substrate 11 composed of the quartz or silicon wafer in accordance with the sputtering method. Then, the sputtering method is performed on the upper surface of the embedded film 13 so as to form a bias magnetic layer 14, which is made of a cobalt-platinum-chromium alloy and whose thickness is 90 nm (see step B-1).

Figure 4:
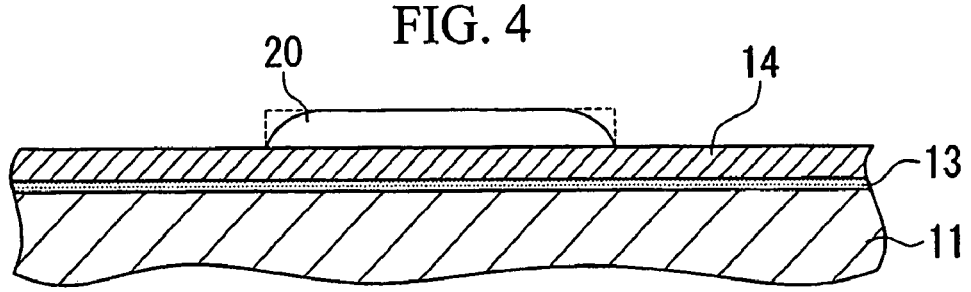
FIG. 4 is a cross-sectional view showing the structure for use in manufacture of the magnetic sensor of the first embodiment in step B-2.

Next, as shown in FIG. 4, the spin-coat method or dip-coat method is performed on the upper surface of the bias magnetic layer 14 so as to form a photoresist having an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, so that a resist film 20 whose both ends are curved is formed (see step B-2).

Figure 5:
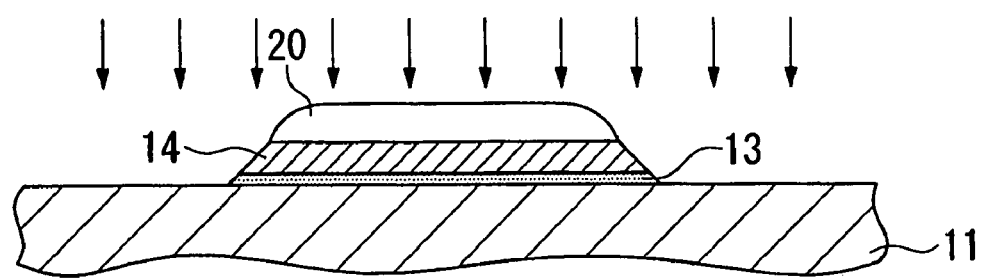
FIG. 5 is a cross-sectional view showing the structure for use in manufacture of the magnetic sensor of the first embodiment in step B-3.

Next, as shown in FIG. 5, ion milling is performed so as to partially remove the embedded film 13 and the bias magnetic layer 14, which are not covered with the resist film 20, thus forming the embedded film 13 and the bias magnetic film 14 in prescribed shapes (see step B-3). In this step B-3, ion milling is performed such that the side surfaces of the embedded film 13 and the bias magnetic layer 14 are slanted to the substrate 11 in response to the curved shapes of the both ends of the resist film 20.

Figure 6:
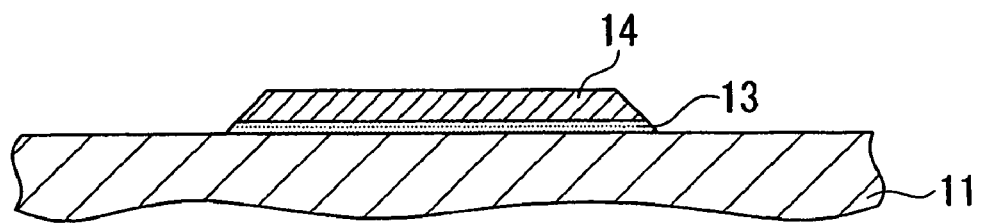
FIG. 6 is a cross-sectional view showing the structure for use in manufacture of the magnetic sensor of the first embodiment in step B-4.

Next, as shown in FIG. 6, the resist film 20 is removed by use of washing liquid such as acetone, N-methyl-2-pyrolidone, so that the surface of the bias magnetic layer 14 is subjected to washing so as to completely remove the resist film 20 (see step B-4).

Figure 7:
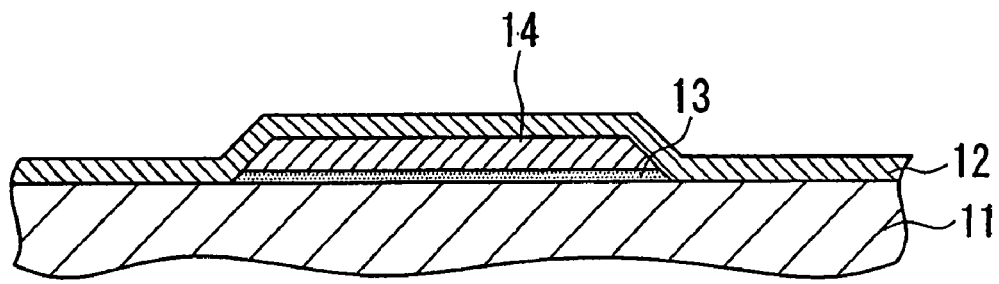
FIG. 7 is a cross-sectional view showing the structure for use in manufacture of the magnetic sensor of the first embodiment in step B-5.

Next, as shown in FIG. 7, ion beam sputtering method or magnetron sputtering method is performed on the upper surface of the substrate 11, the side surfaces of the embedded film 13, the upper surface and side surfaces of the bias magnetic layer 14, thus forming a magnetoresistive element 12 (see step B-5).

Next, a magnet array (not shown) that is arranged in an external space is arranged at a prescribed position relative to the bias magnetic layer 14, whereby a magnetic field is applied to the pin layer of the magnetoresistive element 12 in a prescribed direction (see step B-6).

Next, the magnet array and the bias magnetic layer 14 are fixed in the prescribed arrangement, while they are placed in a vacuum state and are then heated for four hours at 280° C. Thus, an ordering heat treatment is performed on the pinning layer within the pin layer of the magnetoresistive element 12 (see step B-7).

Next, the magnet array is removed from the prescribed position (see step B-8).

Figure 8:
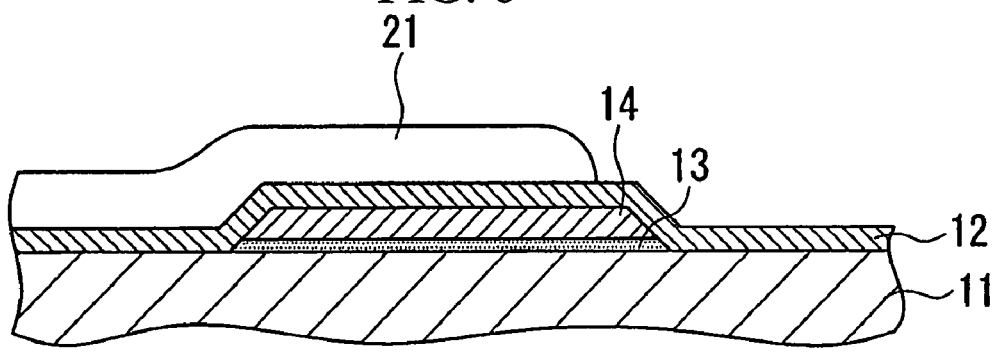
FIG. 8 is a cross-sectional view showing the structure for use in manufacture of the magnetic sensor of the first embodiment in step B-9.
Figure 9:
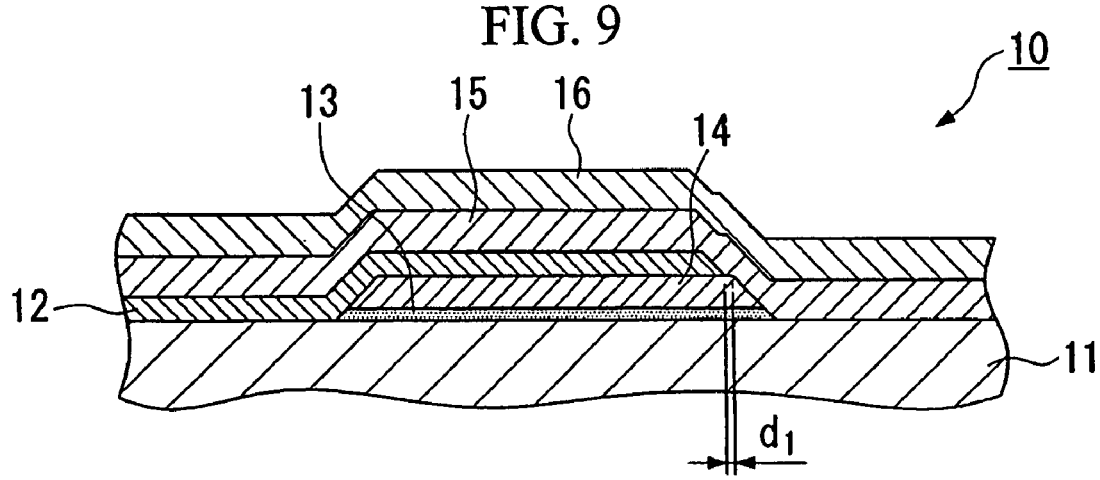
FIG. 9 is a cross-sectional view showing the structure for use in manufacture of the magnetic sensor of the first embodiment completed in production.

Next, as shown in FIG. 8, the spin-coat method or dip-coat method is performed on the upper surface of the magnetoresistive element 12 so as to form a photoresist of an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, thus forming a resist film 21 whose both ends are curved (see step B-9).

Next, ion milling is performed to partially remove the magnetoresistive element 12, which is not covered with the resist film 21, thus forming the magnetoresistive element 12 in a prescribed shape (see step B-10). In this step B-10, ion milling is performed so that the side surfaces of the magnetoresistive element 12 are slanted to the substrate 11 in response to the curved shapes of the both ends of the resist film 21.

Next, the resist film 21 is removed by use of a washing liquid such as acetone, N-methyl-2-pirolidone, so that the surface of the magnetoresistive element 12 is subjected to washing so as to completely remove the resist film 21 (see step B-11).

Next, the plasma CVD (i.e., Chemical Vapor Deposition) method is performed on the surface of the magnetoresistive element 12 so as to form a first protective film 15 made of a silicon oxide film whose thickness is 150 nm or so (see step B-12).

Next, the plasma CVD method is performed on the surface of the first protective film so as to form a second protective film 16 composed of a silicon nitride film whose thickness is 300 nm or so (see step B-13).

Incidentally, it is possible to further form a third protective film composed of a polyimide resin on the first protective film 15 and the second protective film 16.

Next, in step C, openings are formed at prescribed positions of the first protective film 15 and the second protective film 16; pads are formed therewith; then, the wafer is subjected to dicing and is divided into individual chips, each of which is then enclosed in a resin.

Next, samples of magnetic sensors will be described in detail, whereas the present embodiment is not necessarily limited to the following samples.

In accordance with the manufacturing method of the present embodiment, various samples of magnetic sensors each including the magnetoresistive element having 5 nm thickness are actually produced.

Specifically, three types of magnetic sensors are produced by changing distance d at 1 μm, 2 μm, and 3 μm respectively, wherein the distance d is measured between the side surfaces of the both ends of the magnetoresistive element and the side surfaces of the bias magnetic layer upon viewing the magnetoresistive element from the protective film (or the upper surface thereof) in the peripheral portion of the bias magnetic layer. In addition, plastic mold packages are produced using the aforementioned samples of the magnetic sensors.

(1) Adhesion Test

A mending tape (manufactured by Scotch 3M Corporation) is adhered onto the upper surface of the magnetic sensor (i.e., the surface of the magnetic sensor in which the protective film is arranged); then, the mending tape is peeled off, and an examination is conducted as to whether or not separation occurs in the interface between the bias magnetic layer and the protective film in the magnetic sensor. Similar testing is performed on one-hundred samples of magnetic sensors so as to count the number of samples in which separation occurs in the aforementioned interface. Results are shown in Table 1.

(2) Heat-Cool Cycling Test

The plastic mold packages of magnetic sensors are subjected to the severe condition of the environment by actualizing heat-cool cycling in which they are maintained at −65° C. for thirty minutes; they are increased in temperature to room temperature within five minutes; they are maintained at room temperature for thirty minutes; they are increased in temperature up to 150° C. within five minutes; they are maintained at 150° C. for thirty minutes; they are decreased in temperature to room temperature within five minutes; they are maintained at the room temperature for thirty minutes; then, they are decreased in temperature to −65° C. within five minutes. Herein, each sample of the magnetic sensor is subjected to the aforementioned heat-cool cycling five-hundreds times.

Thereafter, the plastic mold packages are opened by etching using fuming nitric acid, so that an examination is conducted as to whether or not separation occurs in the interface between the bias magnetic layer and the protective film in the magnetic sensor. Similar testing is performed on twenty samples of plastic mold packages of magnetic sensors so as to count the number of samples in which separation occurs in the aforementioned interface. Results are shown in Table 1.

In the above, comparative samples of magnetic sensors are produced in accordance with the manufacturing method of the present embodiment, wherein each of them includes the magnetoresistive element whose thickness is 50 nm.

That is, each of the comparative samples of magnetic sensors is produced by setting distance d to 15 μm, wherein the distance d is measured between the side surfaces of the both ends of the magnetoresistive element and the side surfaces of the bias magnetic layer upon viewing the magnetoresistive element from the protective film in the peripheral portion of the bias magnetic layer.

Plastic mold packages are produced using the comparative examples of the magnetic sensors described above.

Then, as similar to the foregoing samples of the magnetic sensors, the adhesion test and the heat-cool cycling test are performed on the plastic mold packages enclosing the comparative samples of the magnetic sensors. Results are shown in Table 1.

TABLE 1

| | Distance d (μm) | Adhesion test (number of samples per 100 samples) | Heat-cool cycling test (number of samples per 20 samples) |
| --- | --- | --- | --- |
| Sample A | 1 | 0 | 0 |
| Sample B | 2 | 2 | 0 |
| Sample C | 3 | 2 | 0 |
| Comparative sample | 15 | 32 | 7 |

The results of Table 1 clearly show that each of the foregoing samples of the magnetic sensors produced in accordance with the present embodiment is greatly improved in adhesion between the bias magnetic layer and protective film and is superior in environmental durability.

In contrast, the comparative sample of the magnetic sensor has insufficient adhesion between the bias magnetic layer and protective film and is inferior in environmental durability.

As described above, the present embodiment is characterized in that the upper surface of the bias magnetic layer is entirely covered with the lower surface of the magnetoresistive element at its both ends, whereby it is possible to improve the adhesion between the bias magnetic layer and protective film, it is possible to improve the environmental durability (particularly, the temperature resistance), and it is therefore possible to improve the reliability in the performance of the magnetic field.

2. Second Embodiment

Figure 10:
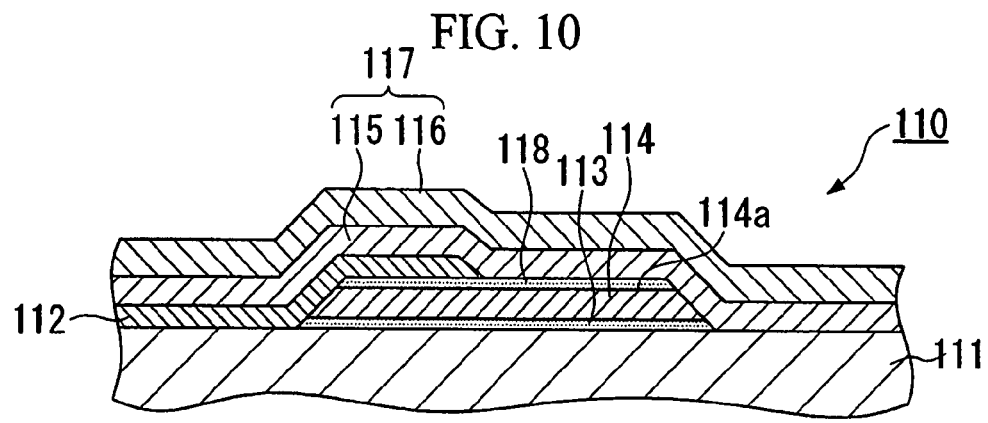
FIG. 10 is a cross-sectional view diagrammatically showing the constitution of a magnetic sensor in accordance with a second embodiment of the invention.

FIG. 10 is a cross-sectional view diagrammatically showing the constitution of a magnetic sensor in accordance with a second embodiment of the invention.

A magnetic sensor 110 shown in FIG. 10 comprises a substrate 111 composed of a quartz or silicon wafer having a prescribed thickness, a magnetoresistive element 112 composed of a GMR element arranged on the substrate 111, an embedded film 113 composed of a nonmagnetic material arranged on the substrate 111, a bias magnetic layer 114 composed of a permanent magnet film, which is arranged on the substrate 111 via the embedded film 113 and which is connected with both ends of the magnetoresistive element 112 respectively, a first protective film 115 for entirely covering the magnetoresistive element 112 and the bias magnetic layer 114, a second protective film 116 for covering the upper surface of the first protective film 115, and an intermediate layer 118 that is arranged between the bias magnetic layer 114 and the first protective film 115 so as to entirely cover an upper surface 114a of the bias magnetic layer 114.

The first protective film 115 and the second protective film 116 can be collectively referred to as a protective film 117.

In the aforementioned magnetic sensor 110, the intermediate layer 118 is made of a thin metal film composed of chromium (Cr), tantalum (Ta), titanium (Ti), and the like, for example.

It is preferable that the thickness of the intermediate layer 118 range from 5 nm to 15 nm.

When the thickness of the intermediate layer 118 is less than 5 nm, the adhesion between the bias magnetic layer 114 and the protective film 117 becomes insufficient, so that when a shearing stress is repeatedly applied to the magnetic sensor from the exterior in the heat-cool cycling test and the like, there is a possibility of the occurrence of separation of the protective film 117 in the interface between the bias magnetic layer 114 and the protective film 117.

On the other hand, when the thickness of the intermediate layer 118 exceeds 15 nm, it becomes difficult for the bias magnetic layer 114 to impart a bias magnetic field to the magnetoresistive element 112 in a prescribed direction.

The magnetoresistive element 112 is constituted by sequentially laminating a free layer, a conductive spacer layer composed of copper (Cu), a pinned layer composed of a cobalt-iron (CoFe) alloy; a pinning layer composed of a platinum-manganese (PtMn) alloy, and a capping layer composed of a thin metal film of tantalum (Ta), for example.

The free layer changes in the magnetization direction thereof in response to a direction of an external magnetic field. For example, it comprises a cobalt-zirconium-niobium (CoZrNb) amorphous magnetic layer, a nickel-iron (NiFe) magnetic layer laminated on the CoZrNb amorphous magnetic layer, and a cobalt-iron (CoFe) layer laminated on the NiFe magnetic layer.

In order to maintain the uniaxial anisotoropy in the free layer, the bias magnetic layer 114 applies a bias magnetic field in a prescribed direction.

Both of the CoZrNb amorphous magnetic layer and NiFe magnetic layer are soft ferromagnetic substances; and the CoFe layer is provided to avoid diffusion of nickel in the NiFe magnetic layer and diffusion of copper in the spacer layer.

The spacer layer is a thin metal film composed of copper or a copper alloy.

The pinned layer is made of a cobalt-iron (CoFe) magnetic layer. This CoFe magnetic layer is subjected to backing to an antiferromagnetic film in a switched-connection manner, so that it is pinned (or fixed) in magnetization direction thereof.

The pinning layer is made of an antiferromagnetic film that is composed of a PtMn alloy including platinum of 45-55 mol % laminated on the CoFe magnetic layer.

The pinned layer and pinning layer will be collectively referred to as a pin layer.

The embedded layer 113 is made of a thin metal film of chromium (Cr) whose thickness is 40 nm or so.

The bias magnetic layer 114 is made of a thin metal film composed of a cobalt-platinum-chromium (CoCrPt) alloy whose thickness is 90 nm or so.

The first protective film 115 is a thin film composed of silicon oxide (referred to as a SiOx film).

The second protective film 116 is a thin film composed of silicon nitride (referred to as a SiN film).

3. Third Embodiment

Figure 11:
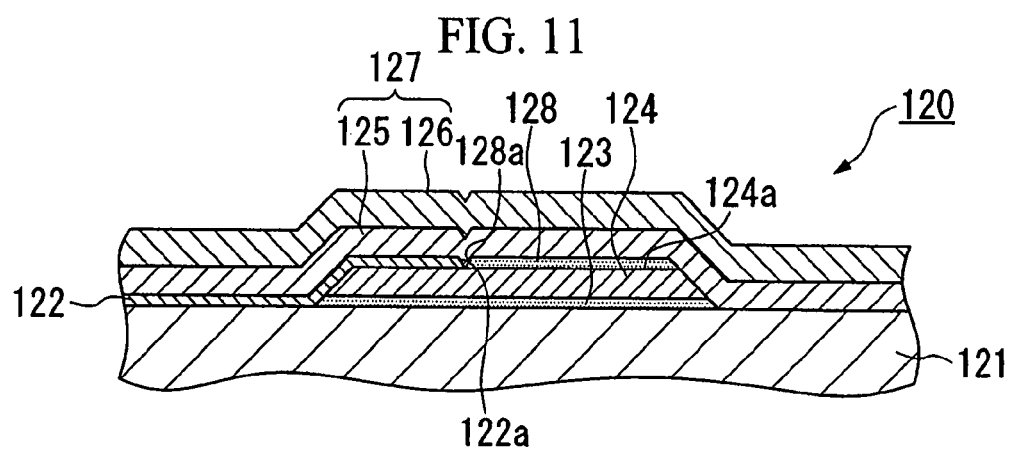
FIG. 11 is a cross-sectional view diagrammatically showing the constitution of a magnetic sensor in accordance with a third embodiment of the invention.

FIG. 11 is a cross-sectional view diagrammatically showing the constitution of a magnetic sensor in accordance with a third embodiment of the invention.

A magnetic sensor 120 shown in FIG. 11 comprises a substrate 121 composed of a quartz or silicon wafer having a prescribed thickness, a magnetoresistive element 122 composed of a GMR element arranged on the substrate 121, an embedded film 123 composed of a nonmagnetic material arranged on the substrate 121, a bias magnetic layer 124 composed of a permanent magnet film, which is arranged on the substrate 121 via the embedded film 123 and which is connected with both ends of the magnetoresistive element 122 respectively, a first protective film 125 for entirely covering the magnetoresistive element 122 and the bias magnetic layer 124, a second protective film 126 for covering the upper surface of the first protective film 125, and an intermediate layer 128 that substantially entirely covers a part of an upper surface 124a of the bias magnetic layer 124 where the magnetoresistive element 122 is not covered.

The first protective film 125 and the second protective film 126 can be collectively referred to as a protective film 127.

Covering the magnetoresistive element 122 and the bias magnetic layer 124 with the protective film 127 may indicate that the protective film 127 entirely covers them without openings for use in connections.

In the above, the intermediate layer 128 has the following effect by entirely covering the upper surface 124a of the bias magnetic layer 124, which is not covered with the magnetoresistive element 122. That is, upon viewing the magnetoresistive element 122 from the upper surface thereof (i.e., from the protective film 127), no gap exists between a side surface 122a of the magnetoresistive element 122 and a side surface 128a of the intermediate layer 128 so that the bias magnetic layer 124 is not exposed, or substantially no gap is formed between the side surface 122a of the magnetoresistive element 122 and the side surface 128a of the intermediate layer 128.

It is preferable that the distance between the side surface 122a of the magnetoresistive element 122 and the side surface 128a of the intermediate layer 128 does not exceed 3 μm.

When the distance between the side surface 122a of the magnetoresistive element 122 and the side surface 128a of the intermediate layer 128 exceeds 3 μm, the adhesion between the bias magnetic layer 124 and the protective film 127 becomes insufficient, so that when the shearing stress is repeatedly applied to the magnetic sensor from the exterior in the heat-cool cycling test and the like, there is a possibility of the occurrence of separation of the protective film 127 in the interface between the bias magnetic layer 124 and the protective film 127.

The magnetoresistive element 122 is constituted by sequentially laminating a free layer, a conductive spacer layer composed of copper (Cu), a pinned layer composed of a cobalt-iron (CoFe) alloy, a pinning layer composed of a platinum-manganese (PtMn) alloy, and a capping layer composed of a thin metal film of tantalum (Ta), for example. That is, the magnetoresistive element 122 has a constitution similar to that of the aforementioned magnetoresistive element 112 shown in FIG. 10.

The embedded film 123 is a thin metal film of chromium whose thickness is 40 nm or so.

The bias magnetic layer 124 is a thin metal film composed of a cobalt-platinum-chromium (CoCrPt) alloy whose thickness is 90 nm or so.

The first protective film 125 is a thin film composed of silicon oxide (referred to as a SiOx film).

The second protective film 126 is a thin film composed of silicon nitride (referred to as a SiN film).

The intermediate layer 128 is a thin metal film composed of chromium (Cr), tantalum (Ta), or titanium (Ti), for example.

4. Fourth Embodiment

Figure 12:
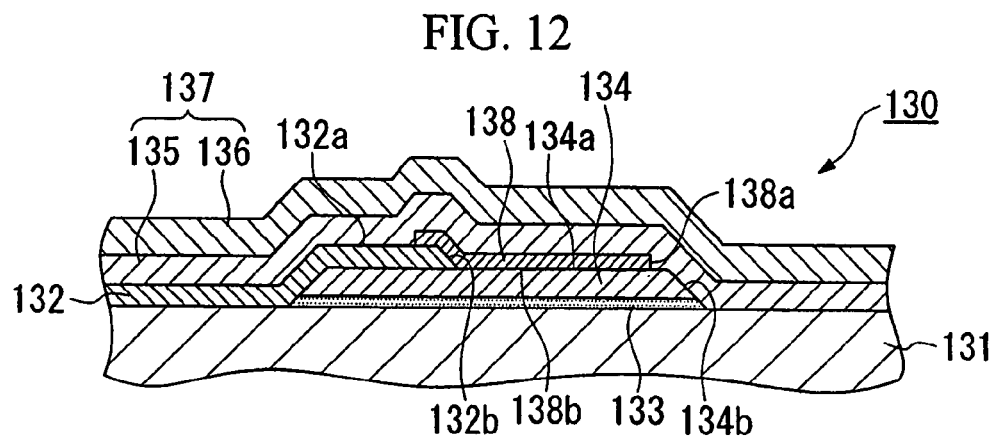
FIG. 12 is a cross-sectional view diagrammatically showing the constitution of a magnetic sensor in accordance with a fourth embodiment of the invention.

FIG. 12 is a cross-sectional view diagrammatically showing the constitution of a magnetic sensor in accordance with a fourth embodiment of the invention.

A magnetic sensor 130 shown in FIG. 12 comprises a substrate 131 composed of a quartz or silicon wafer having a prescribed thickness, a magnetoresistive element 132 composed of a GMR element arranged on the substrate 131, an embedded film 133 composed of a nonmagnetic material arranged on the substrate 131, a bias magnetic layer 134 composed of a permanent magnet film, which is arranged on the substrate 131 via the embedded film 133 and which is connected with both ends of the magnetoresistive element 132, respectively, a first protective film 135 for entirely covering the magnetoresistive element 132 and the bias magnetic layer 134, a second protective film 136 for covering the upper surface of the first protective film 135, and an intermediate layer 138 that entirely covers an upper surface 134a of the bias magnetic layer 134, which is not covered with the magnetoresistive element 132, and that also covers a side surface 132b of the magnetoresistive element 132 at both ends as well as a part of an upper surface 132a of the magnetoresistive element 132.

The first protective film 135 and the second protective film 136 can be collectively referred to as a protective film 137.

The intermediate layer 138 has the following effect by entirely covering the upper surface 134a of the bias magnetic layer 134, which is not covered with the magnetoresistive element 132. That is, upon viewing the intermediate layer 138 from the protective film 137, the side surface 138a of the intermediate layer 138 is not arranged in the same plane of the side surface 134b of the bias magnetic layer 134, and an upper surface 134a of the bias magnetic layer 134 is covered with a lower surface 138b of the intermediate layer 138.

In the magnetic sensor 130, the lower surface 138b of the intermediate layer 138 covers the upper surface 134a of the bias magnetic layer 134 in such a way that upon viewing the intermediate layer 138 from the protective film 127, a gap between the side surface 134b of the bias magnetic layer 134 and the side surface 138a of the intermediate layer 138 does not exceed 1 μm.

When the distance between the side surface 138a of the intermediate layer 138 and the side surface 134b of the bias magnetic layer 134 exceeds 1 μm, the adhesion between the bias magnetic layer 134 and the protective film 137 becomes insufficient and small, so that when shearing stress is applied to the magnetic sensor from the exterior in the heat-cool cycling test and the like, there is a possibility of the occurrence of separation of the protective film 137 in the interface between the bias magnetic layer 134 and the protective film 137.

The magnetoresistive element 132 is constituted by sequentially laminating a free layer, a conductive spacer layer composed of copper (Cu), a pinned layer composed of a cobalt-iron (CoFe) alloy, a pinning layer composed of a platinum-manganese (PtMn) alloy, and a capping layer composed of a thin metal film of tantalum (Ta), for example. That is, the magnetoresistive element 132 has the similar constitution of the aforementioned magnetoresistive element 112 shown in FIG. 10.

The embedded film 133 is a thin metal film of chromium whose thickness is 40 nm or so.

The bias magnetic layer 134 is a thin metal film composed of a cobalt-platinum-chromium (CoCrPt) alloy whose thickness is 90 nm or so.

The first protective film 135 is a thin film composed of silicon oxide (referred to as a SiOx film).

The second protective film 136 is a thin film composed of silicon nitride (referred to as a SiN film).

The intermediate layer 138 is a thin metal film composed of chromium (Cr), tantalum (Ta), or titanium (Ti), for example.

5. Manufacturing Methods

(1) Manufacturing Method for Second Embodiment

The manufacturing method for the magnetic sensor 110 of the second embodiment shown in FIG. 10 will be described in detail with reference to FIG. 46 and FIGS. 13 to 21. This manufacturing method for the second embodiment is partly similar to the aforementioned manufacturing method for the first embodiment, which is described with reference to FIGS. 3 to 9 and FIG. 46.

FIG. 46 is a flowchart showing steps of the manufacturing method of the magnetic sensor of the second embodiment. FIGS. 13 to 20 are cross-sectional views diagrammatically showing layered structures for explaining the manufacturing method of the magnetic sensor of the second embodiment, and FIG. 21 is a plan view diagrammatically showing the arrangement of the magnetoresistive element 112 and its related layers.

In the manufacturing method, there is firstly provided a substrate 111 composed of a quartz or silicon wafer. It is possible to form an LSI portion for controlling the magnetic sensor on the substrate 111 in advance. That is, in step A (showing a pretreatment process), transistor components, wiring, insulation films, and contacts are formed in accordance with the known method so as to form a protective film, in which openings are formed for use in connections.

Figure 13:
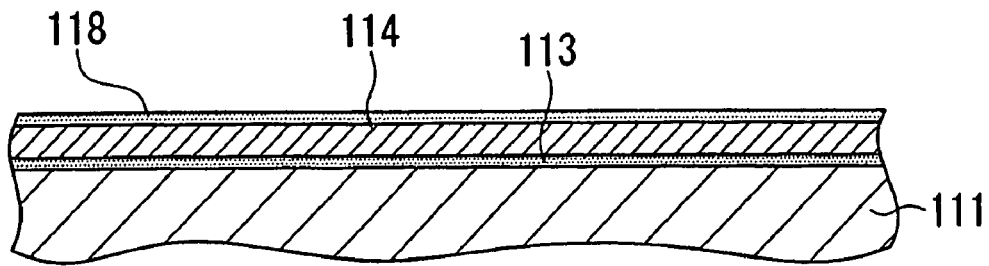
FIG. 13 is a cross-sectional view showing the structure for use in manufacture of the magnetic sensor of the second embodiment in step B-1.

Next, as shown in FIG. 13, an embedded film 113 of chromium whose thickness is 40 nm or so is formed on the upper surface of the substrate 111 composed of the quartz or silicon wafer in accordance with the sputtering method. Then, the sputtering method is performed on the upper surface of the embedded film 113 so as to form a bias magnetic layer 114, which is made of a cobalt-platinum-chromium alloy and whose thickness is 90 nm. Subsequently, the sputtering method is performed on the upper surface of the bias magnetic layer 114 so as to form an intermediate layer 118 composed of chromium whose thickness ranges from 5 nm to 15 nm (see step B-1).

Figure 14:
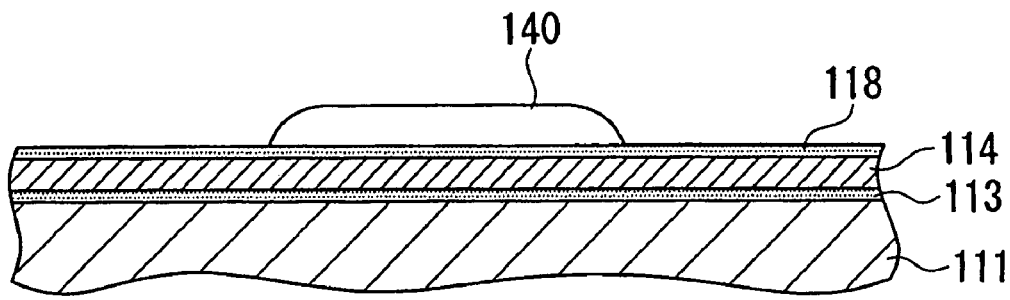
FIG. 14 is a cross-sectional view showing the structure for use in manufacture of the magnetic sensor of the second embodiment in step B-2.

Next, as shown in FIG. 14, the spin-coat method or dip-coat method is performed on the upper surface of the intermediate layer 118 so as to form a photoresist having an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, so that a resist film 140 whose both ends are curved is formed (see step B-2).

Figure 15:
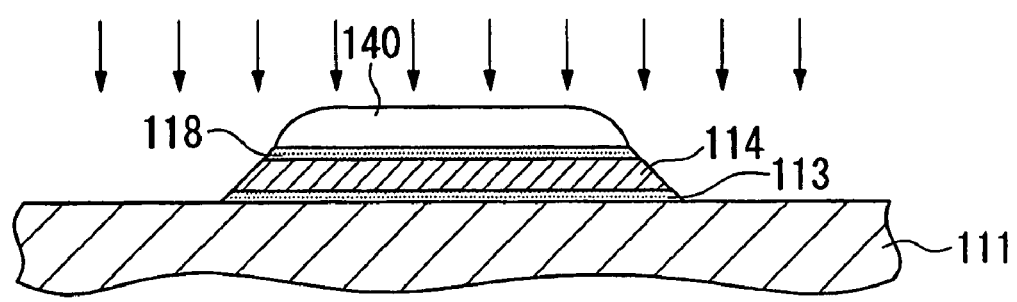
FIG. 15 is a cross-sectional view showing the structure for use in manufacture of the magnetic sensor of the second embodiment in step B-3.

Next, as shown in FIG. 15, ion milling is performed so as to partially remove the embedded film 113, bias magnetic layer 114, and intermediate layer 118 which are not covered with the resist film 140, thus forming the embedded film 113, bias magnetic film 114, and intermediate layer 118 in prescribed shapes (see step B-3). In this step B-3, ion milling is performed such that the side surfaces of the embedded film 113, bias magnetic layer 114, and intermediate layer 118 are slanted to the substrate 111 in response to the curved shapes of the both ends of the resist film 140. Prescribed portions of the bias magnetic layer 114, which are arranged in proximity to the both ends of the magnetoresistive element 112, act as leads for establishing electric conduction with the magnetoresistive element 112, wherein a part of them can be adequately shaped so as to be arranged on openings for use in connections.

Figure 16:
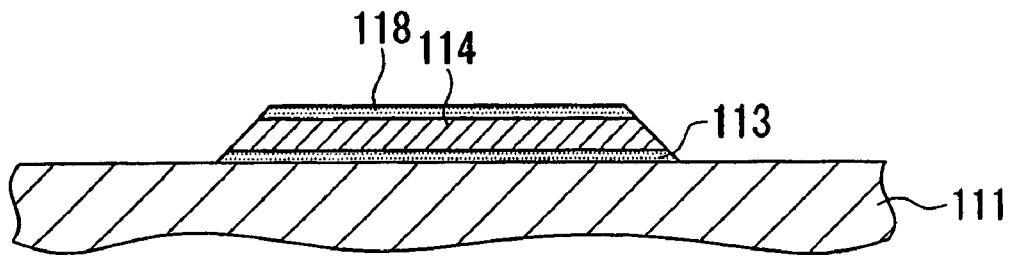
FIG. 16 is a cross-sectional view showing the structure for use in manufacture of the magnetic sensor of the second embodiment in step B-4.

Next, as shown in FIG. 16, the resist film 140 is removed by use of washing liquid such as acetone, N-methyl-2-pyrolidone, so that the surface of the bias magnetic layer 114 is subjected to washing so as to completely remove the resist film 140 (see step B-4).

Figure 17:
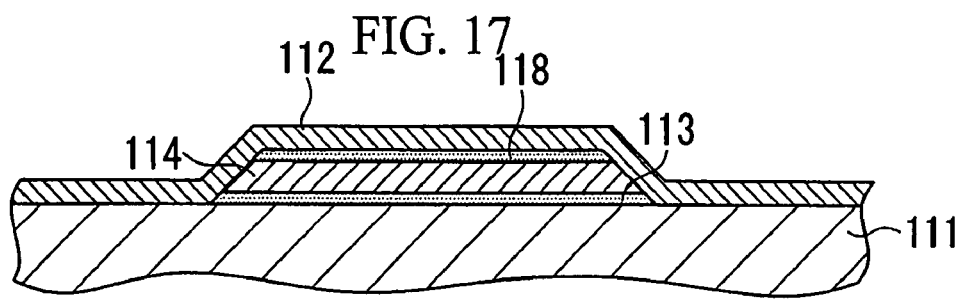
FIG. 17 is a cross-sectional view showing the structure for use in manufacture of the magnetic sensor of the second embodiment in step B-5.

Next, as shown in FIG. 17, ion beam sputtering method or magnetron sputtering method is performed on the upper surface of the substrate 111, the side surfaces of the embedded film 113 and bias magnetic layer 114, the upper surface and side surfaces of the intermediate layer 118, thus forming a magnetoresistive element 112 (see step B-5).

Next, a magnet array (not shown) that is arranged in an external space is arranged at a prescribed position relative to the bias magnetic layer 114, whereby a magnetic field is applied to the pin layer of the magnetoresistive element 112 in a prescribed direction (see step B-6).

Next, the magnet array and the bias magnetic layer 114 are fixed in the prescribed arrangement, while they are placed in a vacuum state and are then heated for four hours at 280° C. Thus, an ordering heat treatment is performed on the pinning layer within the pin layer of the magnetoresistive element 112 (see step B-7).

Next, the magnet array is removed from the prescribed position (see step B-8).

Figure 18:
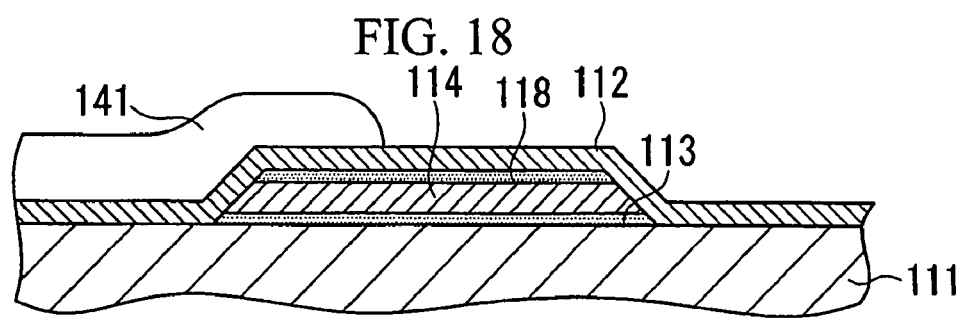
FIG. 18 is a cross-sectional view showing the structure for use in manufacture of the magnetic sensor of the second embodiment in step B-9.

Next, as shown in FIG. 18, the spin-coat method or dip-coat method is performed on the upper surface of the magnetoresistive element 112 so as to form a photoresist of an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, thus forming a resist film 141 whose both ends are curved (see step B-9).

Next, ion milling is performed to partially remove the magnetoresistive element 112, which is not covered with the resist film 141, thus forming the magnetoresistive element 112 in a prescribed shape (see step B-10). In this step B-10, ion milling is performed so that the side surfaces of the magnetoresistive element 112 are slanted to the substrate 111 in response to the curved shapes of the both ends of the resist film 141.

Figure 19:
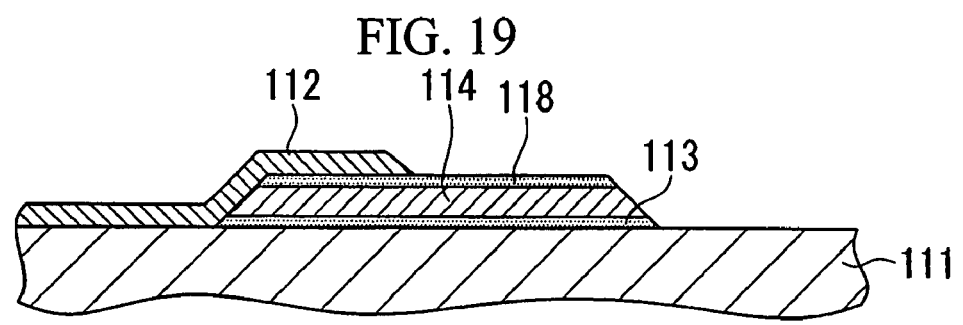
FIG. 19 is a cross-sectional view showing the structure for use in manufacture of the magnetic sensor of the second embodiment in step B-11.

Next, as shown in FIG. 19, the resist film 141 is removed by use of a washing liquid such as acetone, N-methyl-2-pirolidone, so that the surface of the magnetoresistive element 112 is subjected to washing so as to completely remove the resist film 141 (see step B-11).

Figure 20:
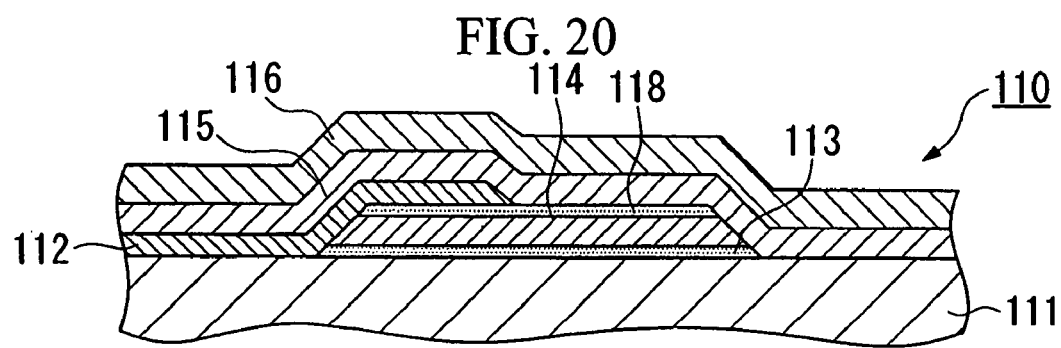
FIG. 20 is a cross-sectional view showing the structure for use in manufacture of the magnetic sensor of the second embodiment in step B-12.
Figure 21:
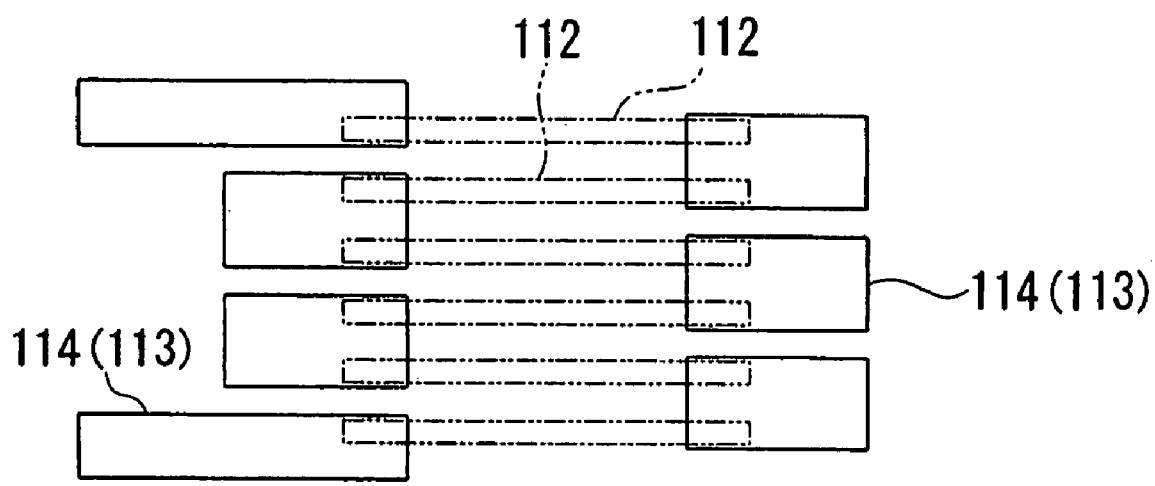
FIG. 21 is a plan view diagrammatically showing the arrangement of a magnetoresistive element and its related layers in the magnetic sensor of the second embodiment.

Next, as shown in FIG. 20, the plasma CVD method is performed on the upper surfaces of the substrate 111, magnetoresistive element 112, and intermediate layer 118 so as to form a first protective film 115 made of a silicon oxide film whose thickness is 150 nm or so (see step B-12).

FIG. 21 is an illustration viewed from the upper surface of the magnetoresistive element 112, wherein the first protective film 115 is not illustrated for the sake of the simplification.

Next, the plasma CVD method is performed on the surface of the first protective film 115 so as to form a second protective film 116 composed of a silicon nitride film whose thickness is 300 nm or so (see step B-13).

Incidentally, it is possible to further form a third protective film composed of a polyimide resin on the first protective film 115 and the second protective film 116.

Next, in step C, openings are formed at prescribed positions of the first protective film 115 and the second protective film 116; pads are formed therewith; then, the wafer is subjected to dicing and is divided into individual chips, each of which is then enclosed in a resin.

(2) Manufacturing Method for Third Embodiment

The manufacturing method for the magnetic sensor 120 of the third embodiment shown in FIG. 11 will be described in detail with reference to FIG. 47 and FIGS. 22 to 33.

Figure 47:
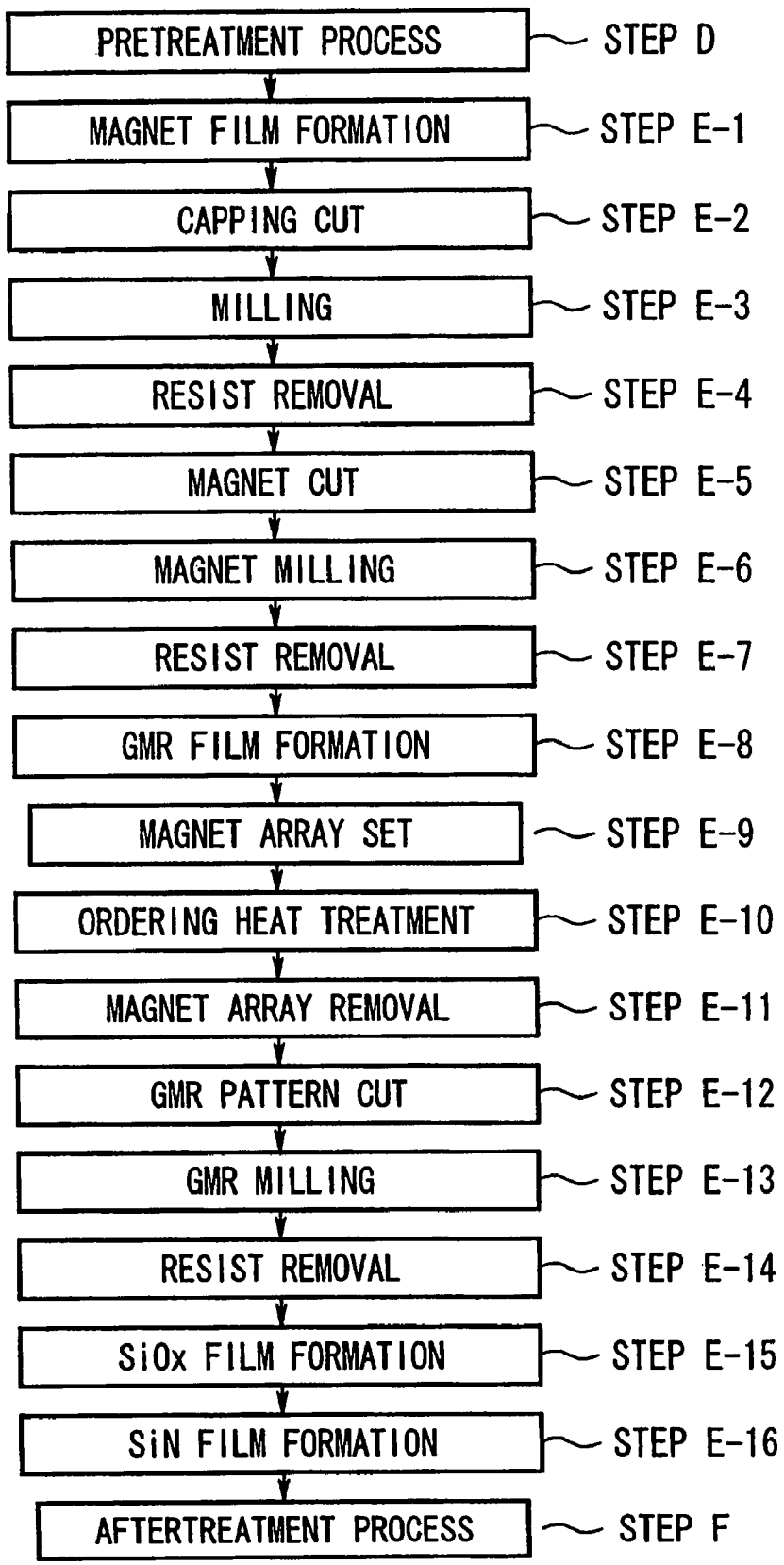
FIG. 47 is a flowchart showing steps for manufacturing the magnetic sensor shown in FIG. 11 in accordance with the third embodiment of the invention.

FIG. 47 is a flowchart showing steps D, E-1 to E-16, and F in the manufacturing method of the magnetic sensor of the third embodiment. FIGS. 22 to 32 are cross-sectional views diagrammatically showing layered structures for explaining the manufacturing method of the magnetic sensor of the third embodiment, and FIG. 33 is a plan view diagrammatically showing the arrangement of the magnetoresistive element 122 and its related layers.

In the manufacturing method, there is firstly provided a substrate 121 composed of a quartz or silicon wafer. It is possible to form an LSI portion for controlling the magnetic sensor on the substrate 121 in advance. That is, in step D (showing a pretreatment process), transistor components, wiring, insulation films, and contacts are formed in accordance with the known method so as to form a protective film, in which openings are formed for use in connections.

Figure 22:
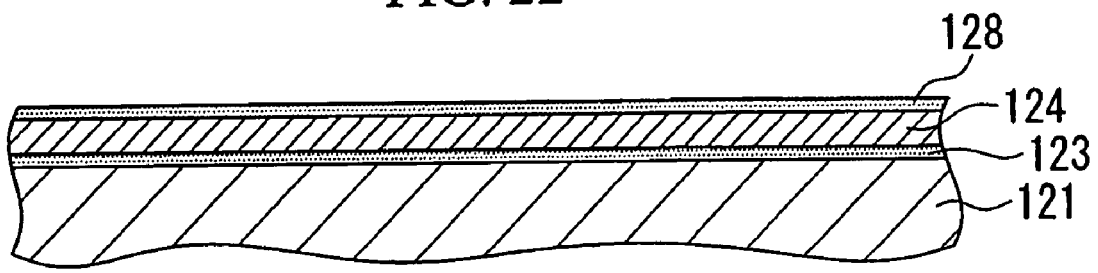
FIG. 22 is a cross-sectional view showing the structure for use in manufacture of the magnetic sensor of the third embodiment in step E-1.

Next, as shown in FIG. 22, an embedded film 123 of chromium whose thickness is 40 nm or so is formed on the upper surface of the substrate 121 composed of the quartz or silicon wafer in accordance with the sputtering method. Then, the sputtering method is performed on the upper surface of the embedded film 123 so as to form a bias magnetic layer 124, which is made of a cobalt-platinum-chromium alloy and whose thickness is 90 nm.

Subsequently, the sputtering method is performed on the upper surface of the bias magnetic layer 124 so as to form an intermediate layer 128 composed of chromium whose thickness ranges from 5 nm to 15 nm (see step E-1).

Figure 23:
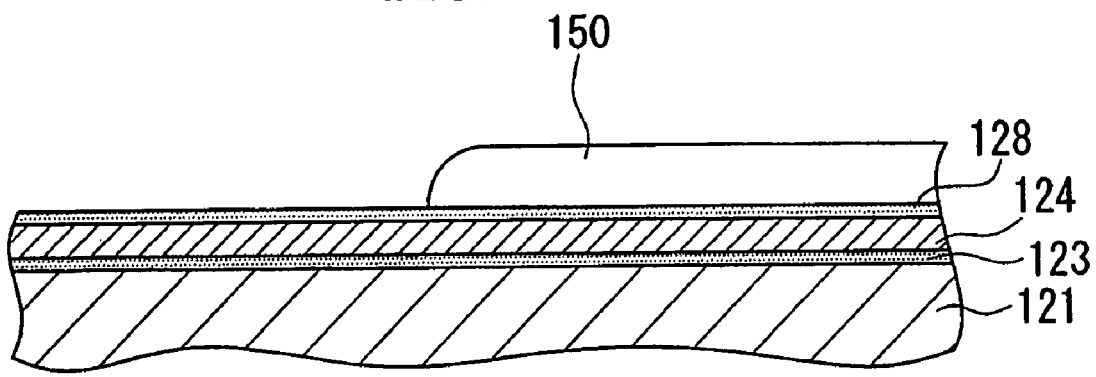
FIG. 23 is a cross-sectional view showing the structure for use in manufacture of the magnetic sensor of the third embodiment in step E-2.

Next, as shown in FIG. 23, the spin-coat method or dip-coat method is performed on the upper surface of the intermediate layer 128 so as to form a photoresist having an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, so that a resist film 150 whose both ends are curved is formed (see step E-2).

Figure 24:
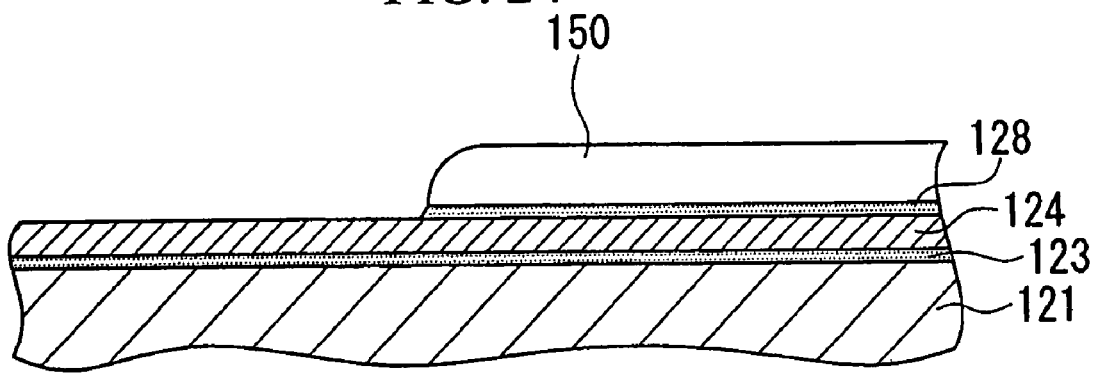
FIG. 24 is a cross-sectional view showing the structure for use in manufacture of the magnetic sensor of the third embodiment in step E-3.

Next, as shown in FIG. 24, ion milling is performed so as to partially remove the intermediate layer 128 which is not covered with the resist film 150 so that the bias magnetic layer 124 is exposed, thus forming the intermediate layer 128 in a prescribed shape (see step E-3). In this step E-3, ion milling is performed such that the side surfaces of the intermediate layer 128 are slanted to the substrate 121 in response to the curved shapes of the both ends of the resist film 150.

Next, the resist film 150 is removed by use of washing liquid such as acetone, N-methyl-2-pyrolidone, so that the surface of the intermediate layer 128 is subjected to washing so as to completely remove the resist film 150 (see step E-4).

Next, as shown in FIG. 25, the spin-coat method or dip-coat method is performed on the upper surface of the bias magnetic layer 124 from which the intermediate layer 128 is partially removed as well as the upper surface of the intermediate layer 128 so as to form a photoresist having an arbitrary thickness. A mask of an arbitrary pattern is arranged on the surface of the photoresist, which is then subjected to exposure and development process so as to remove the unnecessary portion of the photoresist. Subsequently, the photoresist is heated to cause reflow, thus forming a resist film 151 whose both ends are curved (see step E-5).

Next, as shown in FIG. 26, ion milling is performed such that the prescribed portions of the embedded film 123, bias magnetic layer 124, and intermediate layer 128, which are not covered with the resist film 15, are removed, and the substrate 121 is partially exposed, thus forming the embedded film 123, bias magnetic layer 124, and intermediate layer 128 in prescribed shapes (see step E-6). In this step E-6, ion milling is performed in response to the curved shapes of the both ends of the resist film 151 so that the side surfaces of the embedded film 123, bias magnetic layer 124, and intermediate layer 128 are slanted to the substrate 121.

Next, as shown in FIG. 27, the resist film 151 is removed by use of washing liquid such as acetone, N-methyl-2-pyrolidone, so that the surfaces of the bias magnetic layer 124 and intermediate layer 128 are subjected to washing so as to completely remove the resist film 151 (see step E-7).

Figure 28:
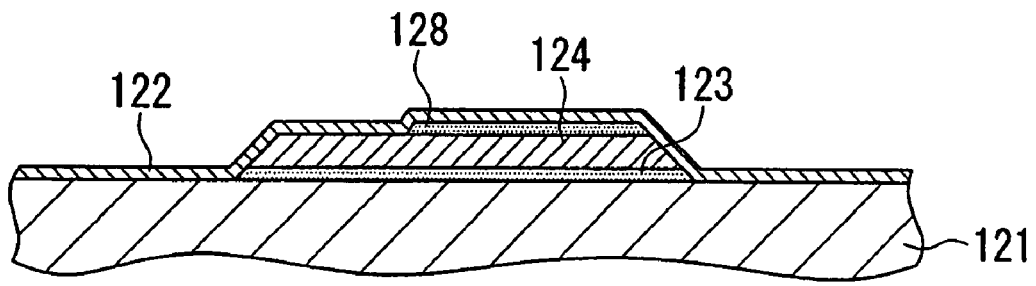
FIG. 28 is a cross-sectional view showing the structure for use in manufacture of the magnetic sensor of the third embodiment in step E-8.

Next, as shown in FIG. 28, ion beam sputtering method or magnetron sputtering method is performed on the upper surface of the substrate 121, the side surfaces of the embedded film 123 and bias magnetic layer 124, the upper surface and side surfaces of the intermediate layer 128, thus forming a magnetoresistive element 122 such as a GMR element (see step E-9).

Next, a magnet array and the bias magnetic layer 124 are fixed in the prescribed arrangement, while they are placed in a vacuum state and are then heated for four hours at 280° C. Thus, an ordering heat treatment is performed on the pinning layer within the pin layer of the magnetoresistive element 122 (see step E-10).

Next, the magnet array is removed from the prescribed position (see step E-11).

Figure 29:
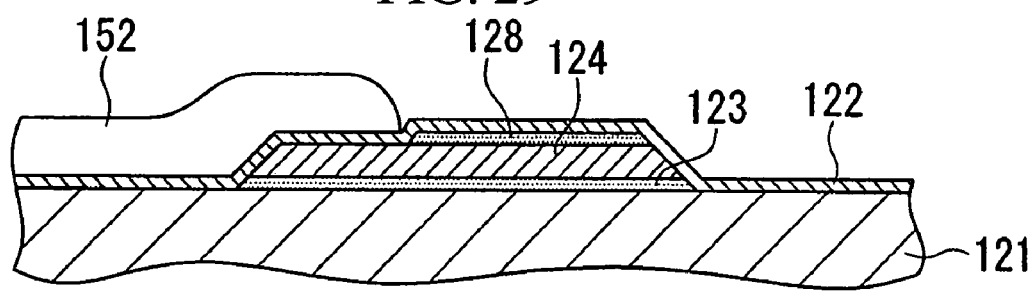
FIG. 29 is a cross-sectional view showing the structure for use in manufacture of the magnetic sensor of the third embodiment in step E-12.

Next, as shown in FIG. 29, the spin-coat method or dip-coat method is performed on the upper surface of the selected region of the magnetoresistive element 122 in which no intermediate layer 128 exists thereunder, thus forming a photoresist of an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, thus forming a resist film 152 whose both ends are curved (see step E-12).

Figure 30:
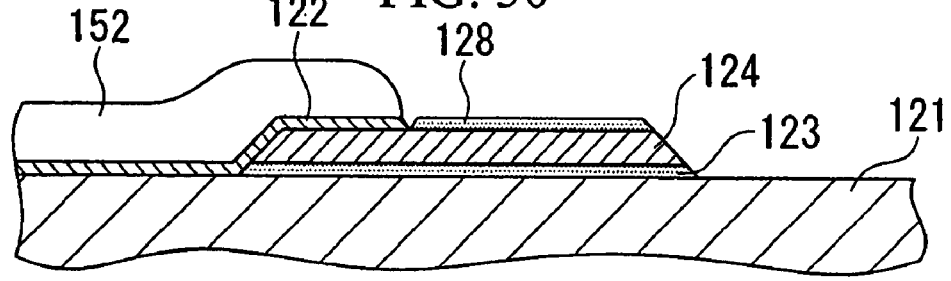
FIG. 30 is a cross-sectional view showing the structure for use in manufacture of the magnetic sensor of the third embodiment in step E-13.

Next, as shown in FIG. 30, ion milling is performed to partially remove the magnetoresistive element 122, which is not covered with the resist film 152, so that the side surfaces of the substrate 121, embedded film 123, and bias magnetic layer 124 as well as the intermediate layer 128 are exposed, thus forming the magnetoresistive element 122 in a prescribed shape (see step E-13). In this step E-13, ion milling is performed so that the side surfaces of the magnetoresistive element 122 are slanted to the substrate 121 in response to the curved shapes of the both ends of the resist film 152.

Figure 31:
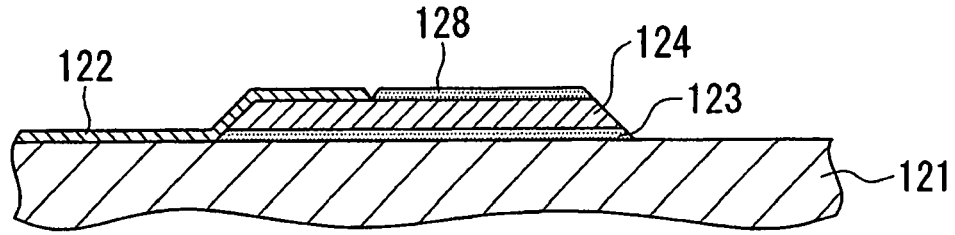
FIG. 31 is a cross-sectional view showing the structure for use in manufacture of the magnetic sensor of the third embodiment in step E-14.

Next, as shown in FIG. 31, the resist film 152 is removed by use of a washing liquid such as acetone, N-methyl-2-pirolidone, so that the surface of the magnetoresistive element 122 is subjected to washing so as to completely remove the resist film 152 (see step E-14).

Figure 32:
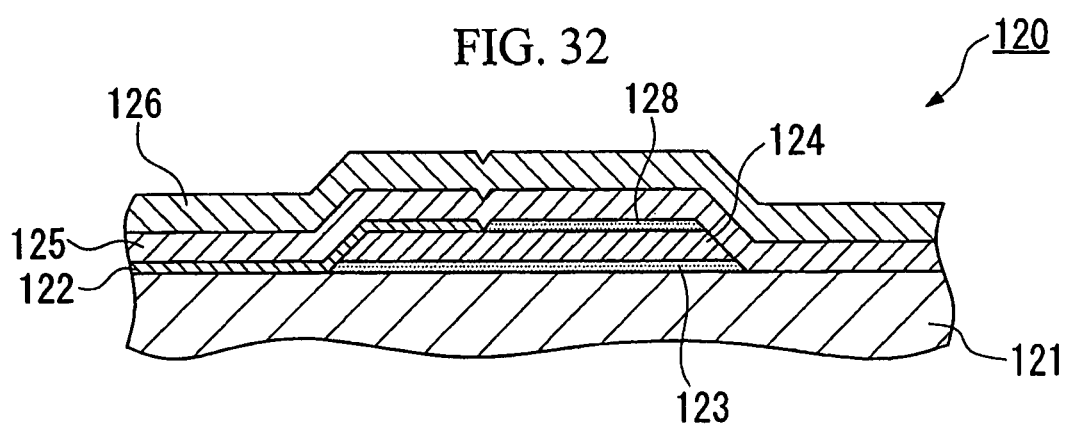
FIG. 32 is a cross-sectional view showing the structure for use in manufacture of the magnetic sensor of the third embodiment in step E-15.
Figure 33:
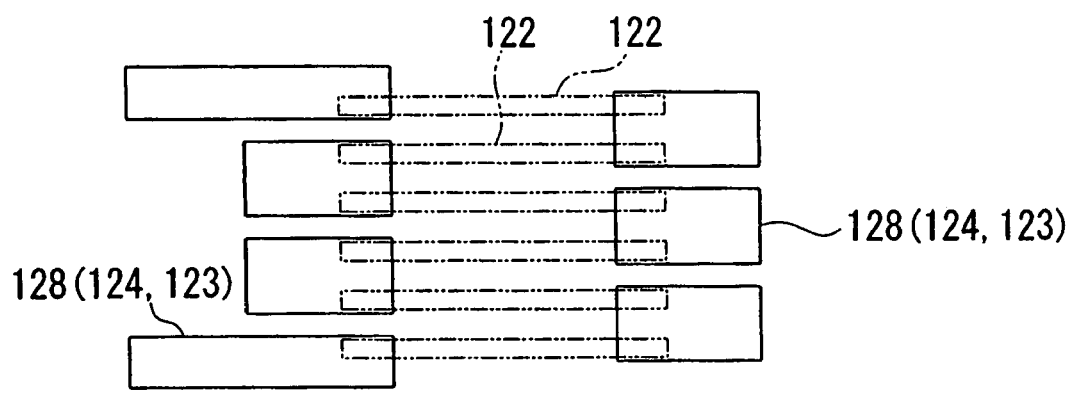
FIG. 33 is a plan view diagrammatically showing the arrangement of a magnetoresistive element and its related layers in the magnetic sensor of the third embodiment.

Next, as shown in FIG. 32, the plasma CVD method is performed on the upper surfaces of the substrate 121, magnetoresistive element 122, and intermediate layer 128 so as to form a first protective film 125 made of a silicon oxide film whose thickness is 150 nm or so (see step E-15).

FIG. 33 is an illustration viewed from the upper surface of the magnetoresistive element 122, wherein the first protective film 125 is not illustrated for the sake of the simplification.

Next, the plasma CVD method is performed on the surface of the first protective film 125 so as to form a second protective film 126 composed of a silicon nitride film whose thickness is 300 nm or so (see step E-16).

Incidentally, it is possible to further form a third protective film composed of a polyimide resin on the first protective film 125 and the second protective film 126.

Next, in step F, openings are formed at prescribed positions of the first protective film 125 and the second protective film 126; pads are formed therewith; then, the wafer is subjected to dicing and is divided into individual chips, each of which is then enclosed in a resin.

(3) Manufacturing Method for Fourth Embodiment

The manufacturing method for the magnetic sensor 130 of the fourth embodiment shown in FIG. 12 will be described in detail with reference to FIG. 48 and FIGS. 34 to 45.

Figure 48:
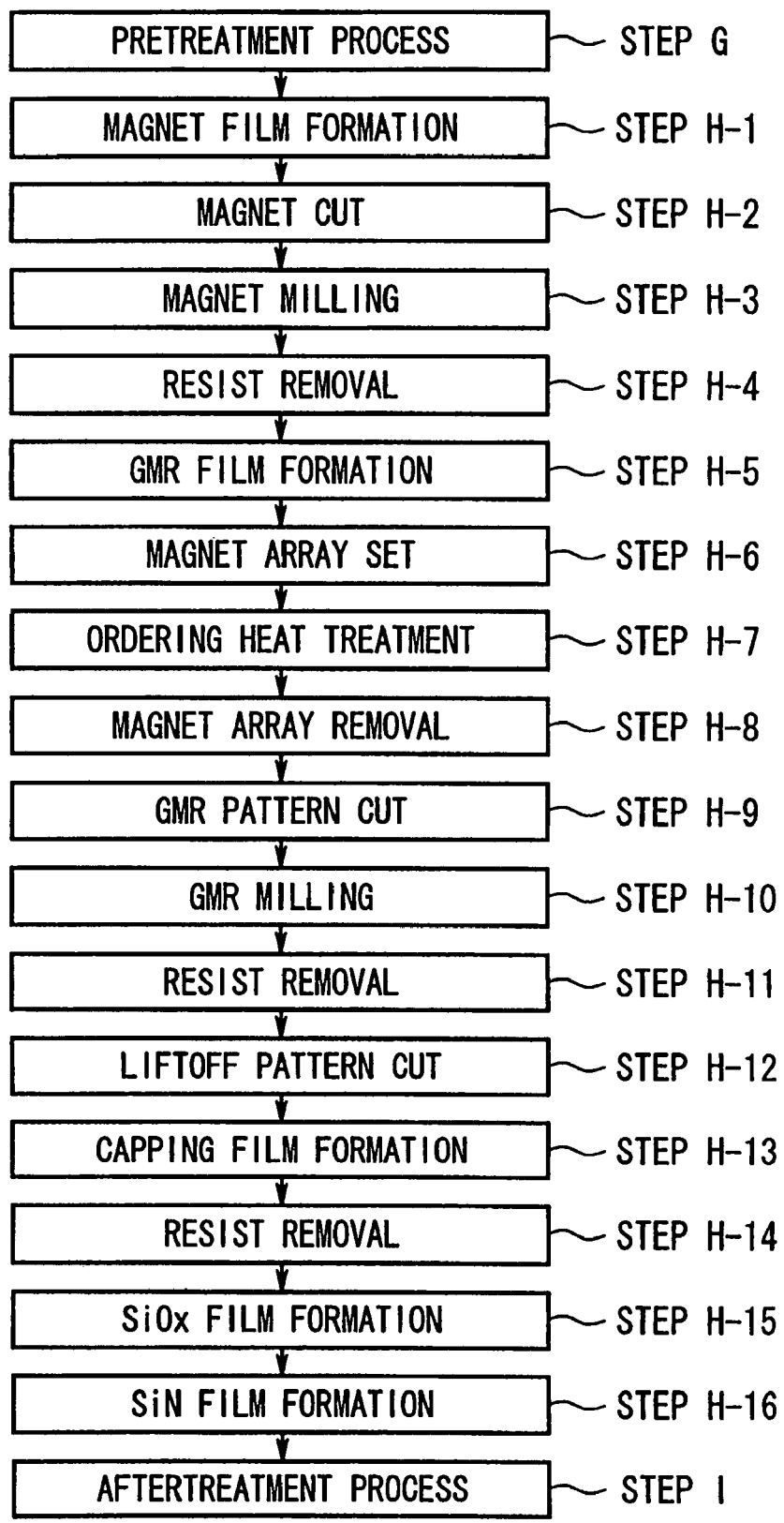
FIG. 48 is a flowchart showing steps for manufacturing the magnetic sensor shown in FIG. 12 in accordance with the fourth embodiment of the invention.
Figure 49:
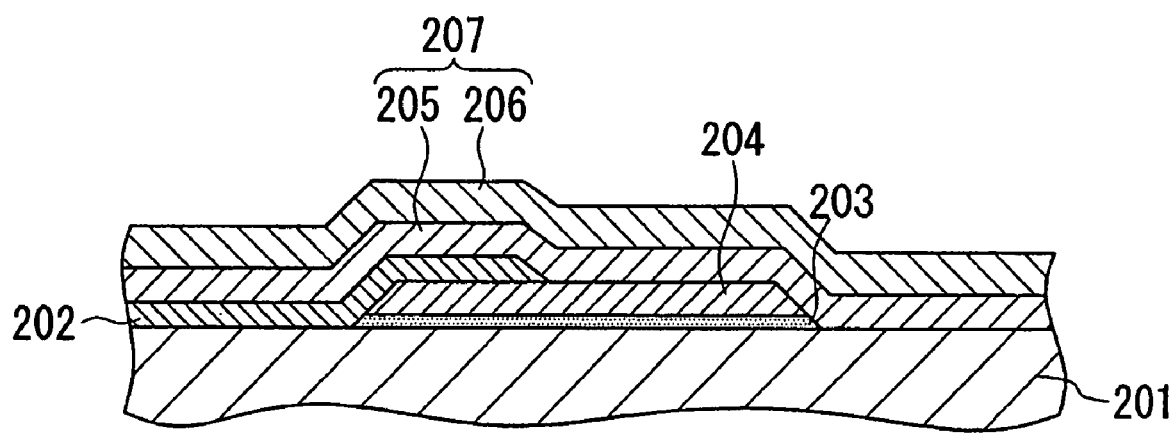
FIG. 49 is a cross-sectional view diagrammatically showing the constitution of a conventionally-known magnetic sensor.

FIG. 48 is a flowchart showing steps G, H-1 to H-16, and I in the manufacturing method of the magnetic sensor of the fourth embodiment. FIGS. 34 to 44 are cross-sectional views diagrammatically showing layered structures for explaining the manufacturing method of the magnetic sensor of the fourth embodiment, and FIG. 45 is a plan view diagrammatically showing the arrangement of the magnetoresistive element 132 and its related layers.

In the manufacturing method, there is firstly provided a substrate 131 composed of a quartz or silicon wafer. It is possible to form an LSI portion for controlling the magnetic sensor on the substrate 131 in advance. That is, in step G (showing a pretreatment process), transistor components, wiring, insulation films, and contacts are formed in accordance with the known method so as to form a protective film, in which openings are formed for use in connections.

Figure 34:
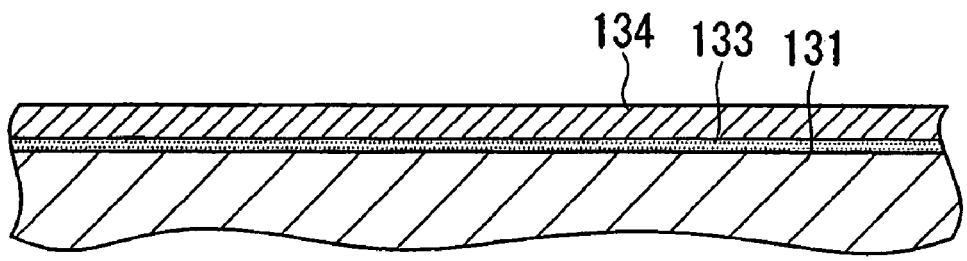
FIG. 34 is a cross-sectional view showing the structure for use in manufacture of the magnetic sensor of the fourth embodiment in step H-1.

Next, as shown in FIG. 34, an embedded film 133 of chromium whose thickness is 40 nm or so is formed on the upper surface of the substrate 131 composed of the quartz or silicon wafer in accordance with the sputtering method. Then, the sputtering method is performed on the upper surface of the embedded film 133 so as to form a bias magnetic layer 134, which is made of a cobalt-platinum-chromium alloy and whose thickness is 90 nm (see step H-1).

Figure 35:
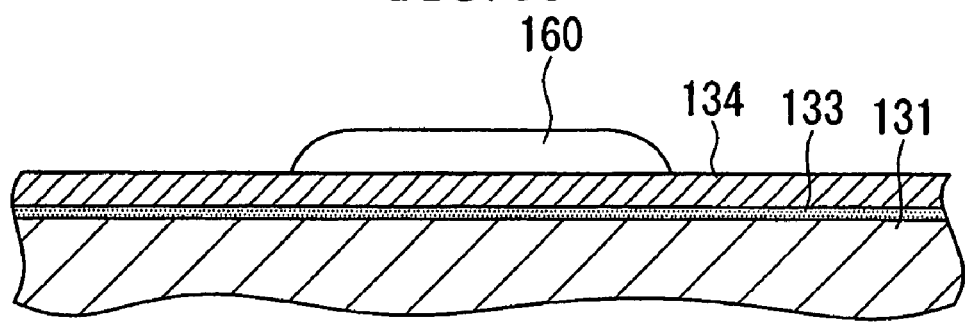
FIG. 35 is a cross-sectional view showing the structure for use in manufacture of the magnetic sensor of the fourth embodiment in step H-2.

Next, as shown in FIG. 35, the spin-coat method or dip-coat method is performed on the upper surface of the bias magnetic layer 134 so as to form a photoresist having an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, so that a resist film 160 whose both ends are curved is formed (see step H-2).

Figure 36:
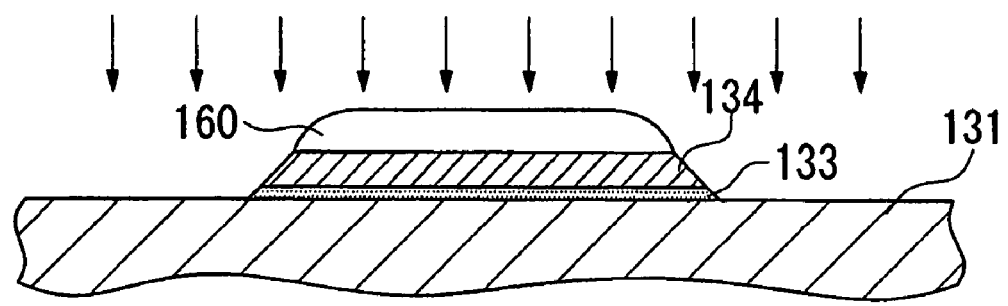
FIG. 36 is a cross-sectional view showing the structure for use in manufacture of the magnetic sensor of the fourth embodiment in step H-3.

Next, as shown in FIG. 36, ion milling is performed so as to partially remove the embedded layer 133 and the bais magnetic layer 134, which are not covered with the resist film 160, so that the substrate 131 is exposed, thus forming the embedded layer 133 and the bias magnetic layer 134 in prescribed shapes (see step H-3). In this step H-3, ion milling is performed such that the side surfaces of the embedded layer 133 and bias magnetic layer 134 are slanted to the substrate 131 in response to the curved shapes of the both ends of the resist film 160.

Figure 37:
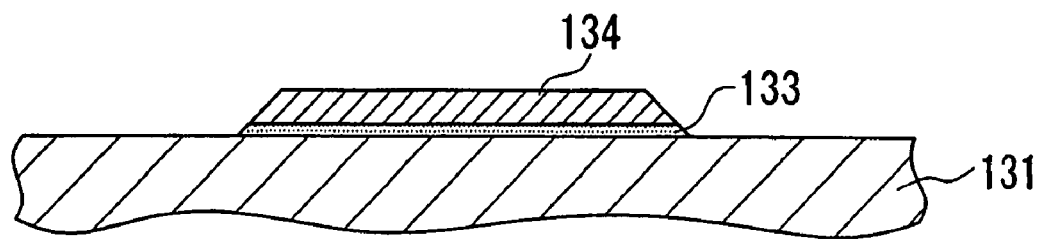
FIG. 37 is a cross-sectional view showing the structure for use in manufacture of the magnetic sensor of the fourth embodiment in step H-4.

Next, as shown in FIG. 37, the resist film 160 is removed by use of washing liquid such as acetone, N-methyl-2-pyrolidone, so that the surface of the bias magnetic layer 134 is subjected to washing so as to completely remove the resist film 160 (see step H-4).

Figure 38:
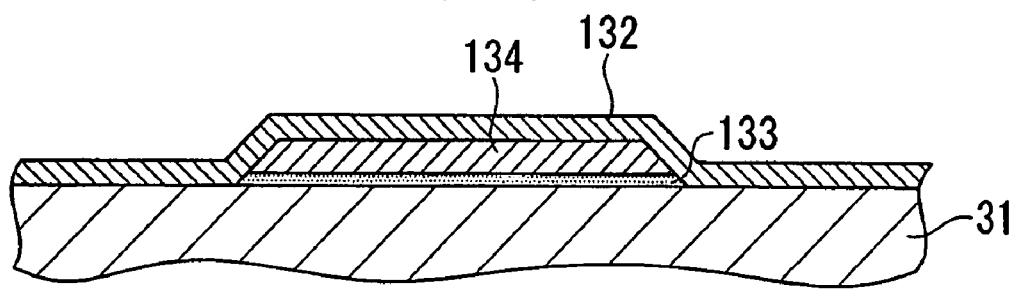
FIG. 38 is a cross-sectional view showing the structure for use in manufacture of the magnetic sensor of the fourth embodiment in step H-5.

Next, as shown in FIG. 38, the ion beam sputtering method or magnetron sputtering method is performed on the upper surface of the substrate 131, which is exposed by partially removing the embedded layer 133 and the bias magnetic layer 134 therefrom, thus forming a magnetoresistive element 132 such as a GMR element (see step H-5).

Next, a magnet array that is arranged in an external space is arranged at a prescribed position relative to the bias magnetic layer 134, whereby a magnetic field is applied to the pin layer of the magnetoresistive element 132 in a prescribed direction (see step H-6).

Next, the magnet array and the bias magnetic layer 134 are fixed in the prescribed arrangement, while they are placed in a vacuum state and are then heated for four hours at 280° C. Thus, an ordering heat treatment is performed on the pinning layer within the pin layer of the magnetoresistive element 132 (see step H-7).

Next, the magnet array is removed from the prescribed position (see step H-8).

Figure 39:
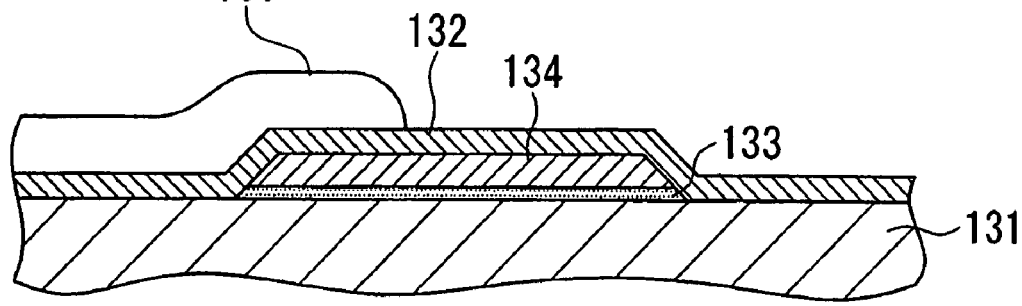
FIG. 39 is a cross-sectional view showing the structure for use in manufacture of the magnetic sensor of the fourth embodiment in step H-9.

Next, as shown in FIG. 39, the spin-coat method or dip-coat method is performed on the upper surface of the selected region of the magnetoresistive element 132 in which the bias magnetic layer 134 exists thereunder, thus forming a photoresist of an arbitrary thickness. A mask of an arbitrary pattern is arranged on the surface of the photoresist, which is then subjected to exposure and development process, so that the unnecessary portion of the photoresist is removed. Then, the photoresist is heated to cause reflow, thus forming a resist film 161 whose both ends are curved (see step H-9).

Next, ion milling is performed to partially remove the magnetoresistive element 132, which is not covered with the resist film 161, so that the substrate 131 and the bias magnetic layer 134 are partially exposed, thus forming the magnetoresistive element 132 in a prescribed shape (see step H-10). In this step H-10, ion milling is performed so that the side surfaces of the magnetoresistive element 132 are slanted to the substrate 131 in response to the curved shapes of the both ends of the resist film 161.

Figure 40:
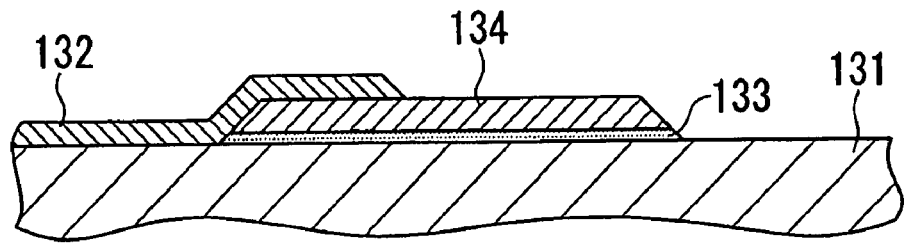
FIG. 40 is a cross-sectional view showing the structure for use in manufacture of the magnetic sensor of the fourth embodiment in step H-11.

Next, as shown in FIG. 40, the resist film 161 is removed by use of a washing liquid such as acetone, N-methyl-2-pirolidone, so that the surface of the magnetoresistive element 132 is subjected to washing so as to completely remove the resist film 161 (see step H-11).

Figure 41:
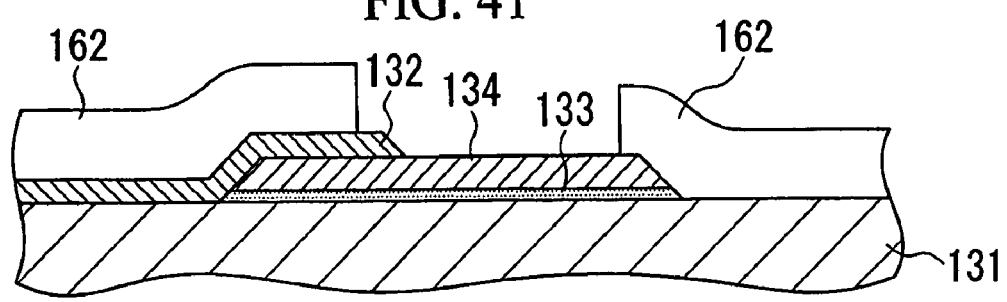
FIG. 41 is a cross-sectional view showing the structure for use in manufacture of the magnetic sensor of the fourth embodiment in step H-12.

Next, as shown in FIG. 41, the spin-coat method or dip-coat method is performed on the overall upper surface of the substrate 131, a part of the upper surface and side surfaces of the bias magnetic layer 134, and the overall upper surface of the magnetoresistive element 132 except its end portions, thus forming a photoresist of an arbitrary thickness. A mask of an arbitrary pattern is arranged on the surface of the photoresist, which is then subjected to exposure and development process, so that the unnecessary portion of the photoresist is removed, thus forming a resist film 162 in a prescribed shape (see step H-12).

Figure 42:
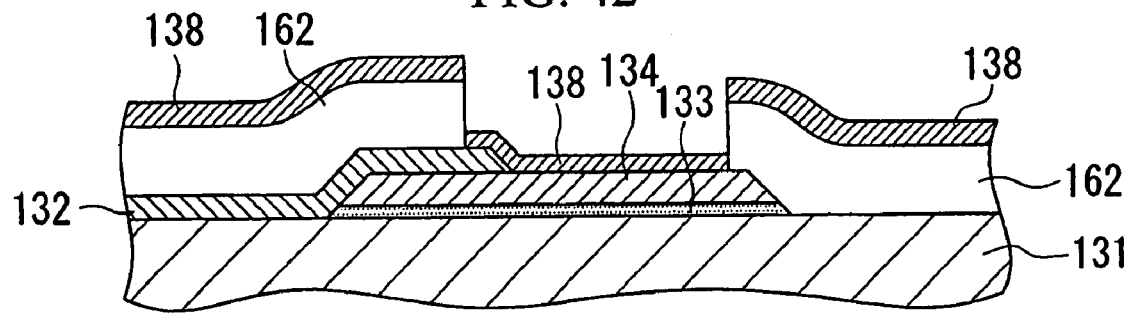
FIG. 42 is a cross-sectional view showing the structure for use in manufacture of the magnetic sensor of the fourth embodiment in step H-13.

Next, as shown in FIG. 42, the sputtering method is performed on the upper surface and side surfaces of the magnetoresistive element 132 at its both ends, the upper surface of the bias magnetic layer 134, and the upper surface of the resist film 162, thus forming an intermediate layer 138 (see step H-13).

Figure 43:
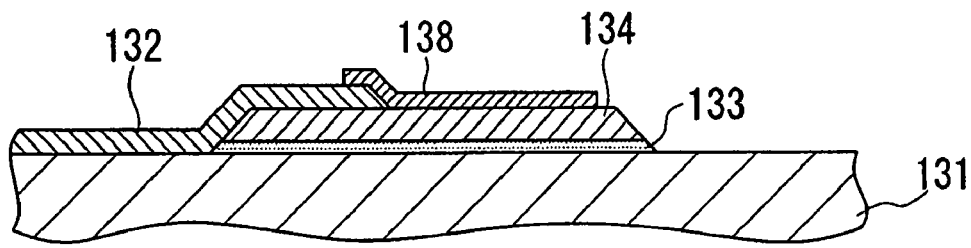
FIG. 43 is a cross-sectional view showing the structure for use in manufacture of the magnetic sensor of the fourth embodiment in step H-14.

Next, as shown in FIG. 43, the resist film 162 is removed by use of a washing liquid such as acetone, N-methyl-2-pirolidone, so that the surfaces of the substrate 131, magnetoresistive element 132, and intermediate layer 138 are subjected to washing so as to completely remove the resist film 162 (see step H-14).

Figure 44:
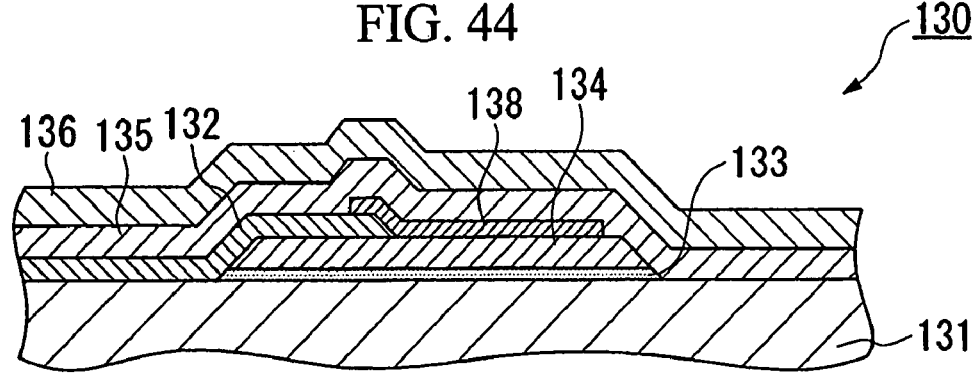
FIG. 44 is a cross-sectional view showing the structure for use in manufacture of the magnetic sensor of the fourth embodiment in step H-15.
Figure 45:
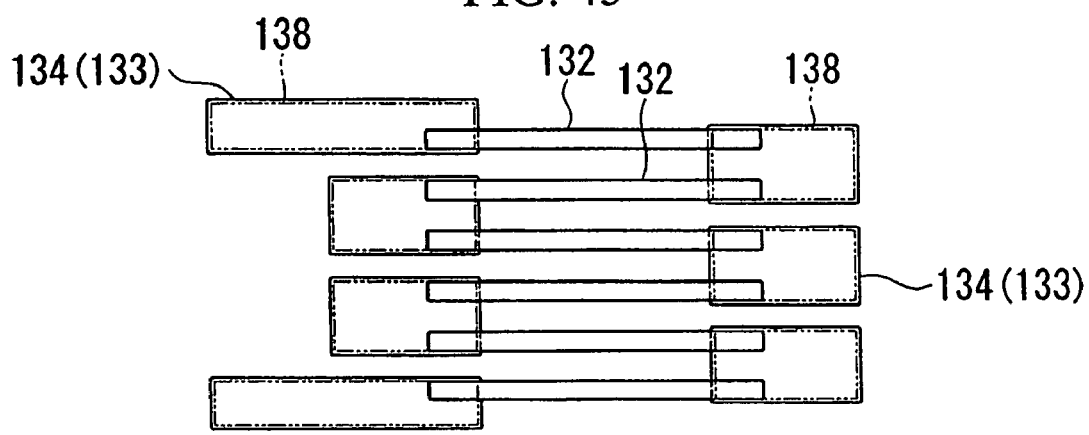
FIG. 45 is a plan view diagrammatically showing the arrangement of a magnetoresistive element and its related layers in the magnetic sensor of the fourth embodiment.

Next, as shown in FIG. 44, the plasma CVD method is performed on the upper surfaces of the substrate 131, magnetoresistive element 132, and intermediate layer 138 so as to form a first protective film 135 made of a silicon oxide film whose thickness is 150 nm or so (see step H-15).

FIG. 45 is an illustration viewed from the upper surface of the magnetoresistive element 132, wherein the first protective film 135 is not illustrated for the sake of the simplification.

Next, the plasma CVD method is performed on the surface of the first protective film 135 so as to form a second protective film 136 composed of a silicon nitride film whose thickness is 300 nm or so (see step H-16).

Incidentally, it is possible to further form a third protective film composed of a polyimide resin on the first protective film 135 and the second protective film 136.

Next, in step I, openings are formed at prescribed positions of the first protective film 135 and the second protective film 136; pads are formed therewith; then, the wafer is subjected to dicing and is divided into individual chips, each of which is then enclosed in a resin.

Next, the aforementioned embodiments will be further described in detail by use of various samples; of course, the present invention is not necessarily limited to the embodiments.

That is, in accordance with the manufacturing methods of the aforementioned embodiments, various samples of magnetic sensors are actually produced in prescribed dimensions in which each magnetoresistive element has a width of 7.5 μm, a distance between adjacent magnetoresistive elements is 3 μm, and the bias magnetic layer has a width of 18 μm.

In the aforementioned magnetic sensor, the intermediate layer having a thickness of 5 nm is formed on the bias magnetic layer, and the length of the intermediate layer measured from the end portion of the bias magnetic layer not joining the magnetoresistive element is 3 μm. Then, the produced samples of the magnetic sensors are enclosed in plastic mold packages.

(1) Adhesion Test

A mending tape (manufactured by Scotch 3M Corporation) is adhered onto the upper surface of the magnetic sensor (i.e., the surface of the magnetic sensor in which the protective film is arranged); then, the mending tape is peeled off, and an examination is conducted as to whether or not separation occurs in the interface between the bias magnetic layer and the protective film in the magnetic sensor. Similar testing is performed on 100 samples of magnetic sensors so as to count the number of samples in which separation occurs in the aforementioned interface.

(2) Heat-Cool Cycling Test

The plastic mold packages of magnetic sensors are subjected to the severe condition of the environment by performing heat-cool cycling in which they are maintained at −65° C. for thirty minutes; they are increased in temperature to room temperature within five minutes; they are maintained at room temperature for thirty minutes; they are increased in temperature up to 150° C. within five minutes; they are maintained at 150° C. for thirty minutes; they are decreased in temperature to room temperature within five minutes; they are maintained at room temperature for thirty minutes; then, they are decreased in temperature to −65° C. within five minutes. Herein, each sample of the magnetic sensor is subjected to the aforementioned heat-cool cycling 500 times.

Thereafter, the plastic mold packages are opened by etching using fuming nitric acid, so that an examination is conducted as to whether or not separation occurs in the interface between the bias magnetic layer and the protective film in the magnetic sensor. Similar testing is performed on twenty samples of plastic mold packages of magnetic sensors so as to count the number of samples in which separation occurs in the aforementioned interface.

In the above, comparative samples of magnetic sensors are produced in accordance with the manufacturing method of the present embodiment, wherein none of them includes the intermediate layer.

Plastic mold packages are produced using the comparative examples of the magnetic sensors described above.

Then, in a manner similar to the foregoing samples of the magnetic sensors, the adhesion test and the heat-cool cycling test are performed on the plastic mold packages enclosing the comparative samples of the magnetic sensors.

With respect to the samples of the magnetic sensors being produced in accordance with the aforementioned embodiments, separation was found in 1 sample per 100 samples in the adhesion test, and no separation is found in 100 samples in the heat-cool cycling test.

With respect to the comparative samples of the magnetic sensors, separation is found in 32 samples per 100 samples in the adhesion test, and separation is found in 7 samples per 100 samples in the heat-cool cycling test.

As a result, it is demonstrated that due to the existence of the intermediate layer, each of the magnetic sensors produced in accordance with the embodiments is superior in adhesion between the bias magnetic layer and the protective film, and it is also superior in environmental durability.

In contrast, the magnetic sensor of the comparative sample provides insufficient and small adhesion between the bias magnetic layer and the protective film, and it is inferior in environmental durability.

As described above, each of the magnetic sensors produced in accordance with the second, third, and fourth embodiments is characterized by providing the intermediate layer in relation to the magnetoresistive element, protective film, and bias magnetic layer in such a way that the upper surface of the bias magnetic layer is entirely covered with the intermediate layer. Herein, the magnetic sensor can be designed such that a part of the upper surface of the bias magnetic layer, which is not covered with the magnetoresistive element, is covered with the intermediate layer, and the upper surface and the side surfaces of the magnetoresistive elements at its both ends are covered with the intermediate layer.

Thus, it is possible to improve the adhesion between the bias magnetic layer and the protective film; hence, the magnetic sensor becomes superior in environmental durability, particularly, durability against temperature variations; thus, it is possible to noticeably increase the reliability in the production of the magnetic sensors.

6. Fifth Embodiment

Figure 50:
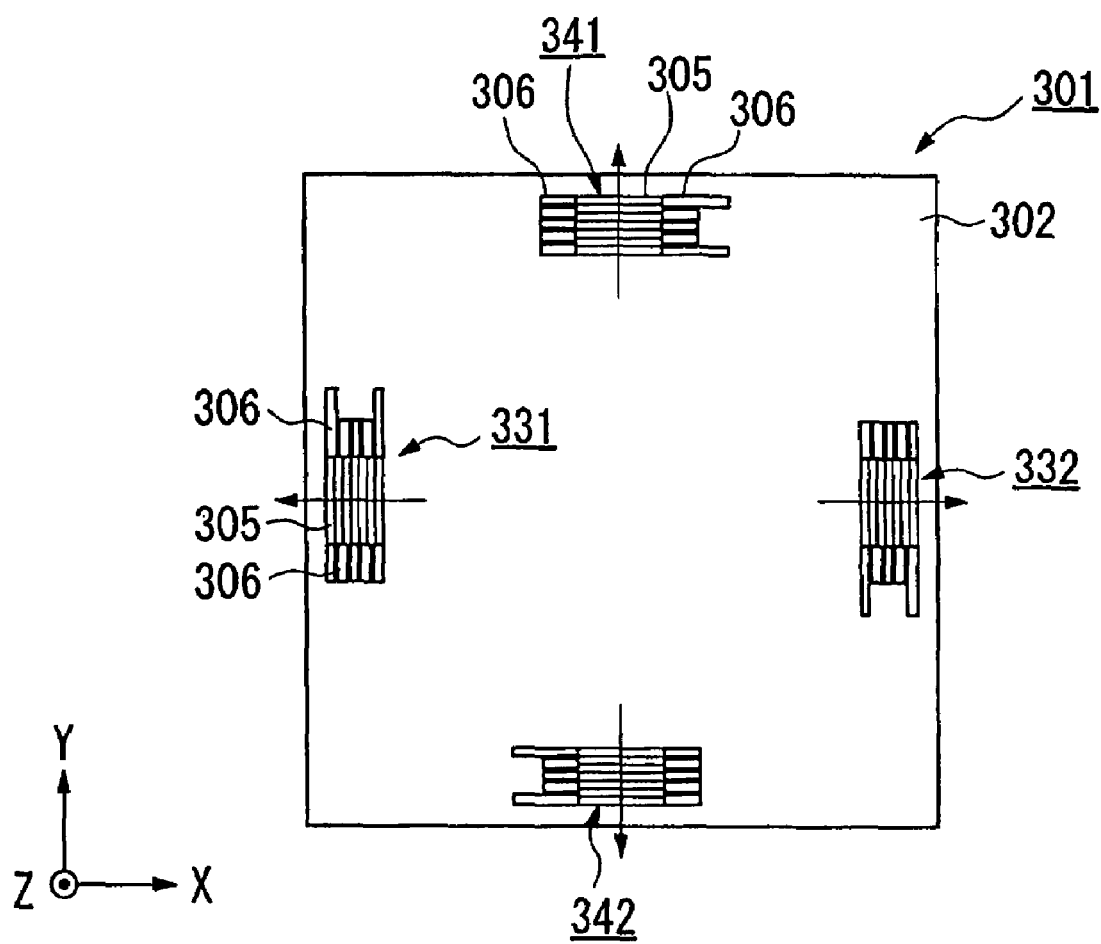
FIG. 50 is a plan view diagrammatically showing the overall constitution of a magnetic sensor in accordance with a fifth embodiment of the invention.

FIG. 50 is a plan view diagrammatically showing the overall constitution of a magnetic sensor in accordance with a fifth embodiment of the invention.

That is, a magnetic sensor 301 of FIG. 50 is constituted by a quartz substrate 302 roughly having a square shape and a prescribed thickness, a pair of X-axis GMR elements 331 and 332, which are formed on the quartz substrate 302 so as to form an X-axis magnetic sensor for detecting a magnetic field in an X-axis direction, and a pair of Y-axis GMR elements 341 and 342 that are formed on the quartz substrate 302 so as to form a Y-axis magnetic sensor for detecting the magnetic field in a Y-axis direction perpendicular to the X-axis direction.

Incidentally, a silicon wafer can be substituted for the quartz substrate 2.

Figure 51:
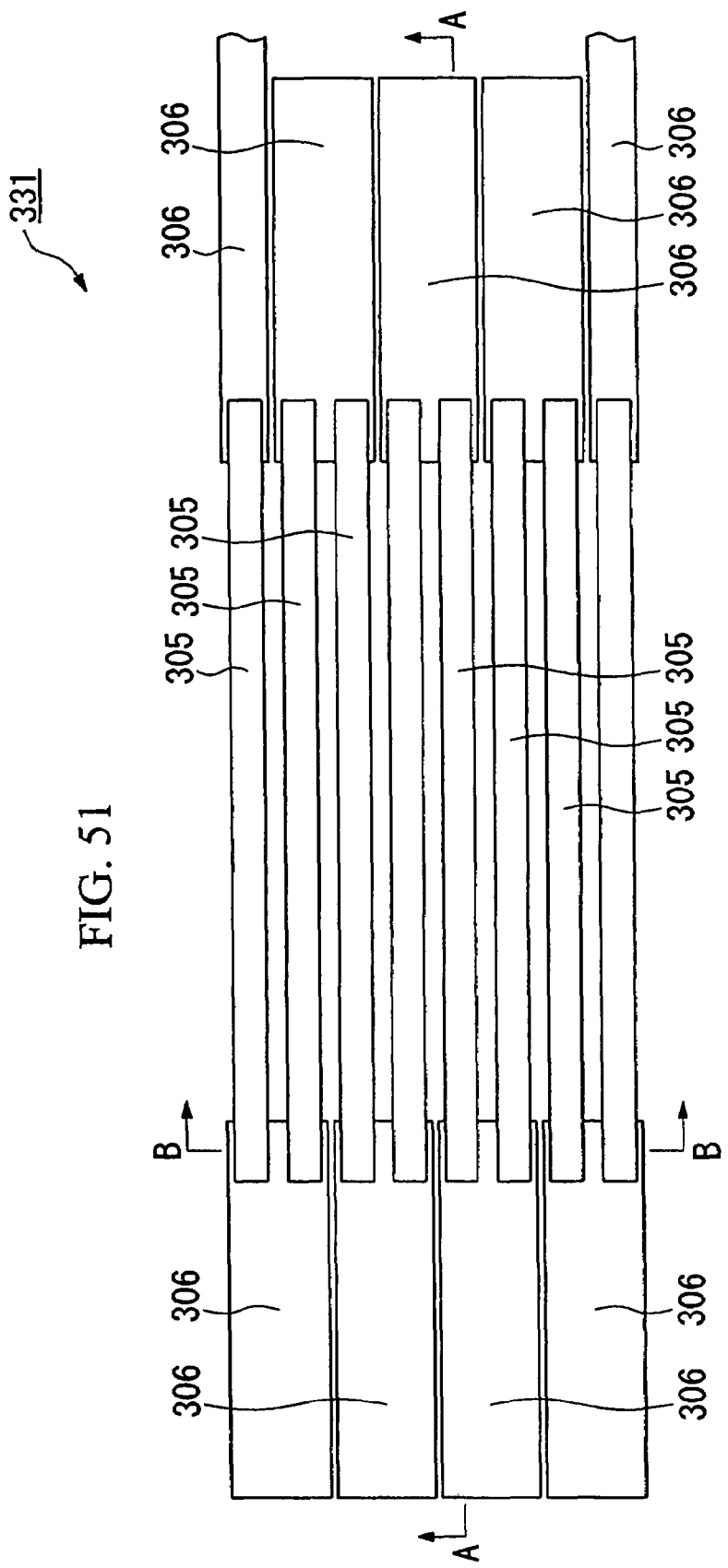
FIG. 51 is a plan view diagrammatically showing the constitution of an X-axis GMR element included in the magnetic sensor shown in FIG. 50.
Figure 52:
FIG. 52 is a cross-sectional view taken along line A-A in FIG. 51.
Figure 53:
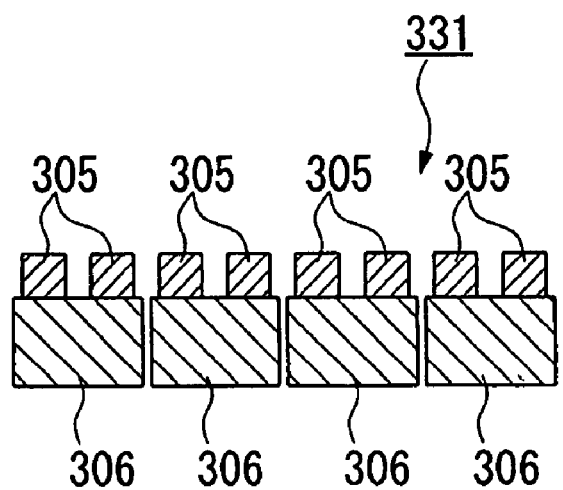
FIG. 53 is a cross-sectional view taken along line B-B in FIG. 51.

FIG. 51 is a plan view diagrammatically showing the constitution of the X-axis GMR element 331; FIG. 52 is a cross-sectional view taken along line A-A in FIG. 51; and FIG. 53 is a cross-sectional view taken along line B-B in FIG. 51.

The X-axis GMR elements 331 and 332 are respectively arranged in proximity to midpoints of two sides perpendicular to the X-axis on the quartz substrate 302, wherein they are arranged in parallel with each other. Similarly, the Y-axis GMR elements 341 and 342 are respectively arranged in proximity to midpoints of two sides perpendicular to the Y-axis on the quartz substrate 302, wherein they are arranged in parallel with each other.

Each of the X-axis GMR elements 331 and 332 and the Y-axis GMR elements 341 and 342 is constituted by a plurality of magnetoresistive films 305 each having a band-like shape and a plurality of permanent magnet films (or bias magnetic films) 306, which are arranged on both ends of the magnetoresistive films 305 in their longitudinal directions. The permanent magnet film 306 is constituted by a rectangular thin film composed of a hard ferromagnetic substance such as CoCrPt having a high coercive force and a high rectangular ratio.

One ends of the 'paired' magnetoresistive films 305, which are arranged adjacent to each other, are connected together via a single permanent magnet film 306. The other ends of the paired magnetoresistive films 305, which are arranged adjacent to each other, are connected together via another permanent magnet film 306.

The permanent magnet films 306 are connected with wiring (not shown), by which the ends of the paired magnetoresistive films 305 connected via a single permanent magnet film 306 are electrically connected together.

Thus, the magnetoresistive films 305 and the permanent magnet films 306 are connected in series and are arranged in a zigzag manner, wherein the magnetoresistive films 305 are electrically connected in series via the permanent magnet films 306 and the wiring so as to function as resistance circuitry. Hence, an electric current is introduced from the exterior to flow in the resistance circuitry constituted by the magnetoresistive films 305, whereby a voltage of the resistance circuitry is measured so as to calculate the resistance of the magnetoresistive films 305, based on which the intensity of an external magnetic field can be estimated. It is preferable that the width of the magnetoresistive film 305 is set in a range from 6 μm to 8 μm.

Figure 54:
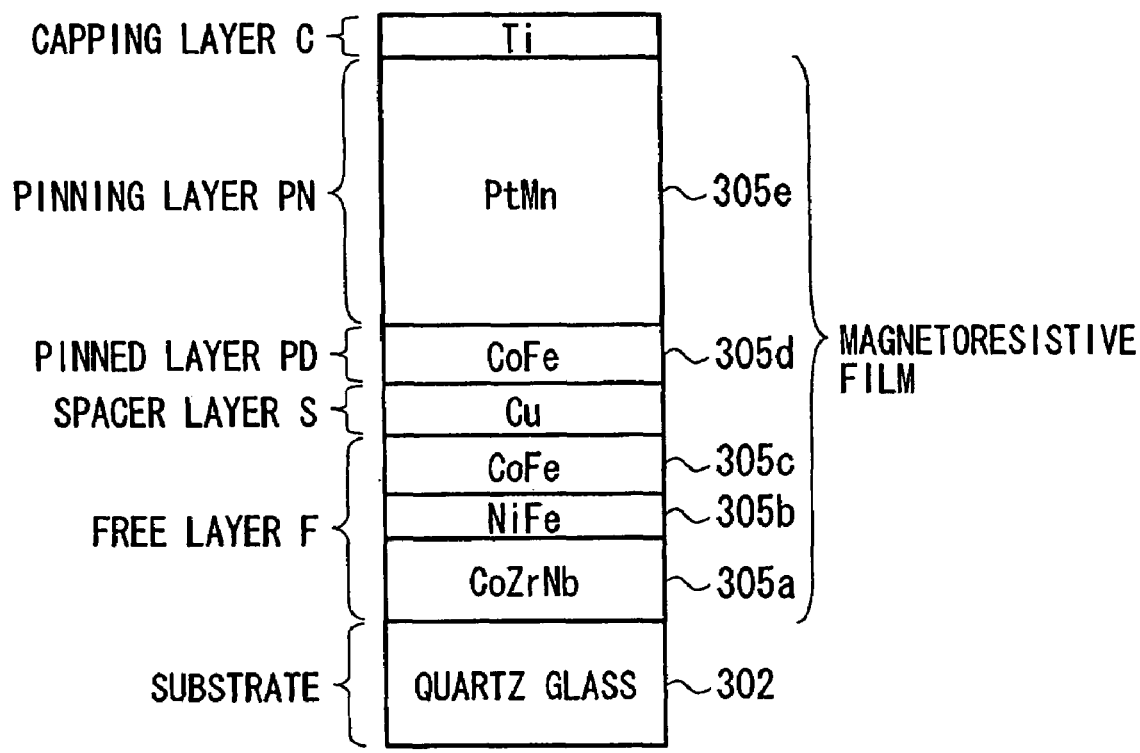
FIG. 54 shows the structure of a magnetoresistive film used in the X-axis GMR element.

Next, the structure of the magnetoresistive film 305 will be described in detail. FIG. 54 shows the structure of the magnetoresistive film 305 included in the X-axis GMR element 331. That is, the magnetoresistive film 305 is constituted by sequentially laminating a free layer F, a conductive spacer layer S composed of copper (Cu) or a copper alloy, a pinned layer PD composed of CoFe, a pinning layer PN composed of PtMn, and a capping layer C made of a thin metal film composed of titanium (Ti) or tantalum (ta), all of which are arranged on a quartz substrate 302.

The free layer F changes in magnetization direction in response to the direction of an external magnetic field, wherein it comprises a CoZrNb amorphous magnetic layer 305a, a NiFe magnetic layer 305b laminated on the CoZrNb amorphous magnetic layer 305a, and a CoFe layer 305c laminated on the NiFe magnetic layer 305b.

Each of the CoZrNb amorphous magnetic layer 305a and the NiFe magnetic layer 305b is composed of a soft ferromagnetic substance, and the CoFe layer 305c is a diffusion avoiding layer that avoids diffusion of Ni in the NiFe magnetic layer 305b and diffusion of Cu in the spacer layer S.

The pinned layer PD is constituted by a CoFe magnetic layer 305d, which is subjected to backing in a switched-connection manner by an antiferromagnetic film 305e so that the magnetization direction thereof is pinned (or fixed) in the negative direction of the X-axis.

The pinning layer PN is laminated on the CoFe magnetic layer 305d, which is composed of the anti-ferromagnetic film 305e composed of a PtMn alloy including 45-55 mol % of Pt. This antiferromagnetic film 305e is formed upon ordering heat treatment being effected in the state in which a magnetic field is applied in the negative direction of the X-axis.

The pinned layer PD and the pinning layer PN will be collectively referred to as a pin layer.

The other X-axis GMR elements 332, and the Y-axis GMR elements 341 and 342 have the same structure as the X-axis GMR element 331 except that they have specific magnetization direction pinned (or fixed) in arrow directions in FIG. 50; hence, the detailed description thereof will be omitted.

The permanent magnet films 306 arranged in contact with the both ends of the magnetoresistive films 305 are magnetized in directions along the longitudinal axial directions of the magnetoresistive films 305.

As described above, the magnetization direction of the pinned layer PD is perpendicular to the longitudinal axis thereof, and the magnetization direction of the permanent magnet film 306 is along the longitudinal axis; hence, an angle of 90° is formed between the magnetization direction of the pinned layer PD of the magnetoresistive film 305 and the magnetization direction of the permanent magnet film 306.

Due to the aforementioned magnetization of the permanent magnet film 306, it is possible to maintain the uniaxial anisotropy in the free layer F of the magnetoresistive film 305.

As shown in FIG. 50, the 'pinned' magnetization direction of the pinned layer PD of the X-axis GMR element 331 lies in the negative direction of the X-axis. The pinned magnetization direction of the pinned layer PD of the X-axis GMR element 332 lies in the positive direction of the X-axis. In addition, the pinned magnetization direction of the pinned layer PD of the Y-axis GMR element 341 lies in the positive direction of the Y-axis. The pinned magnetization direction of the pinned layer PD of the Y-axis GMR element 342 lies in the negative direction of the Y-axis.

In the X-axis magnetic sensor, the X-axis GMR elements 331 and 332 are subjected to series connection (or half-bridge connection). Herein, a dc voltage is applied to the X-axis magnetic sensor so as to measure a midpoint potential between the X-axis GMR elements 331 and 332, which can be used as the output of the X-axis magnetic sensor.

For this reason, the output of the X-axis magnetic sensor may change roughly in proportion to variations of an external magnetic field in the X-axis.

Incidentally, the X-axis magnetic sensor can be constituted by a pair of X-axis GMR elements 331 and a pair of X-axis GMR elements 332, which are subjected to full-bridge connection.

Similar to the X-axis magnetic sensor, in the Y-axis magnetic sensor, the Y-axis GMR elements 341 and 342 are subjected to series connection (or half-bridge connection). Herein, a dc voltage is applied to the Y-axis magnetic sensor so as to measure a midpoint potential between the Y-axis GMR elements 341 and 342, which can be used as the output of the Y-axis magnetic sensor, which may change roughly in proportion to to variations of an external magnetic field in the Y-axis.

Similar to the X-axis magnetic sensor described above, the Y-axis magnetic sensor can be constituted by a pair of Y-axis GMR elements 341 and a pair of Y-axis GMR elements 342, which are subjected to full-bridge connection.

As described above, the magnetic sensor 301 of the fifth embodiment can detect the intensity of the external magnetic field based on the output of the X-axis magnetic sensor and the output of the Y-axis magnetic sensor.

The magnetic sensor 301 includes the GMR elements 331, 332, 341, and 342 each having zigzag patterns, wherein bent portions correspond to the permanent magnet films 306, which differ from the magnetoresistive films 305 that are conventionally used as bent portions. This makes the sensitivity direction of the GMR element uniform. Thus, it is possible to accurately measure the intensity of the external magnetic field without damaging the linear relationship (or linearity) between the resistance of the magnetoresistive film 305 and the intensity of the external magnetic field.

In addition, the present embodiment is characterized in that the permanent magnet films 306 are arranged in connection with the both ends of the magnetoresistive films 305 each having a band-like shape. That is, due to the magnetization of the permanent magnet film 306, it is possible to maintain the uniaxial anisotropy in the free layer F of the magnetoresistive film 305; hence, it is possible to measure the intensity of the external magnetic field with a good reproducibility.

Unlike the conventionally known magnetic sensor, the present embodiment does not use nonmagnetic films, wherein each of the GMR elements 331, 332, 341, and 342 having zigzag patterns is constituted by the magnetoresistive films 305 each having a band-like shape and the permanent magnet films 306, which are arranged in contact with the both ends of the magnetoresistive films 305. That is, the magnetic sensor 301 of the present embodiment has a relatively simple structure, which can be manufactured with ease.

The direction of the uniaxial anisotropy of the free layer F of the magnetoresistive film 305 is forced to match the lontitudinal direction of the magnetoresistive film 305 and the magnetization direction of the permanent magnet film 306. Therefore, the direction of the uniaxial anisotropy of the free layer F can be maintained by the form magnetic anisotropy of the magnetoresistive film 305 and the magnetization of the permanent magnet film 306; hence, it is possible to measure the intensity of the external magnetic field with a superior reproducibility.

It is preferable to arrange the magnetoresistive films 305 and the permanent magnet films 306 in such a way that the aspect ratio of the permanent magnet film 306, i.e., the length-breadth ratio between the length (lying in the horizontal direction in FIG. 51) and the breadth (lying in the vertical direction in FIG. 51) of the permanent magnet film 306, is set to "1" or more, and the longitudinal direction of the permanent magnet film 306 roughly matches the longitudinal direction of the magnetoresistive film 305.

Thus, it is possible to increase the permeance coefficient of the permanent magnet film 306, which therefore becomes difficult to be reduced in magnetization. Due to the magnetization of the permanent magnet film 306, it is possible to maintain the direction of the uniaxial anisotropy in the free layer F of the magnetoresistive film 305 in a stable manner; hence, it is possible to measure the intensity of the external magnetic field with a superior reproducibility.

Of course, the present invention is not necessarily limited to the present embodiment, which can be modified in a variety of ways without departing from the scope of the invention.

For example, the permanent magnet film 306 is composed of a conductive material, so that it can share the function of the wiring.

Figure 55:
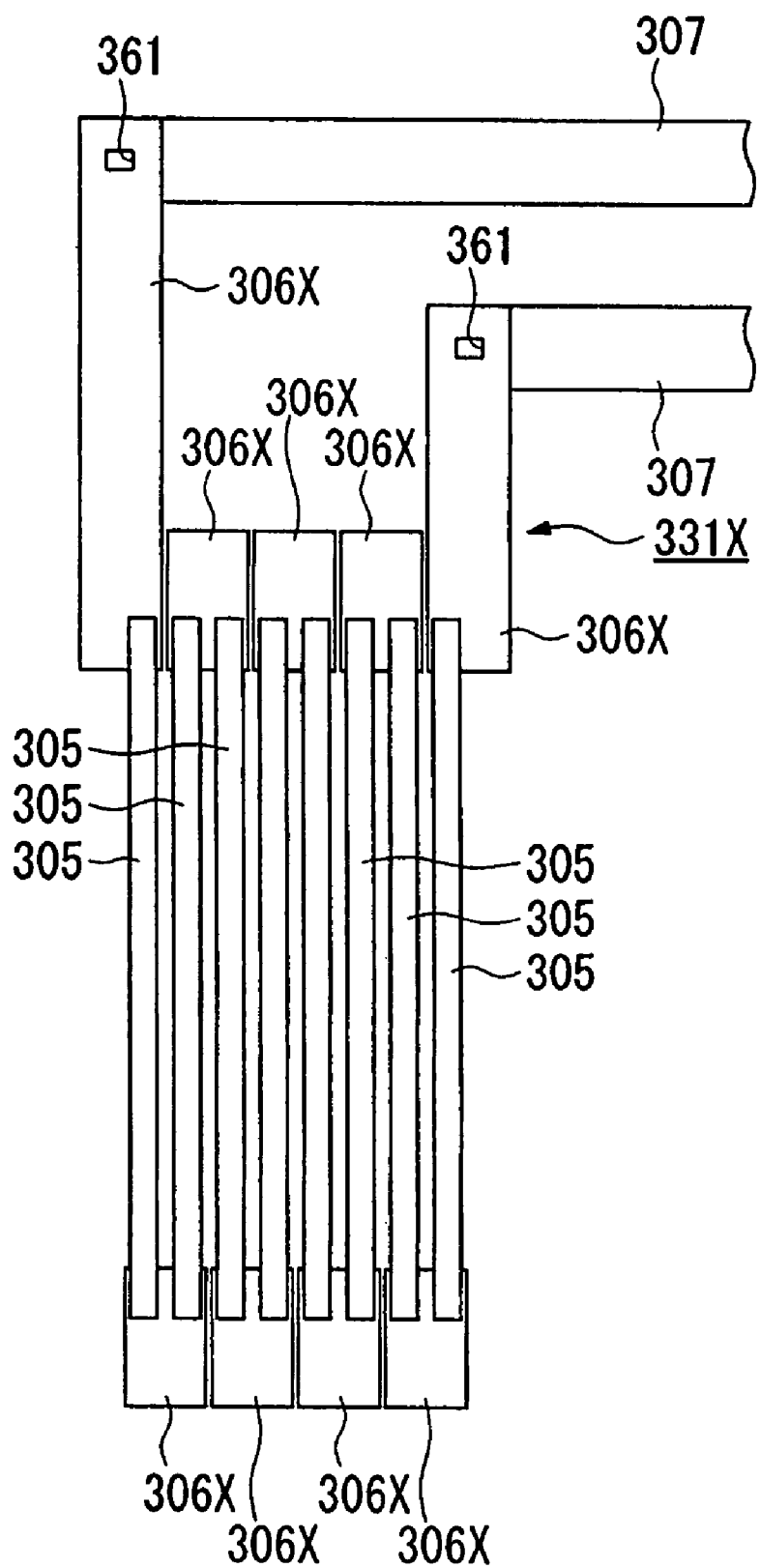
FIG. 55 is a plan view diagrammatically showing the constitution of an X-axis GMR element that is modified compared with the X-axis GMR element shown in FIG. 51.

FIG. 55 is a plan view diagrammatically showing an X-axis GMR element 331X constituted by a plurality of magnetoresistive films 305 and a plurality of permanent magnet films 306X, which share the function of the wiring.

The magnetoresistive films 305 are electrically connected in series via the permanent magnet films 306X, so that electrification can be performed on the magnetoresistive films 305 having zigzag patterns by way of the permanent magnet films 306.

Vias (i.e., plated through holes) 361 are formed at prescribed positions of the permanent magnet films 306, so that the permanent magnet films 306X are electrically connected with wiring portions 307, extended from pads and other components (not shown) arranged on the quartz substrate 302, by way of the vias 361.

Since the permanent magnet films 306 share the function of wiring, it is unnecessary to additionally provide wiring portions; hence, it is possible to simplify the manufacturing process of the magnetic sensor, which can be therefore manufactured with ease.

Next, various samples of magnetic sensors according to the fifth embodiment will be described in detail.

(1) Sample 1

Sample 1 of the magnetic sensor has the same constitution as the magnetic sensor 301 shown in FIG. 50.

Figure 56:
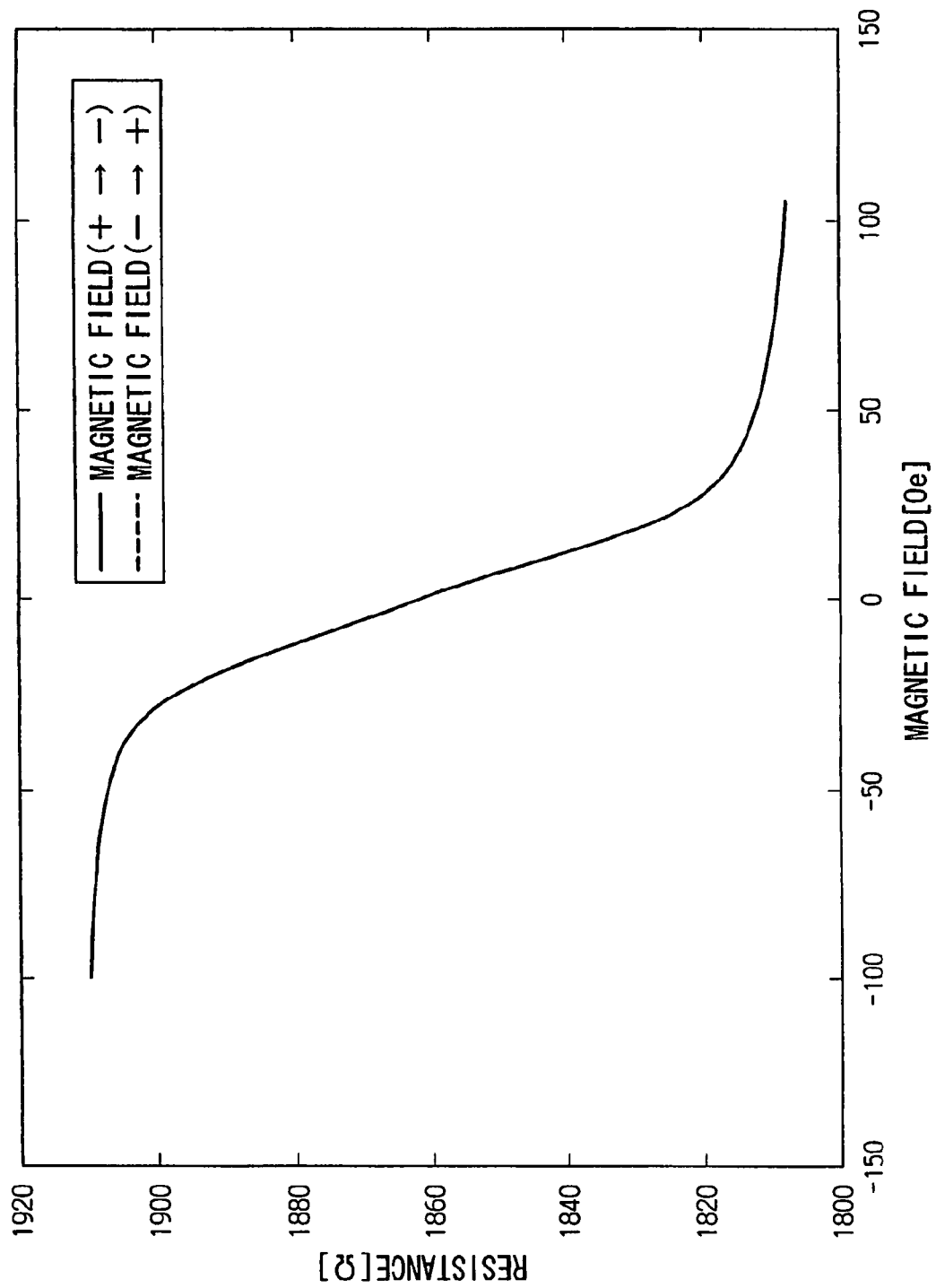
FIG. 56 is a graph showing magnetoresistive characteristics of an X-axis GMR element according to Sample 1.

FIG. 56 is a graph showing magnetoresistive characteristics of the X-axis GMR element 331 according to Sample 1, wherein it is possible to obtain magnetoresistive characteristics in which magnetic resistance changes approximately in proportion to the intensity of an external magnetic field, which is applied along the X-axis direction and which ranges from −30 Oe to 30 Oe.

Figure 57:
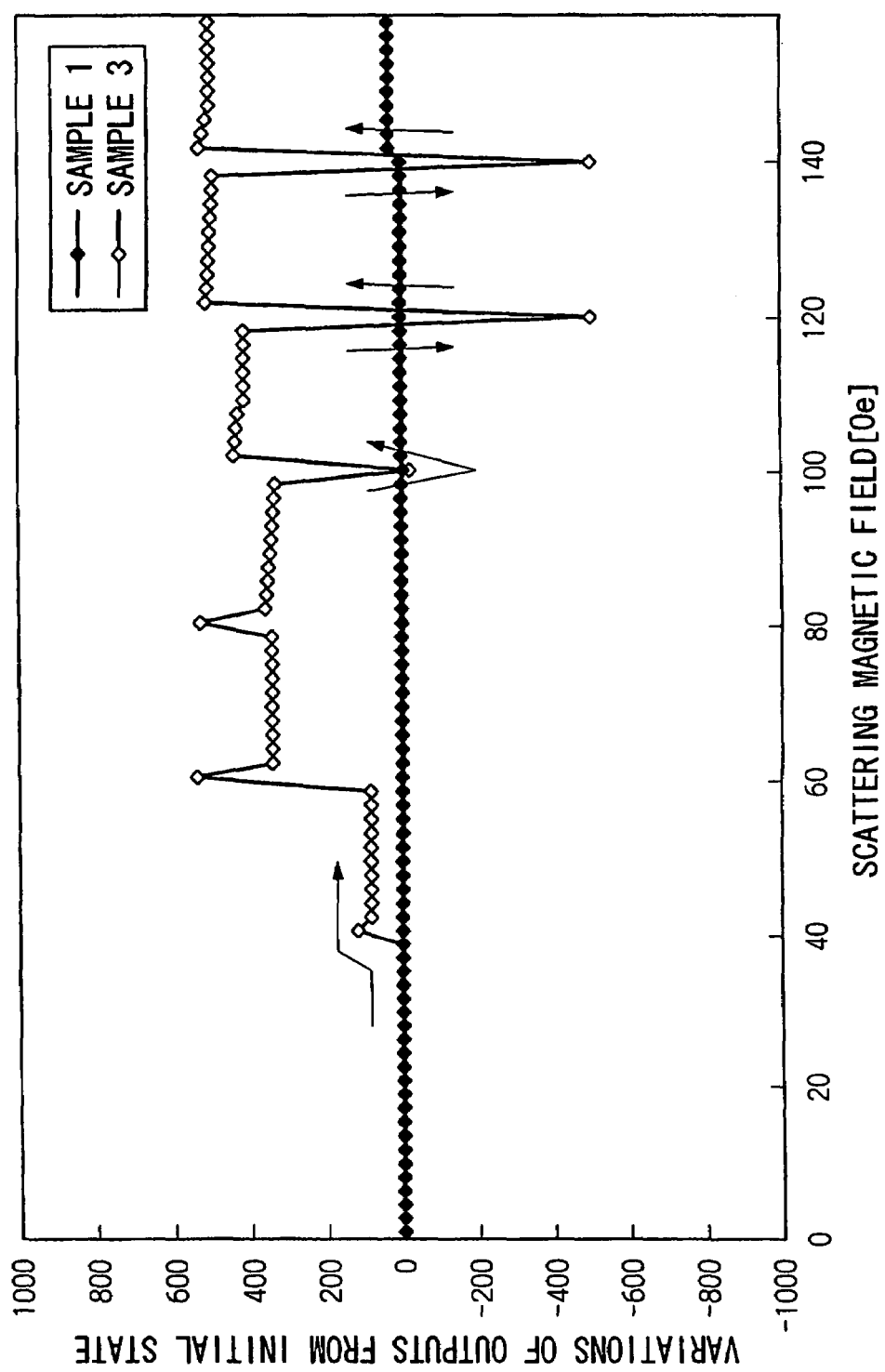
FIG. 57 is a graph showing scattering magnetic field stability being established with respect to X-axis GMR elements according to Sample 1 and Sample 3.

FIG. 57 is a graph showing scattering magnetic field stability being established between the X-axis GMR element 331 and the X-axis GMR element 332 with respect to two types of magnetic sensors according to Sample 1 and Sample 3.

The scattering magnetic field stability is defined by assessing the magnetization property of the magnetoresistive element as to how much the magnetization direction of the free layer matches (or restores) the initial magnetization direction after the external magnetic field once applied to each of the X-axis GMR elements 331 and 332 disappears. That is, it can be expressed by differences (or variations) between the initial sensor output produced in the initial state and the sensor output produced after the external magnetic field disappears. As variations between the initial sensor output and the sensor output produced after the external magnetic field disappears become small, the magnetization direction of the free layer tends to match (or restore) the initial magnetization direction after the external magnetic field once applied to the sensor disappears. Hence, it is possible to measure the intensity of the external magnetic field with good reproducibility.

The scattering magnetic field stability assessed for the magnetic sensor 301 is measured by the following method.

An external magnetic field whose magnetization direction lies 45° slanted to the X-axis of the magnetic sensor 301 is applied to the X-axis magnetic sensor comprising the X-axis GMR elements 331 and 332 in a reciprocating manner; then, the magnetic field is forced to disappear, and the output of the X-axis sensor is measured.

Next, the X-axis GMR elements 331 and 332 are initialized by using an initialization coil, which is arranged just below the X-axis GMR elements 331 and 332 in order to restore the initial state of magnetization in the free layer of each GMR element. Herein, by being electrified with a prescribed electric current, the initialization coil can produce a magnetic field in a prescribed direction that matches the longitudinal direction of each GMR element and the direction of the free layer.

The initialization is performed ten times after the external field once applied to the X-axis GMR elements 331 and 332 is forced to disappear, wherein the output of the X-axis sensor is measured after each initialization operation.

The series of operations described above is repeatedly performed upon increasing the intensity of the external magnetic field by 20 Oe, whereby it is possible to detect differences between the initial output of the X-axis sensor produced in the initial state and the output of the X-axis sensor produced in each initialized state for performing the initialization, differences between outputs of the X-axis sensor produced in consecutively initialized states, and variations of the output of the X-axis sensor.

In the magnetic sensor 301 according to Sample 1, variations of the sensor output counted from the initial sensor output become approximately zero after the external magnetic field is forced to disappear and after each initialized state unless the intensity of the external magnetic field does not exceed 140 Oe. This proves that the magnetization direction of the free layer F of the magnetoresistive film 305 approximately matches the initial magnetization direction thereof. That is, it can be said that the magnetic sensor 301 according to Sample 1 can measure the intensity of the external magnetic field with a good reproducibility.

As a result, the magnetic sensor 301 according to Sample 1 can accurately measure the intensity of an external magnetic field without damaging the linear relationship (or linearity) between the magnetic resistance thereof and the intensity of the external magnetic field, wherein the magnetization direction of the free layer F approximately matches (or restores) the initial magnetization direction thereof after the external magnetic field once applied to the magnetic sensor disappears; hence, it is possible to measure the intensity of the external magnetic field with a good reproducibility.

(2) Sample 2

Figure 58:
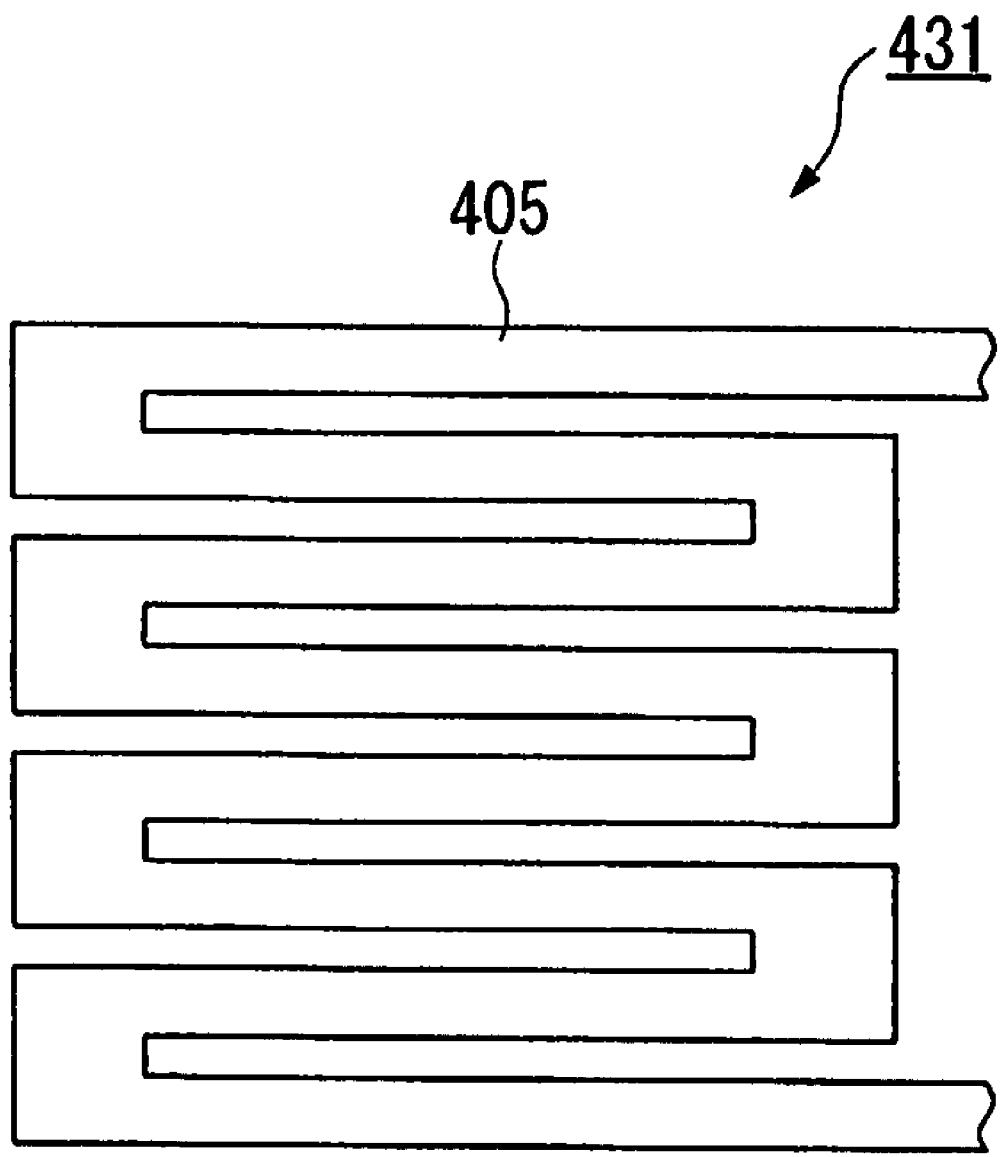
FIG. 58 is a plan view diagrammatically showing the constitution of an X-axis GMR element according to Sample 2.

FIG. 58 is a plan view diagrammatically showing the constitution of an X-axis GMR element 431 according to Sample 2. Sample 2 differs from Sample 1 in that each of the X-axis GMR element 431 and its corresponding Y-axis GMR element is constituted using a magnetoresistive film 405 only. Other parts of the constitution of the X-axis GMR element 431 according to Sample 2 are similar to those of the constitution of the X-axis GMR element 331 according to Sample 1; hence, the detailed description thereof will be omitted.

Figure 59:
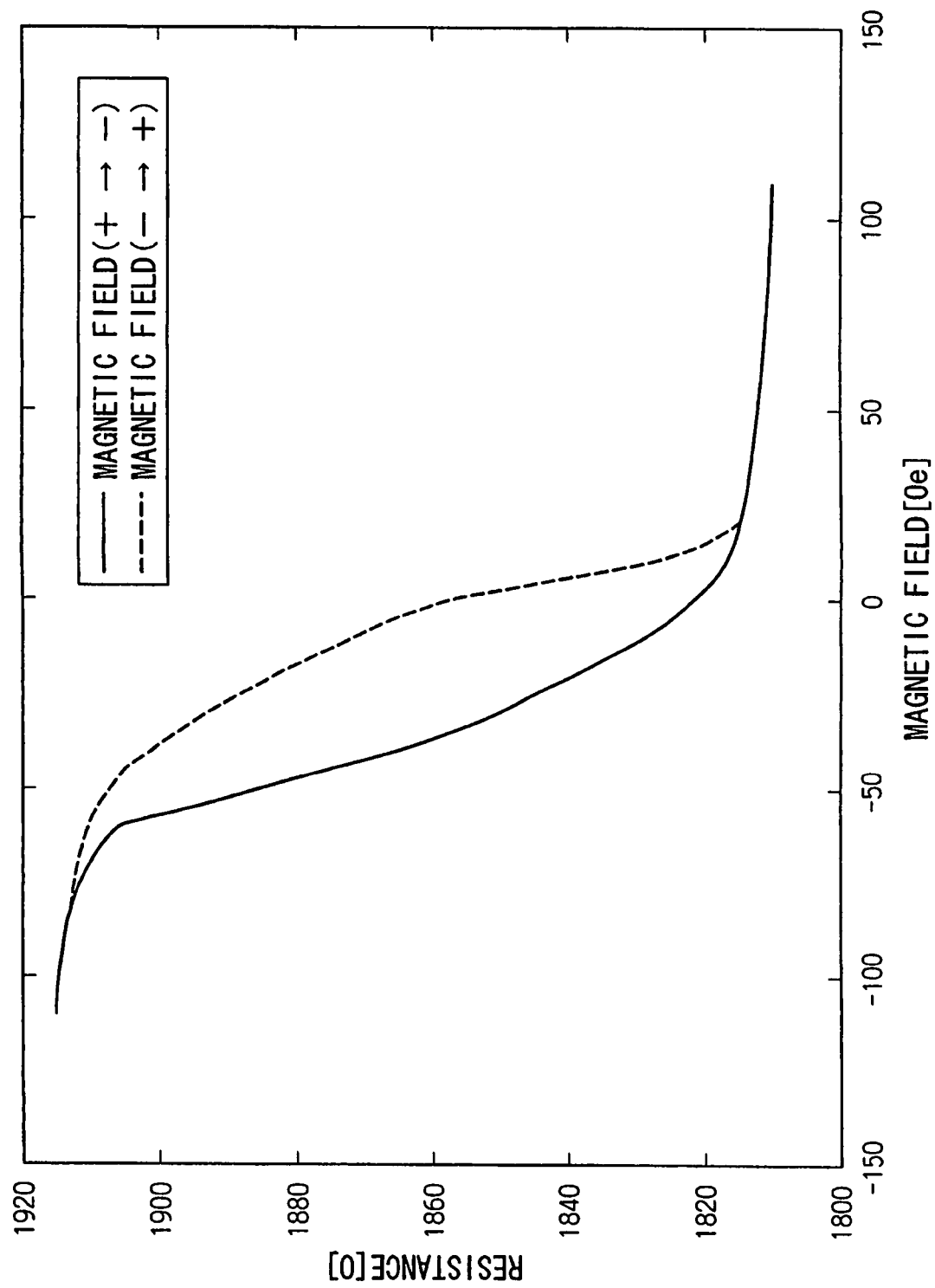
FIG. 59 is a graph showing magnetoresistive characteristics of the X-axis GMR element according to Sample 2.

FIG. 59 shows magnetoresistive characteristics of the X-axis GMR element 431 according to Sample 2. That is, a relatively large hysteresis loop appears in the magnetoresistive characteristics with respect to the external magnetic field; hence, it is very difficult to provide a single linear relationship being established between the magnetic resistance and the intensity of the magnetic field. For this reason, the magnetic resistance may greatly vary depending upon the magnetization direction with respect to the same intensity of the external magnetic field. That is, no linearity can be observed between the magnetic resistance and the intensity of the external magnetic field; hence, it is very difficult to accurately measure the intensity of the external magnetic field.

This is because in each of the X-axis GMR element 431 and its corresponding Y-axis GMR element according to Sample 2, bent portions of zigzag patterns thereof are formed by magnetoresistive films; hence, anisotropy of the magnetoresistive film 405 cannot be maintained at the bent portions, and the sensitivity direction becomes non-uniform.

(3) Sample 3

Figure 60:
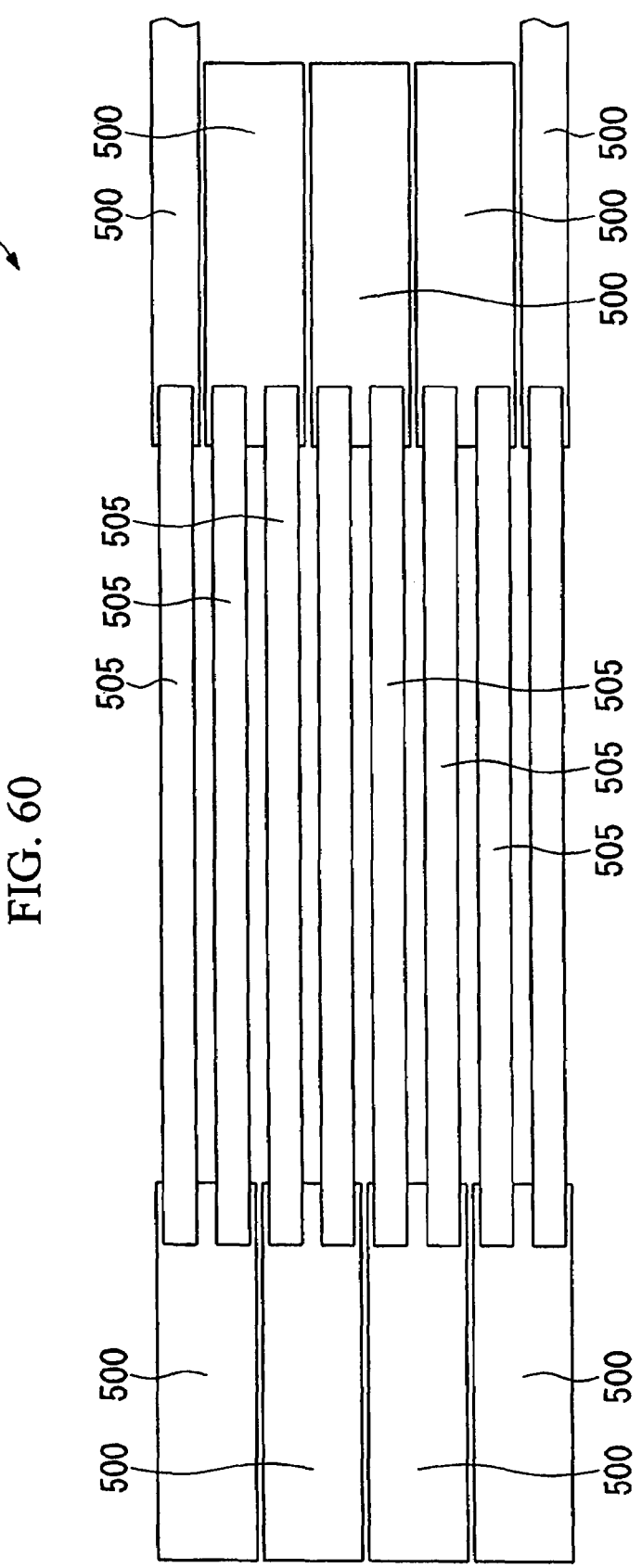
FIG. 60 is a plan view diagrammatically showing the constitution of an X-axis GMR element according to Sample 3.

FIG. 60 is a plan view diagrammatically showing the constitution of an X-axis GMR element 531 according to Sample 3. Sample 3 differs from Sample 1 in that in the X-axis GMR element 531 and its corresponding Y-axis GMR element, bent portions of zigzag patterns of magnetoresistive films 505 are formed by nonmagnetic films 500. Other parts of the constitution of the X-axis GMR element 531 according to Sample 3 are similar to those of the constitution of the X-axis GMR element 331 according to Sample 1; hence, the detailed description thereof will be omitted.

As shown in FIG. 57, variations of the output of the magnetic sensor according to Sample 3 measured after the external magnetic field once applied to the magnetic sensor is forced to disappear do not become zero when the intensity of the external magnetic field is equal to or greater than 40 Oe; hence, the magnetization direction of the free layer F of the magnetoresistive film 505 does not restore the initial magnetization direction thereof. Even though the initialization is performed ten times on the X-axis GMR element 531, variations of the sensor output do not become zero, and the magnetization direction of the free layer F does not restore the initial magnetization direction thereof. Variations of the sensor output increase as the intensity of the external magnetic field increases. Therefore, the results show that the magnetic sensor according to Sample 3 cannot measure the intensity of the external magnetic field with good reproducibility.

This is because in the X-axis GMR element 531 and its corresponding Y-axis GMR element according to Sample 3, bent portions of zigzag patterns of magnetoresistive films 505 are formed by nonmagnetic films; hence, it is very difficult to maintain uniaxial anisotropy in the free layer F of the magnetoresistive film 505.

In summary, the magnetic sensor of the fifth embodiment can accurately measure the intensity of the external magnetic field with superior reproducibility; therefore, the fifth embodiment can be applied to magnetic analyzers and magnetic medial apparatuses using magnetic sensors.

7. Sixth Embodiment

Figure 61:
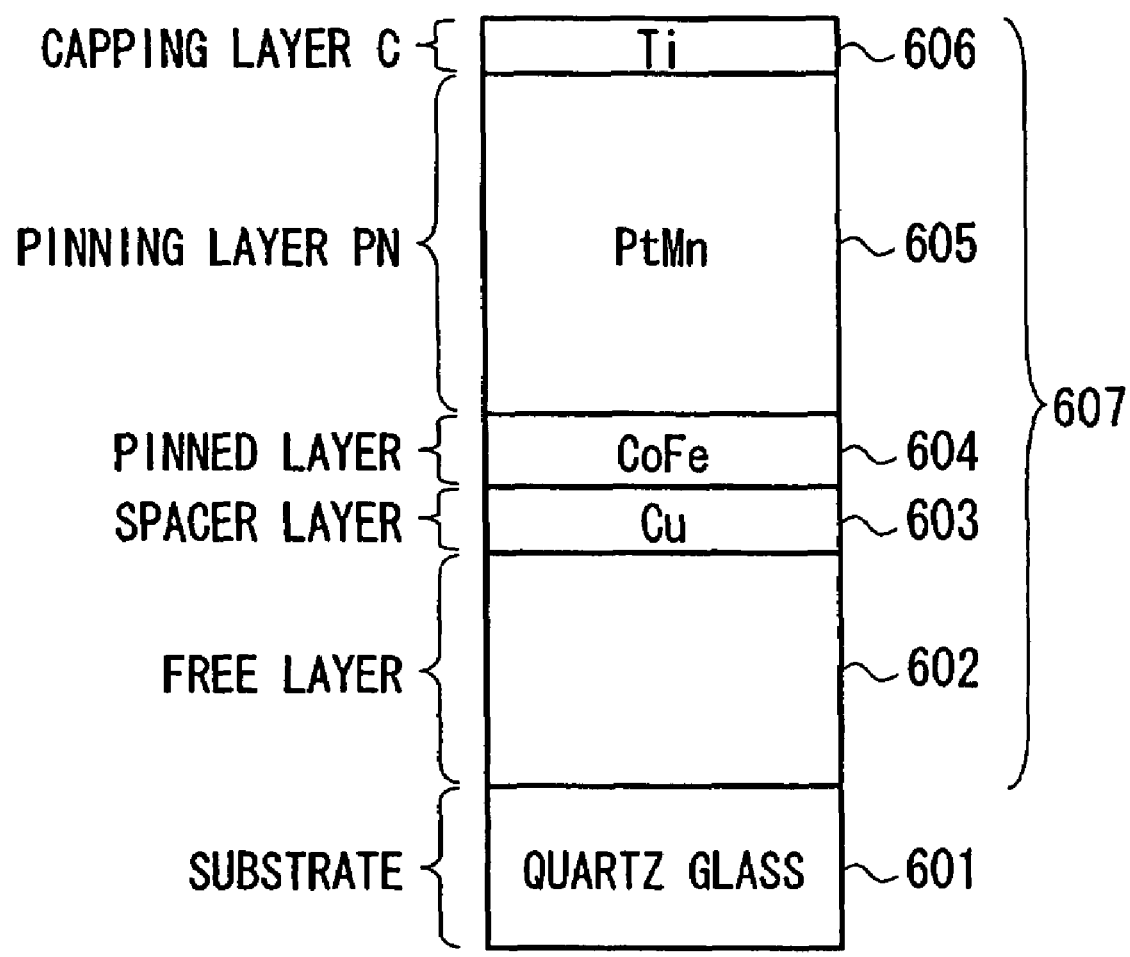
FIG. 61 diagrammatically shows the constitution of a GMR element for use in a magnetic sensor in accordance with a sixth embodiment of the invention.

A magnetic sensor according to a sixth embodiment of the invention is designed to measure absolute bearing (or absolute azimuth) with reference to geomagnetism (or terrestrial magnetism) by use of GMR elements, each of which is constituted as shown in FIG. 61 wherein a free layer 602 having a three-layer structure comprising a CoZrNb layer, a NiFe layer, and a CoFe layer, a spacer layer 603 composed of Cu, a pinned layer 604 composed of CoFe, a pinning layer 605 composed of PtMn, and a capping layer 606 composed of Ti are sequentially laminated on a substrate 601 composed of a quartz glass. Herein, the free layer 602 changes in the magnetization direction thereof in response to an external magnetic field, and the pinned layer 604 is fixed (or pinned) in the magnetization direction thereof. Suppose that an external magnetic field is applied to the GMR element of FIG. 61, wherein when the magnetization direction of the free layer 602 becomes identical to that of the pinned layer 604, conduction electrons flowing through the spacer layer 603 are difficult to be scattered so that resistance is reduced, whereas when the magnetization direction of the free layer 602 becomes reverse to that of the pinned layer 604, conduction electrons flowing through the spacer layer 603 are easy to be scattered so that resistance is increased. That is, the GMR element presents resistance in response to the relative relationship between the magnetization direction of the free layer 602 and the magnetization direction of the pinned layer 604; hence, it is possible to detect the intensity of an external magnetic field by measuring the resistance.

In order to accurately detect a very small magnetic field, it is necessary to maintain the magnetization direction of the free layer lying in a prescribed direction (i.e., an initial magnetization direction) in a stable manner when an external magnetic field is forced to disappear and is not applied to the magnetic sensor. For this reason, it is necessary to form the 'thin' free layer in a rectangular shape in plan view, wherein the long side (or the longitudinal axis) of the free layer is arranged to match the initial magnetization direction thereof, whereby the magnetization direction of each magnetized section of the free layer can be forced to match the initial magnetization direction by use of the form anisotropy for aligning the magnetization direction with the longitudinal direction. In order for the free layer to restore and maintain the initial magnetization direction for a long time in a stable manner when the external magnetic field disappears, bias magnetic films corresponding to permanent magnet films are arranged at both ends of the free layer in its longitudinal direction, so that they normally apply a specific magnetic field realizing the initial magnetization direction to the free layer.

Incidentally, the sensitivity of the GMR element depends upon an MR ratio of the GMR element, an angle formed between the pinning and the magnetization of the free layer under no magnetic field, and an easy-to-magnetize ability of the free layer. The sensitivity direction of the GMR element sensing a small magnetic field lies perpendicular to the magnetization direction of the free layer under no magnetic field.

The magnetic sensor disclosed in Japanese Patent Application Publication No. 2002-299728 have drawbacks in that when the magnetic hysteresis occurs, the range of bearing measurement becomes elliptically deformed, or a prescribed offset may apparently appear in measurement so as to cause unwanted deviation of bearing, which causes unwanted variations in sensitivity with regard to bearing measurement.

It is possible to produce an example of the GMR element having a width ranging from 9 μm to 10 μm, wherein the free layer has a thickness of 125 A°, the space layer has a thickness of 24 A°, and the pinned layer has a thickness of 22 A°. The magnetic sensor using this GMR element has a magnetic hysteresis and therefore does not meet requirements as the bearing geomagnetic sensor.

Therefore, the sixth embodiment provides a magnetic sensor that has no magnetic hysteresis and a high sensitivity and that can reduce the deviation of the sensitivity direction thereof.

Figure 62:
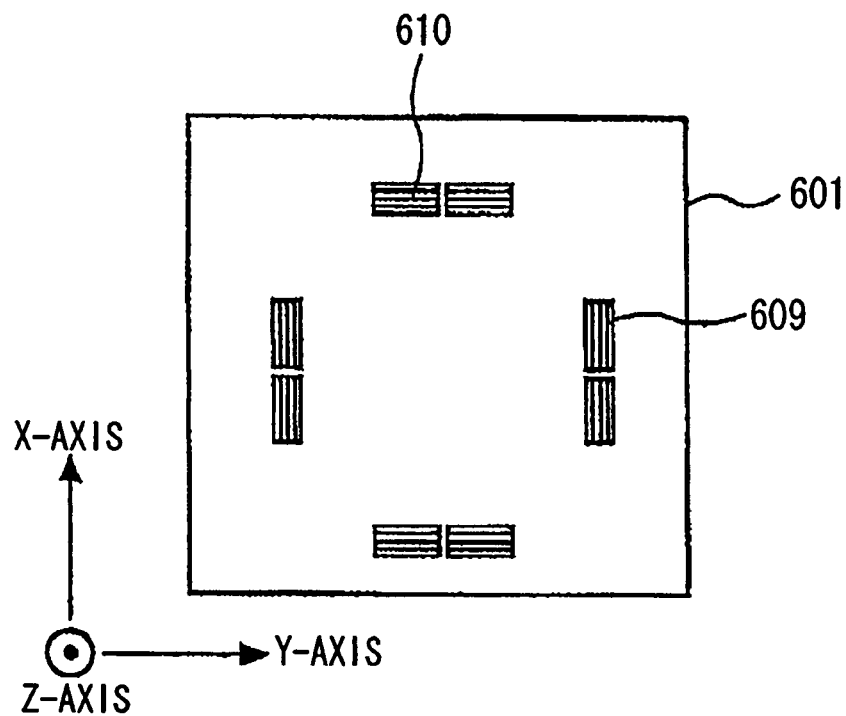
FIG. 62 is a plan view diagrammatically showing the constitution of a two-axis magnetic sensor according to the sixth embodiment using GMR elements arranged along an X-axis and a Y-axis.

In the aforementioned GMR element shown in FIG. 61, the free layer 602 having the three-layer structure comprising the CoZrNb layer, NiFe layer, and CoFe layer, the spacer layer 603 composed of Cu or a Cu alloy, the pinned layer 604 composed of CoFe, the pinning layer 605 composed of PtMn, and the capping layer 606 composed of Ti are sequentially formed on the substrate 602 composed of the quartz glass having a square shape of 2 mm length (see FIG. 62).

Specifically, the free layer 602 is a magnetic layer that changes in the magnetization direction thereof in response to an external magnetic field. The spacer layer 603 is a thin metal film composed of Cu or the Cu alloy. The pinned layer 604 is constituted by a ferromagnetic substance composed of a CoFe magnetic layer, wherein the magnetization direction thereof is fixed. The pinning layer 605 is laminated on the pinned layer 604 and is constituted by an anti-ferromagnetic substance composed of a PtMn alloy including Pt of 45-55 mol %. All of the free layer 602, spacer layer 603, pinned layer 604, pinning layer 605, and capping layer 606 are collectively referred to as a spin-valve film 607.

FIG. 62 is a plan view showing the constitution of a magnetic sensor in which GMR elements are arranged along two axes, i.e., an X-axis and a Y-axis. In the magnetic sensor of FIG. 62, there are arranged an X-axis magnetic sensor 609 for detecting a magnetic field along the X-axis direction and a Y-axis magnetic sensor 610 for detecting a magnetic field along the Y-axis direction on the quartz-glass substrate 601 having a square shape of 2 mm length. Each of the X-axis magnetic sensor 609 and the Y-axis magnetic sensor 610 has the layered structure including the spin-valve film 607 shown in FIG. 61.

Figure 63:
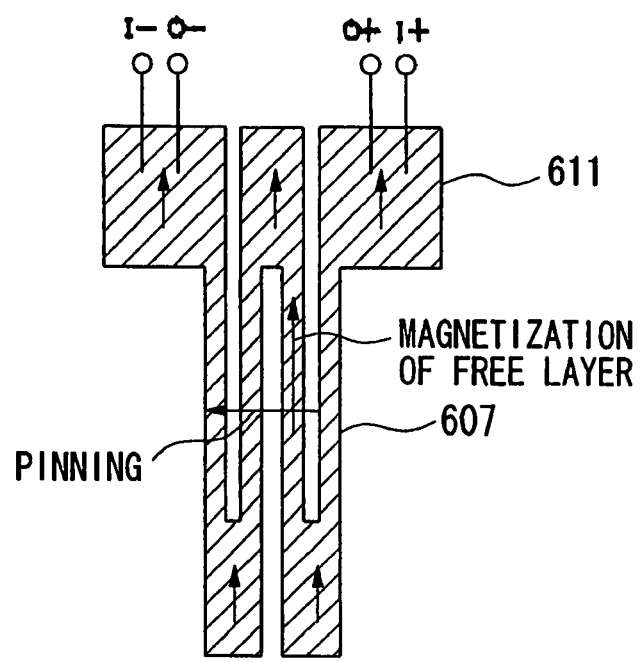
FIG. 63 is a plan view diagrammatically showing the arrangement of the GMR elements in the two-axis magnetic sensor.

FIG. 63 shows a plan-view shape of each of the magnetic sensors 609 and 610, in which a plurality of spin-valve films 607 each having a band-like shape are arranged in parallel with each other, and a plurality of bias magnetic films 611 are arranged at both ends of the spin-valve films 607 so as to establish a series connection between the spin-valve films 607. The bias magnetic film 611 is constituted by a thin film of a hard ferromagnetic substance composed of CoCrPt having a high coercive force and a high aspect ratio.

Figure 64:
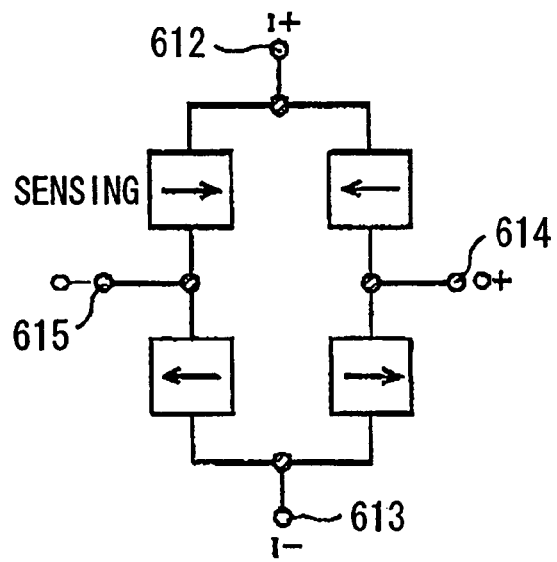
FIG. 64 is a wiring diagram diagrammatically showing a bridge connection of the GMR elements formed in the two-axis magnetic sensor.

FIG. 64 is a wiring diagram showing a bridge connection established between the X-axis magnetic sensor 609 and the Y-axis magnetic sensor 610 shown in FIG. 62. In this bridge connection, Vi+ is applied to a terminal "I+" (12), and Vi− is applied to another terminal "I−" (13) by use of a current source and the like. In addition, Vout is extracted from a terminal "O+" (14), and Vout− is extracted from another terminal "O−" (15). Hence, sensor output Vout is produced based on the potential difference between Vout+ and Vout−.

Figure 71:
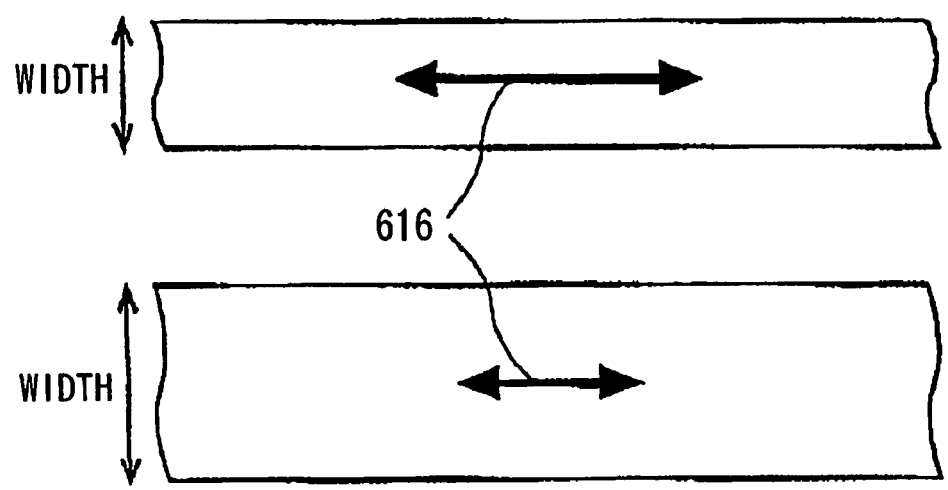
FIG. 71 shows a magnetic field influencing a free layer in a width direction of the GMR element.
Figure 72:
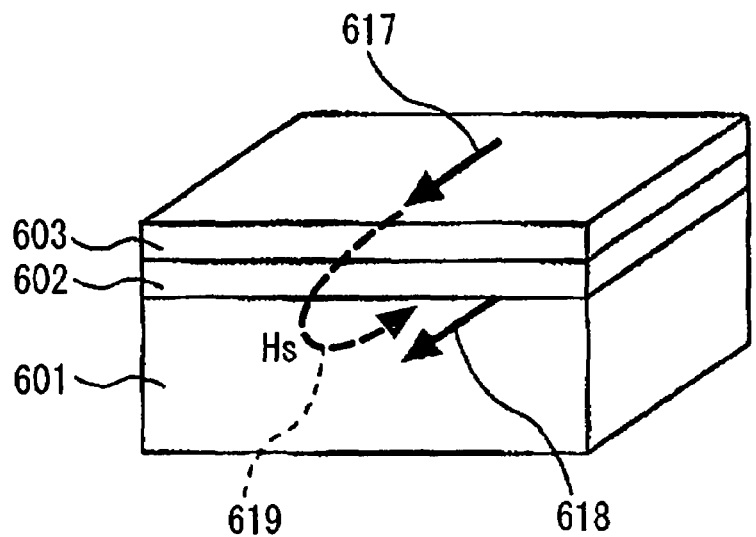
FIG. 72 is a perspective view showing components of a magnetic field influencing the free layer in the GMR element.

Suppose that a magnetic field influencing the free layer 602 as shown in FIG. 71 is applied to the GMR element, wherein the anisotropic magnetic field (Hk) 616 becomes small as the width of the GMR element is increased, whereas a magnetic hysteresis may occur when Hk becomes too small in comparison with the external magnetic field.

In the layered structure of the GMR element, the magnetic field influencing the free layer 602 may include three types of magnetic field connections, namely, a statically coupled magnetic field (Hs) 619 created by the pinned layer 604, an interlayer coupling magnetic field (or an exchange biasing field) (Hin) 618 dependent on the pinned layer 604 and the spatial distance, and a magnetic field (or a biasing field) (Hm) created by the bias magnetic film 611. When the pinned layer 604 is increased in thickness, the statically coupled magnetic field (Hs) 619 becomes intense. When the spacer layer 603 is decreased in thickness, the interlayer coupling magnetic field (Hin) 618 becomes intense. The GMR element has a property in that when the width thereof is increased, a magnetic field (or a biasing field) 619 derived from the pinned layer 604 becomes weak. When the free layer 602 is increased in thickness, all of the aforementioned magnetic field connections become small.

Figure 73:
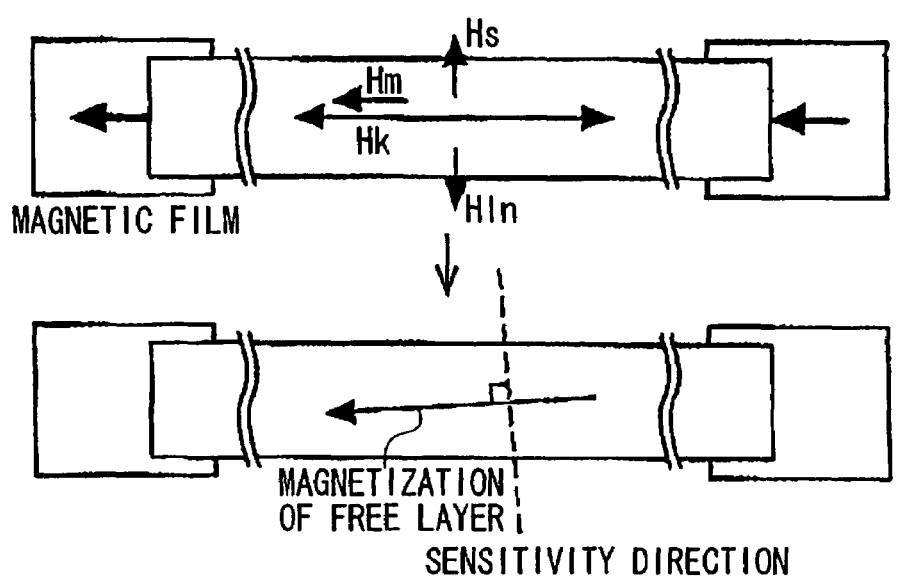
FIG. 73 shows a relationship between the magnetic field influencing the free layer and the sensitivity direction of the GMR element.

With respect to the magnetic field influencing the free layer 602 and the sensitivity direction of the GMR element, as shown in FIG. 73, a magnetization direction D of the free layer depends upon the history of magnetization and the biasing field of the free layer 602. When the geomagnetism realizing a very small magnetic field is applied to the free layer 602, the sensitivity direction of the GMR element becomes perpendicular to the magnetization direction under no magnetic field, regardless of the pinning. As the magnetic field influencing the free layer 602 becomes small, the sensitivity of the GMR element is increased, while a magnetic hysteresis may occur easily.

The sixth embodiment is designed in consideration of the aforementioned background, wherein it is characterized by that the width of the GMR element ranges from 6 μm to 8 μm, the thickness of the spacer layer ranges from 28 A° to 34 A°, the thickness of the free layer is set to 125 A°, and the thickness of the pinned layer is set to 30 A°.

Figure 65:
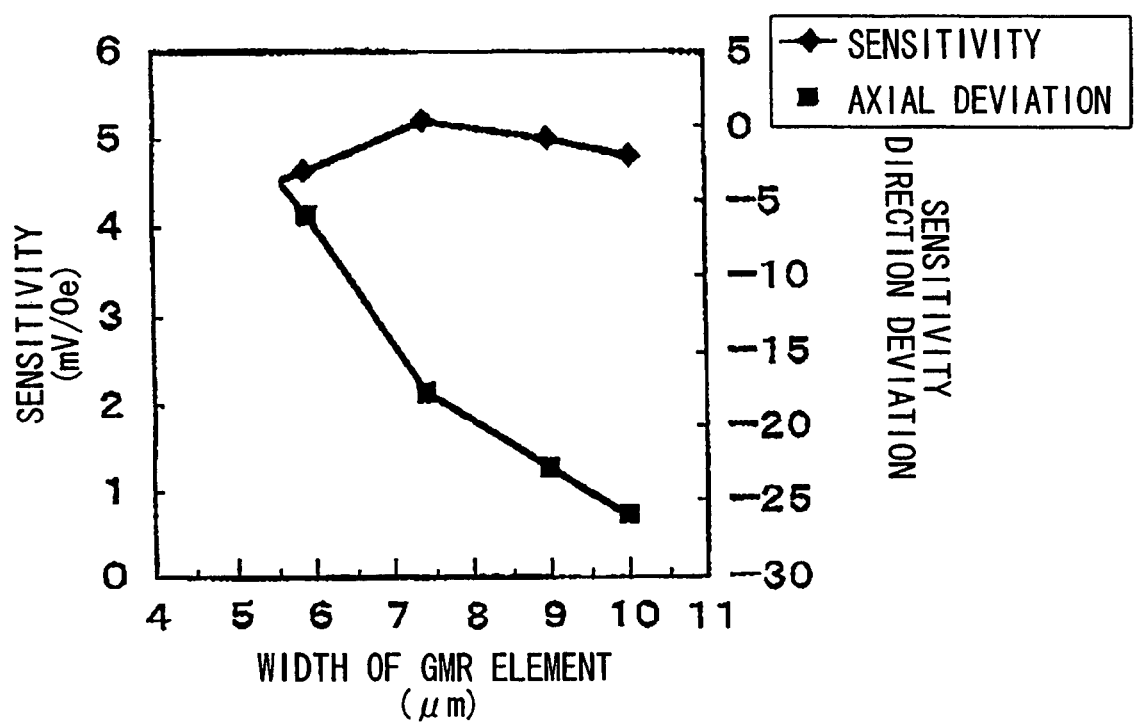
FIG. 65 is a graph plotting values regarding the sensitivity of the magnetic sensor when the width of the GMR element is varied in a range from 6 μm to 10 μm.

FIG. 65 is a graph plotting values regarding the sensitivity and the sensitivity direction deviation measured with respect to the magnetic sensor according to the sixth embodiment in which the width of the GMR element is varied in a range from 6 μm to 10 μm, wherein the magnetization direction of the pin layer is slanted by 90° with respect to the longitudinal direction of the magnetoresistive element. FIG. 65 shows that the sensitivity of the magnetic sensor can be increased by increasing the width of the GMR element, whereas deviations occur in the sensitivity direction so that in the case of the magnetic sensor in which the width of the GMR element is 9 μm or more, the ratio of resistance of the GMR element decreases, and the sensitivity should be peaked. FIG. 65 shows that in the case of the magnetic sensor in which the width of the GMR element ranges from 6 μm to 8 μm, it is possible to maintain a relatively high sensitivity, and the sensitivity direction deviation can be reduced. Thus, the present embodiment sets the width of the GMR element to range from 6 μm to 8 μm.

FIG. 65 shows that the sensitivity direction is greatly influenced by the width of the GMR element, wherein it may be estimated that the statically coupled magnetic field (Hs) derived from the pinned layer be varied in response to variations of the shape (or width) of the GMR element. Therefore, the width of the GMR element and the thickness of the spacer layer are very important factors in terms of the bias adjustment of the GMR element.

Both of the thickness of the free layer and the thickness of the pinned layer do not substantially influence the sensitivity, whereas the thickness of the space layer composed of Cu is an important factor for the sensitivity.

Figure 68:
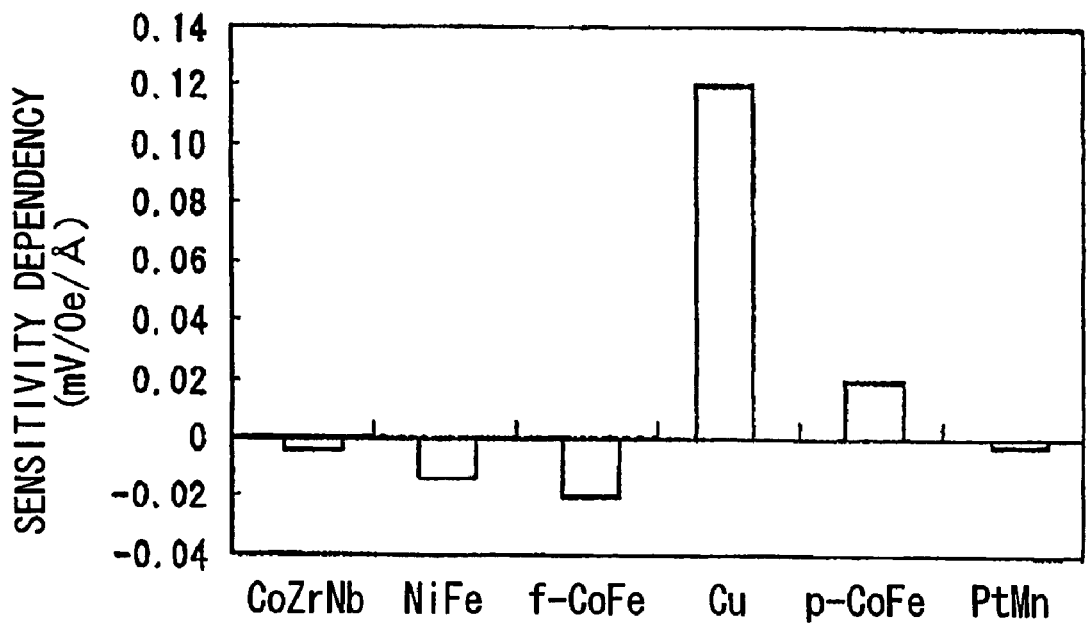
FIG. 68 is a graph showing the sensitivity dependency in relation to the thickness of each layer forming the GMR element.

FIG. 68 is a graph showing influences realized by the thickness of each of layers forming the GMR element with respect to the sensitivity of the magnetic sensor, wherein the vertical axis represents the sensitivity dependency in relation to the thickness of each of layers forming the GMR element. FIG. 68 clearly shows that the thickness of the spacer layer composed of Cu gives a highest influence to the sensitivity; therefore, it is very important to adequately set the thickness of the spacer layer.

Figure 69:
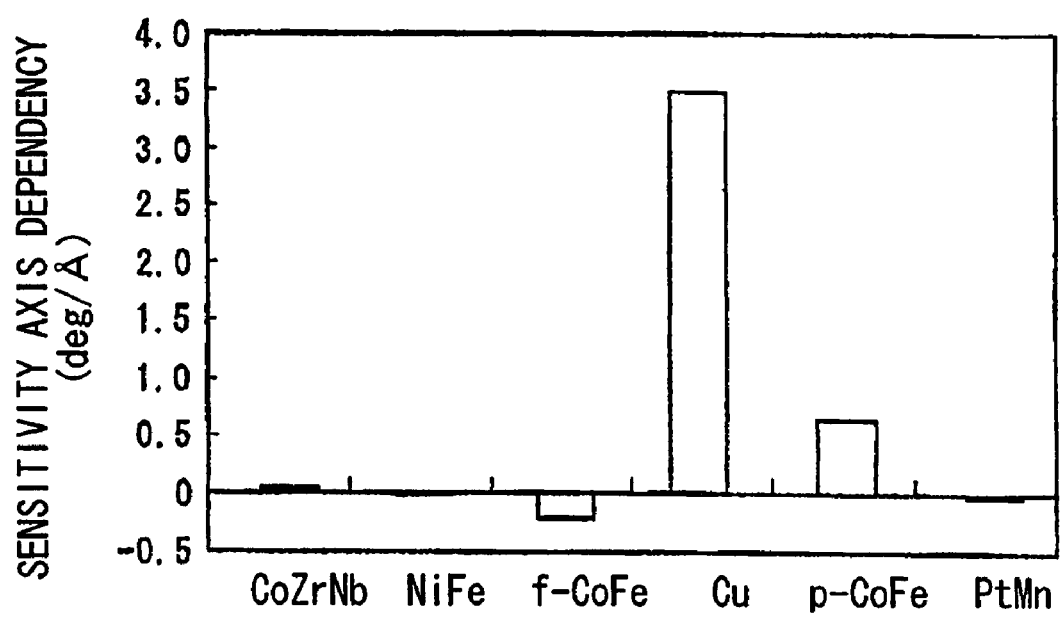
FIG. 69 is a graph showing the sensitivity axis dependency in relation to the thickness of each layer forming the GMR element.

FIG. 69 is a graph showing influences realized by the thickness of each of layers forming the GMR element with respect to the sensitivity axis (or sensitivity direction) of the magnetic sensor, wherein the vertical axis represents the sensitivity axis dependency in relation to the thickness of each of layers forming the GMR element. FIG. 69 clearly shows that the thickness of the spacer layer composed of Cu gives a highest influence to the sensitivity axis; therefore, it is very important to adequately set the thickness of the spacer layer.

In other words, both of the thickness of the free layer and the thickness of the pinned layer give relatively small influences to the sensitivity and the sensitivity axis compared with the thickness of the spacer layer.

Figure 70:
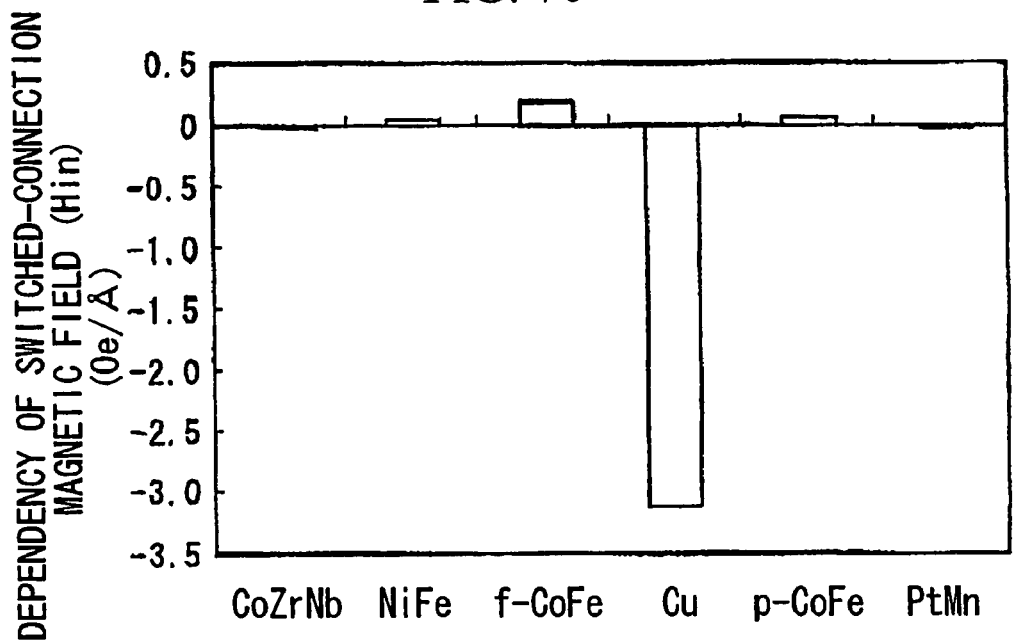
FIG. 70 is a graph showing the dependency regarding an interlayer coupling magnetic field (or an exchange biasing field) (Hin) in relation to the thickness of each layer forming the GMR element.

Incidentally, a self-biasing field applied to the free layer comprises the statically coupled magnetic field (Hs) derived from the pinned layer and the interlayer coupling magnetic field (Hin). Herein, the statically coupled magnetic field (Hs) derived from the pinned layer depends upon the shape of the GMR element; hence, it is difficult to be independently measured. In contrast, the interlayer coupling magnetic field (Hin) can be easily measured by use of a non-patterned plain, regardless of the shape. FIG. 70 shows the dependency regarding the interlayer coupling magnetic field (Hin) in relation to the thickness of each of various layers forming the GMR element. FIG. 70 clearly shows that the dependency of the interlayer coupling magnetic field (Hin) has a very strong relativity with regard to the thickness of the spacer layer composed of Cu.

Figure 66:
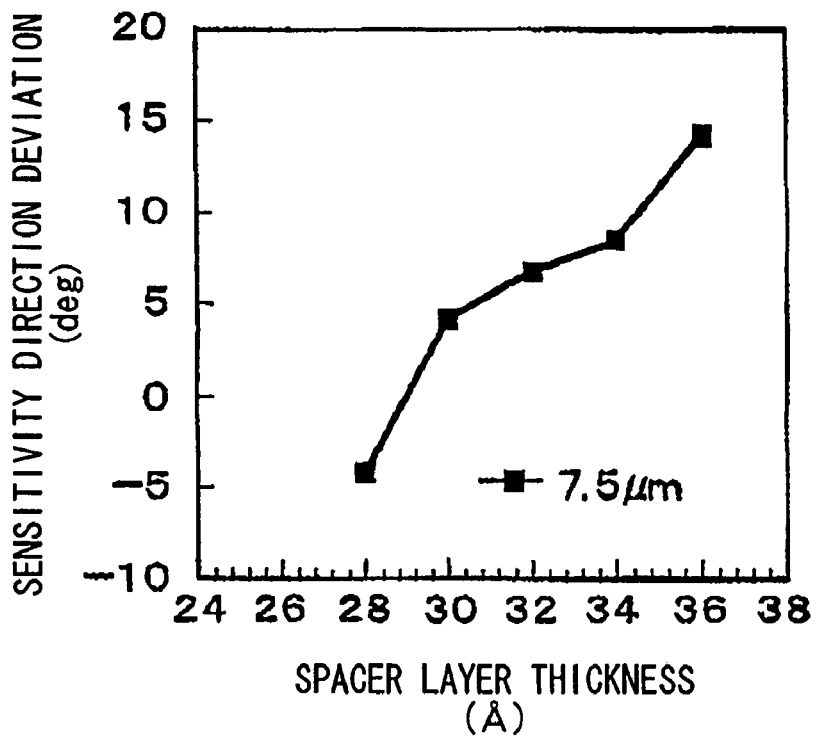
FIG. 66 is a graph plotting values regarding the sensitivity direction deviation when the thickness of the spacer layer of the GMR element is varied.
Figure 67:
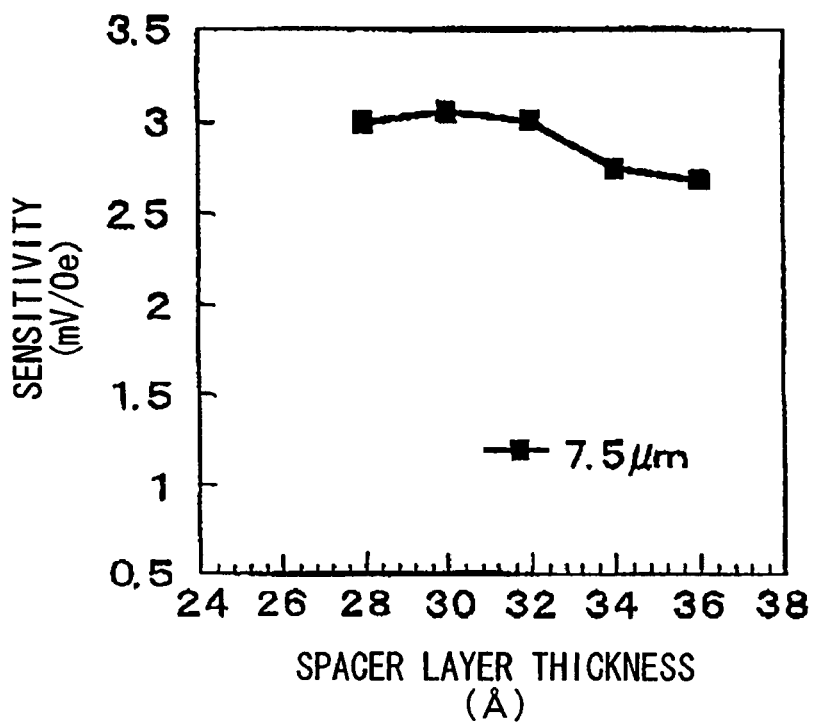
FIG. 67 is a graph plotting values regarding the sensitivity when the thickness of the spacer layer of the GMR element is varied.

FIGS. 66 and 67 are graphs plotting values regarding the sensitivity direction deviation and the sensitivity when the thickness of the spacer layer of the GMR element is varied, wherein black-square marks represent values measured with respect to the magnetic sensor in which the width of the GMR element is 7.5 μm. These values are measured with respect to the magnetic sensor in which the magnetization direction of the pin layer is slanted by 45° with respect to the longitudinal direction of the magnetoresistive element. FIGS. 66 and 67 show that the highest sensitivity and the least sensitivity direction deviation can be realized when the thickness of the spacer layer of the GMR element is set to 28 A°. A relatively high sensitivity can be maintained until the thickness of the spacer layer of the GMR element reaches 34 A°; however, when the thickness of the spacer layer exceeds 34 A°, the sensitivity is slightly reduced. On the other hand, the sensitivity direction deviation is roughly maintained close to 0° as long as the thickness of the spacer layer of the GMR element ranges from 28 A° to 34 A°; however, it becomes large when the thickness of the spacer layer of the GMR element exceeds 34 A°. Thus, the present embodiment sets the thickness of the spacer layer to range from 28 A° to 34 A°.

Figure 74:
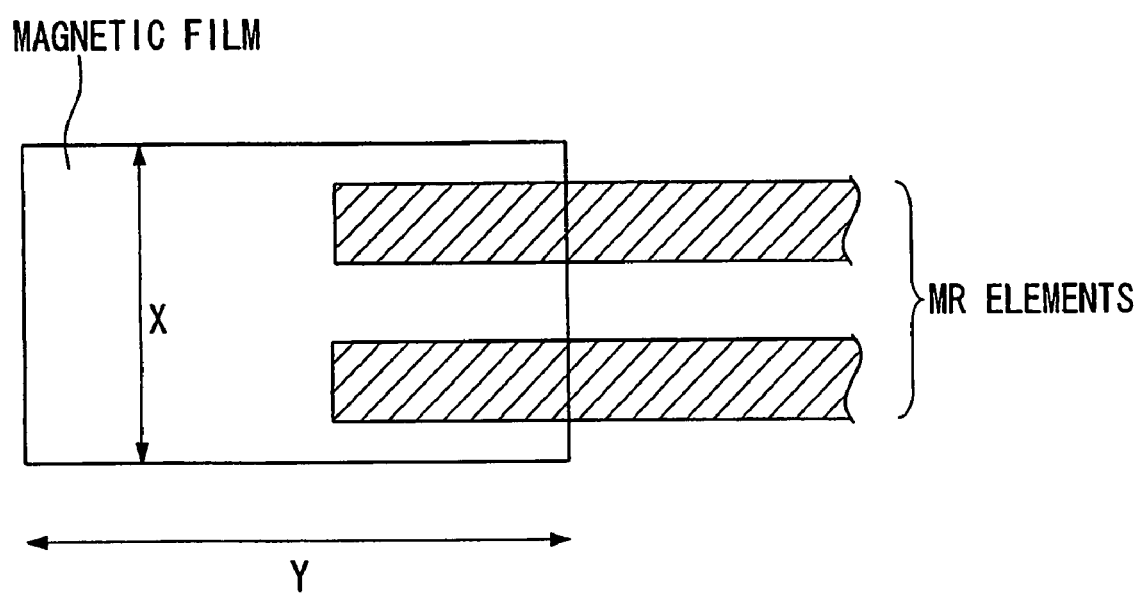
FIG. 74 shows a relationship between a magnetic film and MR elements in dimensions.

FIG. 74 shows a relationship between a magnetic film and a magnetoresistive (MR) element in dimensions, wherein "X" represents the width of the magnetic film, and "Y" represents the length of the magnetic film, where X<Y. With respect to two samples of MR elements whose widths are set to 7.5 μm and 5 μm respectively, it is preferable to set the following dimensions to the magnetic film.

TABLE 2

|   | MR element width | |
|---|---|---|
|   | 7.5 μm | 5 μm |
| X | 20 μm | 15 μm |
| Y | 60 μm | 60 μm |

The GMR element of the present invention shown in FIGS. 61 to 64, in which the width is set to 7.5 μm, the thickness of the spacer layer is set to 28 A°, and the thickness of the pinned layer is set to 30 A°, is superior in terms of the sensitivity and the sensitivity direction, wherein the magnetization direction of the pin laye is slanted to the longitudinal direction of the GMR element by 45°, and the magnetic film has the width of 20 μm and the length of 60 μm. Herein, it demonstrates the sensitivity of 1.94 mv/Oe, and the sensitivity direction deviation of 0-3 degree.

8. Seventh Embodiment

The magnetization direction of the pinned layer of the GMR element is pinned to match the short-side direction of the band-like shape of the GMR element, whereby the magnetization direction of the free layer must be necessarily aligned in the longitudinal direction of the band-like shape of the GMR element that forms 90° to the magnetization direction of the pinned layer in the initial state where no external magnetic field is applied to the GMR element. The magnetization direction of the free layer in the initial state will be referred as a free layer easy axial direction.

A prescribed method for actualizing the free layer easy axial direction to match the longitudinal direction of the band-like shape of the GMR element is used to secure the stability of the magnetic sensor rendering the external magnetic field by controlling the magnetic anisotropy of the GMR element, which is formed in a prescribed pattern so as to obtain an aspect ratio realizing the band-like shape.

However, this method has a drawback in lacking the stability of the magnetization of the free layer, which should be magnetized regardless of the external magnetic field, whereby when the magnetic sensor is exposed to a relatively weak magnetic field, the output of the magnetic sensor may be varied.

Alternatively, another method is used to compulsorily control the free layer easy axial direction to match the longitudinal direction of the band-like shape of the GMR element by applying a bias magnetic field using bias magnetic layers arranged on both ends of the GMR element. According to this method, the bias magnetic layer is magnetized in the free layer easy axial direction so as to control the magnetization of the free layer, whereby it is possible to improve the stability of the magnetic sensor rendering the external magnetic field.

Figure 92:
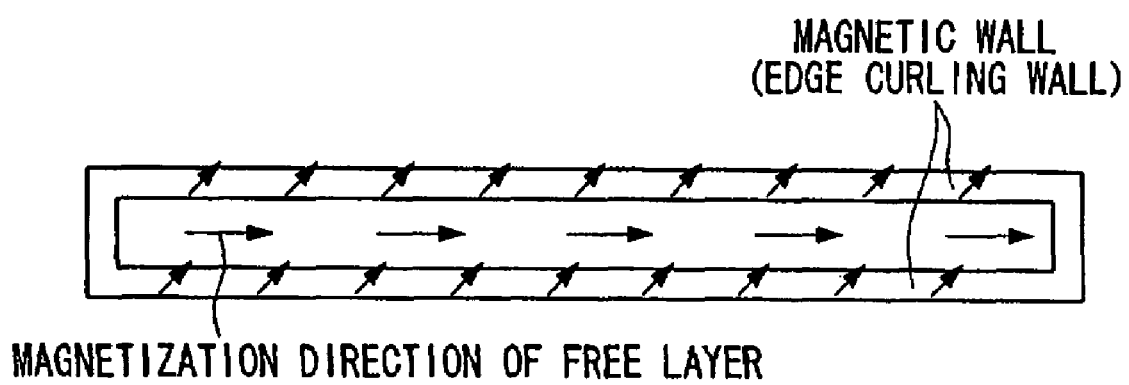
FIG. 92 is a plan view showing the magnetization direction of the free layer of the GMR element.

However, this method has a drawback in that as the intensity of the external magnetic field increases, it becomes difficult to restore the initial state of the free layer being magnetized. FIG. 92 is a plan view diagrammatically showing the magnetization direction of the free layer of the GMR element described above, wherein magnetic walls (or edge curling walls) being magnetized by the external magnetic field are formed on both ends of the free layer along the longitudinal direction of the band-like shape of the GMR element. Herein, when the external magnetic field varies, the magnetization processing of the free layer becomes non-uniform so that the magnetic sensor is reduced in the linearity of the output thereof; the magnetization direction of the free layer is aligned in a direction slightly deviated from the longitudinal direction of the band-like shape of the GMR element in the initial state so that the output of the magnetic sensor becomes unstable because the edge curling walls remain after the external magnetic field disappears; therefore, it is very difficult to restore the original magnetization direction established in the initial state of the free layer.

In consideration of the aforementioned drawbacks, the seventh embodiment is designed to provide a magnetic sensor that can sufficiently demonstrate the magnetic anisotropy of he GMR element rendering the external magnetic field, that can secure the output stability against the external magnetic field, and that can precisely restore the original magnetization direction established in the initial state of the free layer even after a strong magnetic field is applied thereto.

Figure 75:
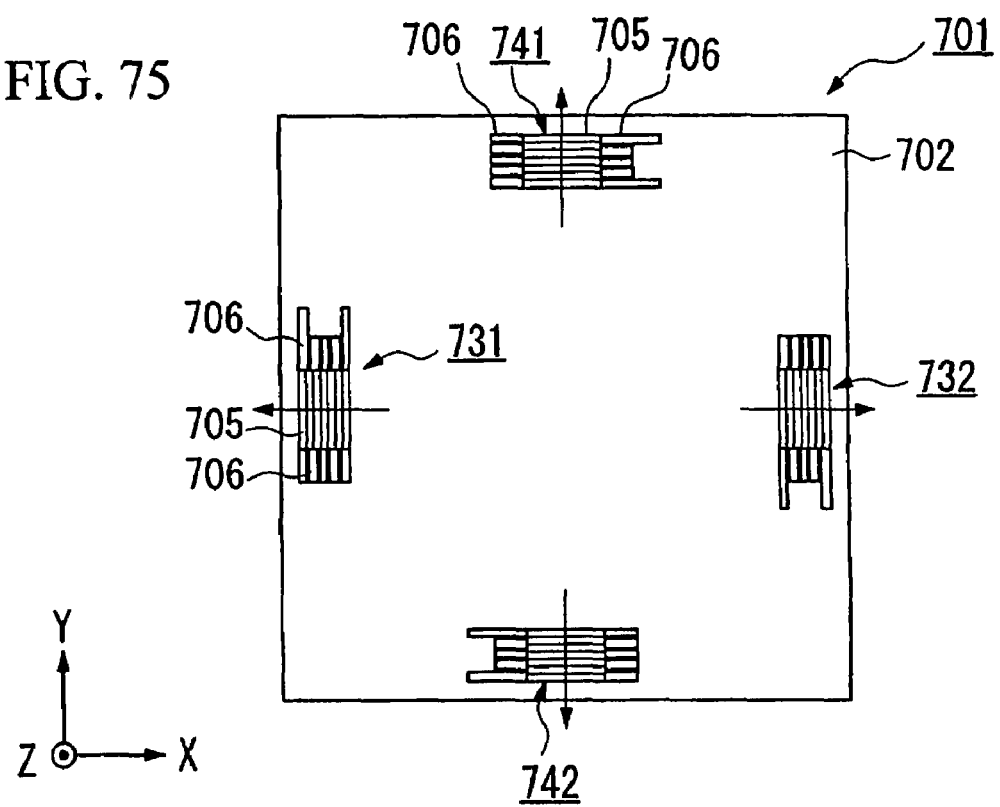
FIG. 75 is a plan view diagrammatically showing the constitution of a magnetic sensor according to a seventh embodiment of the invention.

FIG. 75 is a plan view diagrammatically showing a magnetic sensor according to the seventh embodiment of the invention. That is, a magnetic sensor 701 of FIG. 75 comprises a substrate 702 having a prescribed thickness, which is composed of a quartz or silicon wafer, X-axis magnetic sensors 731 and 732 for detecting a magnetic field in the X-axis direction, and a Y-axis magnetic sensors 741 and 742 for detecting a magnetic field in the Y-axis direction.

In the magnetic sensor 701, the substrate 702 is composed of a quarts or silicon wafer having a square shape. The aforementioned four magnetic sensors 731 732, 741, and 742 are respectively arranged along four sides of the square-shaped substrate 702 such that each of them is approximately arranged in proximity the center of each side of the square-shaped substrate 702. Each of the magnetic sensors 731, 732, 741, and 742 has a band-like shape whose longitudinal direction lies in parallel with each side of the square-shaped substrate 702. Incidentally, in FIG. 75, the horizontal direction is defined as the X-axis direction, and the vertical direction is defined as the Y-axis direction, whereby the X-axis magnetic sensors 731 and 732 are arranged in parallel with the sides of the square-shaped substrate 702 along the Y-axis direction, while the Y-axis magnetic sensors 741 and 742 are arranged in parallel with the other sides of the square-shaped substrate 702 along the X-axis direction.

Figure 76:
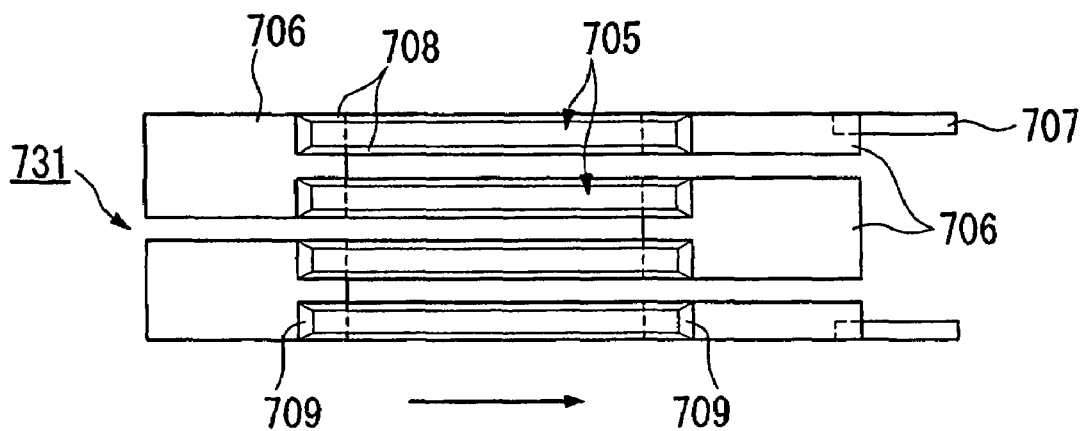
FIG. 76 is a plan view showing the constitution of an X-axis magnetic sensor used in the magnetic sensor shown in FIG. 75.

FIG. 76 is a plan view diagrammatically showing the constitution of the X-axis magnetic sensor 731. Since the other magnetic sensors are substantially identical to the X-axis magnetic sensor 731 in constitution except that they differ from the X-axis magnetic sensor 731 with respect to the pinned directions regarding the magnetization of the pinned layers thereof; hence, the detailed description thereof will be omitted. In FIG. 76, the X-axis magnetic sensor 731 comprises band-like GMR elements 705, bias magnetic layers 706 connected with both ends of the GMR elements 705 respectively, and line extraction sections 707 connected with the bias magnetic layers 706, wherein an arrow direction indicates the magnetization direction of the free layer.

The X-axis magnetic sensor 731 according to the present embodiment is designed such that four GMR elements 705 each having a band-like shape are arranged in parallel in their longitudinal directions with prescribed distances therebetween on a substrate 702. Herein, the left ends of the first and second GMR elements, which adjoin together in the upper side of FIG. 76, are formed on the right end of a first bias magnetic layer 706, so that the first and second GMR elements 705 are electrically connected together via the first bias magnetic layer 706. In addition, the right ends of the second and third GMR elements 705 are formed on the left end of a second bias magnetic layer 706, so that the second and third GMR elements 705 are electrically connected together via the second bias magnetic layer 706. Furthermore, the left ends of the third and fourth GMR elements 705 are formed on the right end of a third bias magnetic layer 706, so that the third and fourth GMR elements 705 are electrically connected together via the third bias magnetic layer 706. Each of the right ends of the first and fourth GMR elements 705 is formed on the left end of a single bias magnetic layer 706, which is formed on the left end of a line extraction portion 707 having a band-like shape. Thus, the four GMR elements 705 are arranged in a zigzag manner via the bias magnetic layers 706, whereby each of them is electrically connected with the line extraction portion 707.

The GMR elements 705, the bias magnetic layers 706, and the line extraction portions 707 are sequentially laminated together in a prescribed order, whereby they are connected together at prescribed ends thereof so that they are arranged in a zigzag manner, thus forming a series-connection electrical circuit functioning as a resistor as a whole. An electric current is applied to the circuit from the exterior; then, a voltage is measured so as to estimate the overall resistance of the GMR elements 705, based on which the intensity of an external magnetic field can be calculated.

Figure 77:
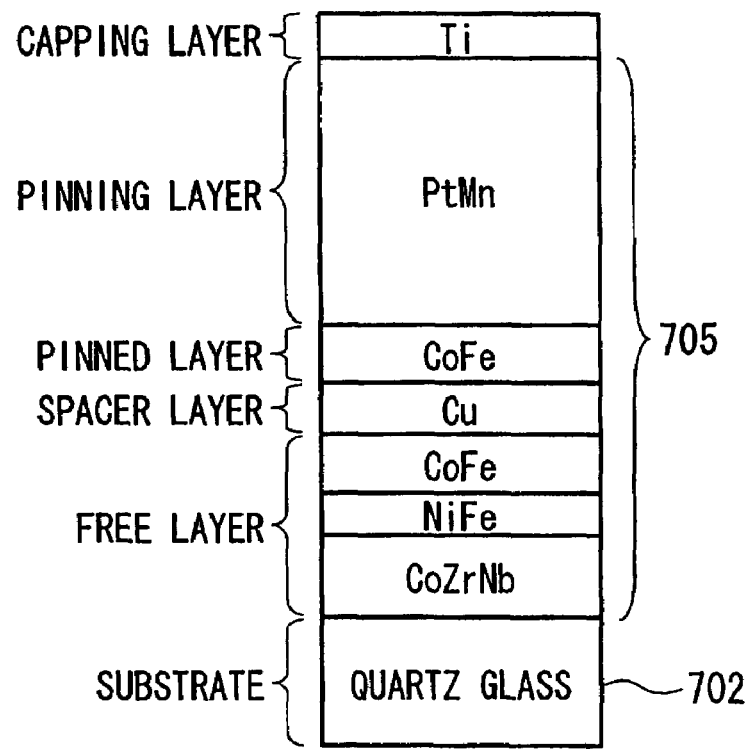
FIG. 77 diagrammatically shows the structure of a GMR element forming the magnetic sensor of the seventh embodiment.

Next, a description will be given with respect to the GMR element 705 with reference to FIG. 77, which is a cross-sectional view diagrammatically showing the structure of the GMR element 705. That is, the GMR element 705 comprises a free layer F, a conductive spacer layer S composed of Cu, a pinned layer PD composed of a cobalt-iron (CoFe) alloy, a pinning layer PN composed of a platinum-manganese (PtMn) alloy, and a capping layer C made of a thin metal film composed of Ti or Ta, which are sequentially laminated together on the substrate 702.

The free layer F changes the magnetization direction thereof in response to the direction of an external magnetic field, wherein it comprises a cobalt-zirconium-niobium (CoZrNb) amorphous magnetic layer, a nickel-iron (NiFe) magnetic layer formed on the CoZrNb amorphous magnetic layer, and a cobalt-iron (CoFe) layer formed on the NiFe magnetic layer.

In order to maintain an uniaxial anisotropy in magnetization (i.e., a free layer easy axis direction), the bias magnetic layer 706 applies a bias magnetic field to the free layer F in the longitudinal direction of the band-like shape of the GMR element 705.

In the free layer F, each of the CoZrNb amorphous magnetic layer and the NiFe magnetic layer is composed of a soft ferromagnetic sustance, and the CoFe layer is provided to avoid occurrence of the nickel diffusion in the NiFe magnetic layer and occurrence of the copper diffusion in the spacer layer S.

The spacer layer S is made of a conductive thin metal film composed of copper or a copper alloy.

The pinned layer PD is constituted by a cobalt-iron (CoFe) magnetic layer, wherein the CoFe magnetic layer is subjected to backing in a switched-connection manner onto an anti-ferromagnetic film forming the pinning layer PN so that the magnetization direction thereof is pinned (or fixed) in the short-side direction of the band-like shape of the GMR element 705, which is shown by an arrow in FIG. 75.

The pinning layer PN is formed on the CoFe magnetic layer and is made of an anti-ferromagnetic film composed of a PtMn alloy including 45-55 mol % of platinum. The anti-ferromagnetic film is formed upon ordering heat treatment under the condition whether a magnetic field is applied thereto in a prescribed direction.

Incidentally, the pinned layer PD and the pinning layer PN are collectively referred to as a pin layer.

The capping layer C is made of a thin metal film composed of titanium (Ti) or tantalum (Ta), wherein it is provided to avoid oxidation of the pinning laye PN, which is thus protected.

The GMR element 705 according to the present embodiment is characterized in that side surfaces 708 lying in the longitudinal direction are subjected to tapered formation.

Figure 78:
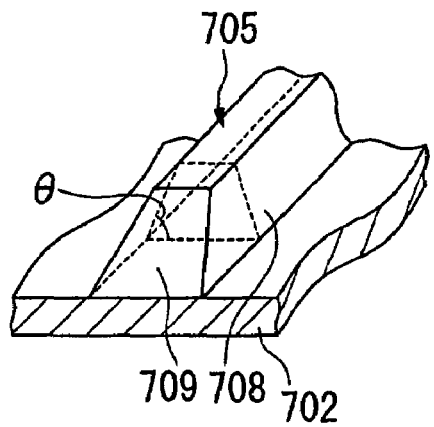
FIG. 78 is a perspective view showing the exterior appearance of the GMR element.

FIG. 78 is a perspective view diagrammatically showing the exterior appearance of the GMR element 705, wherein the rightward direction is referred to as the short-side direction, and the backward direction is referred to as the longitudinal direction. Herein, side surfaces 709 lie in the short-side direction, and the side surfaces 708 lie in the longitudinal direction. Each of the side surfaces 708 lying in the longitudinal direction of the GMR element.705 is subjected to tapered formation and is slanted by an angle θ so as to realize a wide-based shape. Due to the tapered formation of the side surfaces 708 lying in the longitudinal direction of the GMR element 705, it is possible to align the magnetization direction of the free layer F in a prescribed direction that matches the longitudinal direction of the GMR element 705 under the initial condition where no external magnetic field is applied to the GMR element 705.

It is preferable that the angle θ ranges from 50° to 85°. Compared with the GMR element 705 whose side surfaces 708 are tapered and slanted by 90°, the GMR element 705 whose side surfaces 708 are tapered and slanted by the angle θ belonging to the aforementioned range is changed in formation of the magnetic section (or domain); thus, it is possible to avoid the formation of magnetic walls (or edge curling walls) shown in FIG. 92; and it is possible to improve the uniformity of the magnetization of the free layer F, whereby it is possible to stabilize the output of the magnetic sensor rendering the external magnetic field. In addition, even after an intense magnetic field is applied to the magnetic sensor, it is possible to precisely restore the original magnetization direction of the free layer, which matches the longitudinal direction of the GMR element.

The bias magnetic layer 706 connected with the GMR element 705 is made of a thin metal film whose thickness is 90 nm or so and which is constituted by a magnetic film composed of a cobalt-chromium-platinum (CoCrPt) alloy having a high coercive force and a high aspect ratio. The bias magnetic layer 706 is magnetized such that the magnetization direction thereof lies in the longitudinal direction of the GMR element 705.

As shown by an arrow in FIG. 75, the magnetization direction of the pinned layer PD lies in the short-side direction of the GMR element 705, whereas the magnetization direction of the bias magnetic layer 706 lies in the longitudinal direction of the GMR element 705. That is, an angle of 90° is formed between the magnetization direction of the pinned layer PD and the magnetization direction of the bias magnetic layer 706.

Due to the magnetization of the bias magnetic layer 706, the free layer of the GMR element 705 is magnetized in the longitudinal direction, which is shown by an arrow in FIG. 76. Thus, it is possible to uniaxial anisotropy (i.e., free layer easy axis direction) of the free layer.

As described above, the present embodiment is characterized in that the bias magnetic layers 706 are connected with both ends of the GMR element 705 having a band-like shape, wherein the side surfaces 708 of the GMR element 705 are subjected to tapered formation. Thus, it is possible to sufficiently control the magnetic anisotropy of the GMR element 705 rendering the external magnetic field; it is possible to improve the uniformity in magnetization of the free layer, thus securing the output stability of the magnetic sensor rendering the external magnetic field; and even after an intense magnetic field is applied to the magnetic sensor, it is possible to precisely restore the original magnetization direction in the free layer.

Incidentally, the magnetic sensor of the present embodiment is improved in the output stability against the external magnetic field without substantially changing the film structure of the GMR element and the formation pattern thereof compared with the foregoing magnetic sensor.

Next, a manufacturing method for the magnetic sensor according to the present embodiment will be described.

Figure 79:
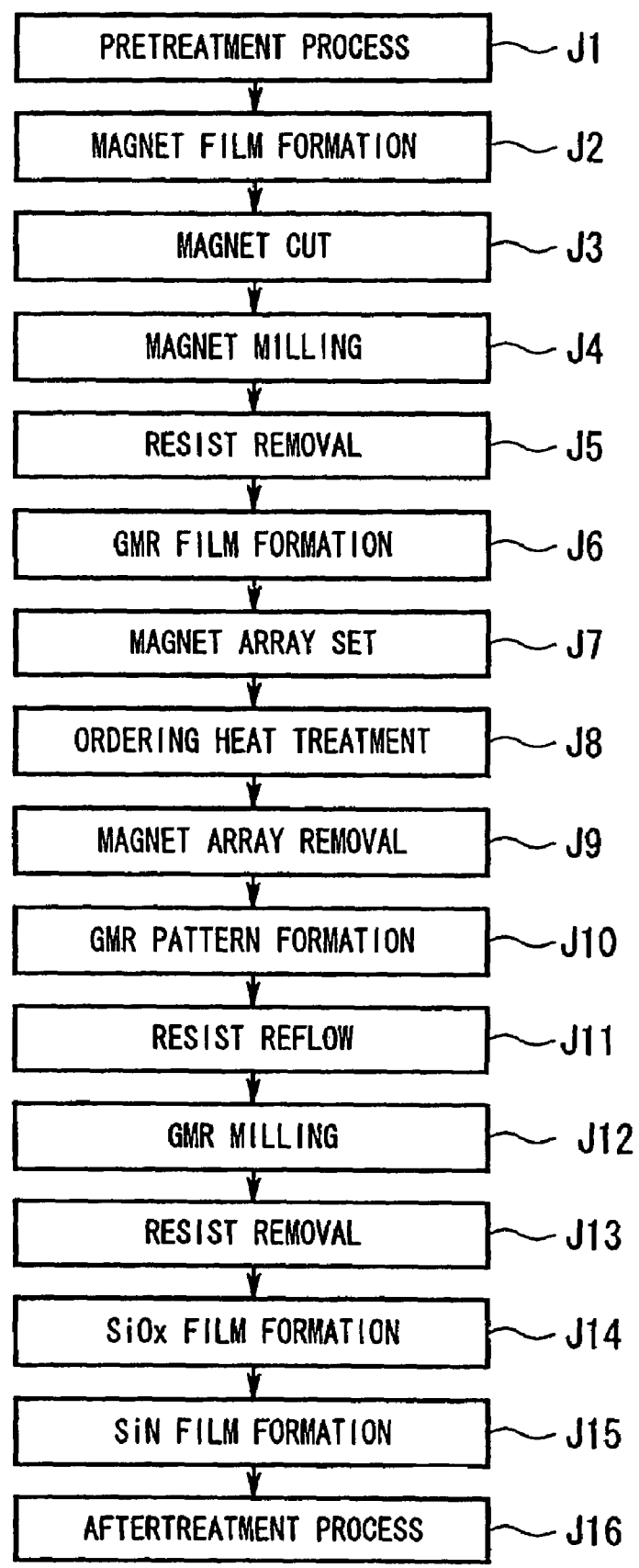
FIG. 79 is a flowchart showing steps of a manufacturing method for the magnetic sensor of the seventh embodiment.

FIG. 79 is a flowchart showing steps in the manufacturing method of the magnetic sensor according to the present embodiment; and FIGS. 80 to 85 and FIGS. 87A and 87B, FIGS. 88A and 88B, FIGS. 89A and 89B, and FIG. 90 are cross-sectional views showing structures of the magnetic sensor being manufactured.

In the manufacturing method of the magnetic sensor of the present embodiment, there is firstly provided a substrate 702 composed of a quartz or silicon wafer. It is possible to form an LSI circuit portion for controlling the magnetic sensor in advance, wherein in a pretreatment process (see step J1), circuit elements such as transistors, wires, insulation films, contacts, and protective films are formed in accordance with the known method; then, openings are formed to penetrate through the protective films in order to secure connections.

Figure 80:
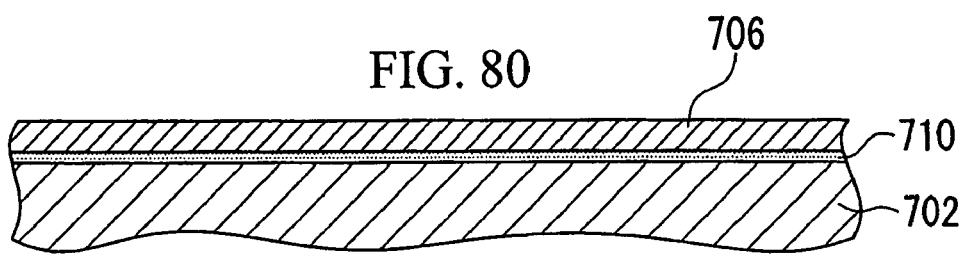
FIG. 80 is a cross-sectional view showing the structure for use in manufacture of the magnetic sensor of the seventh embodiment in step J2.

Next, it proceeds to magnet film formation (see step J2), wherein as shown in FIG. 80, a sputtering method is performed on the upper surface of the substrate 702 so as to form an embedded film 710 of 40 nm thickness or so composed of chromium. Then, a sputtering method is performed on the upper surface of the embedded film 710 so as to form a bias magnetic film 706 of 90 nm thickness or so composed of a cobalt-platinum-chromium (CoCrPt) alloy.

Figure 81:
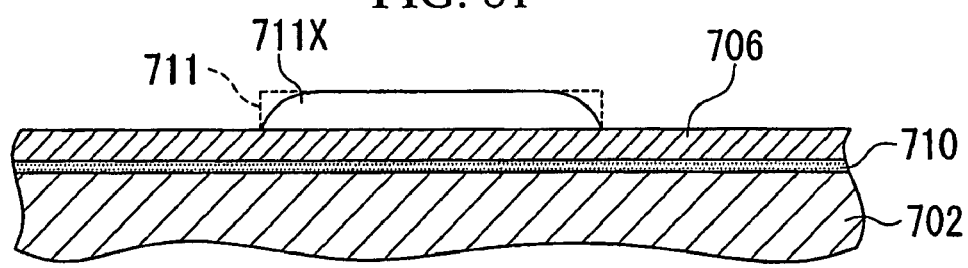
FIG. 81 is a cross-sectional view showing the structure for use in manufacture of the magnetic sensor of the seventh embodiment in step J3.

Next, it proceeds to magnet cutting (see step J3), wherein as shown in FIG. 81, a spin-coat method or a dip-coat method is performed on the upper surface of the bias magnetic layer 706 so as to apply a photoresist having an arbitrary thickness. The surface of the photoresist is accompanied with a mask of an arbitrary pattern and is then subjected to exposure; thereafter, a development process is performed to remove unnecessary portions of the photoresist, thus forming a resist film 711. Then, the photoresist is heated and is forced to reflow, thus forming a resist film 711X whose both ends are curved.

Figure 82:
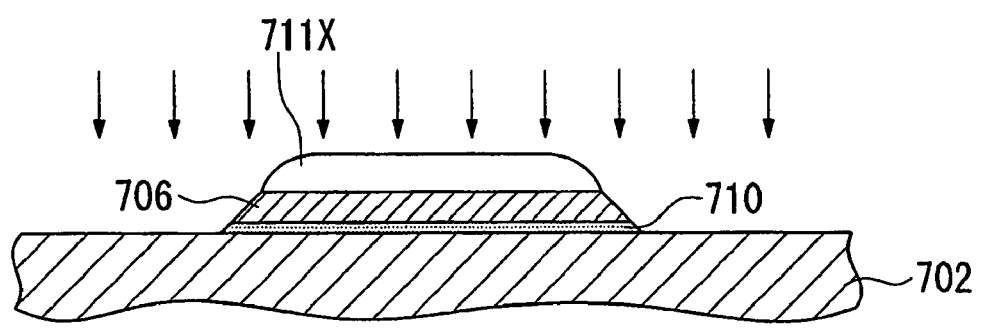
FIG. 82 is a cross-sectional view showing the structure for use in manufacture of the magnetic sensor of the seventh embodiment in step J4.

Next, it proceeds to magnet milling (see step J4), wherein as shown in FIG. 82, ion milling is performed in a prescribed direction (indicated by arrows) so as to remove prescribed portions of the embedded film 710 and the bias magnetic layer 706, which are not covered with the resist film 711X after reflow, so that the embedded film 710 and the bias magnetic layer 706 are formed in prescribed shapes respectively. In step J4, ion milling is performed in response to the curved shapes of the both ends of the resist film 711X after reflow so that the side surfaces of the embedded film 711X and the bias magnetic layer 706 are slanted to the substrate 702.

Figure 83:
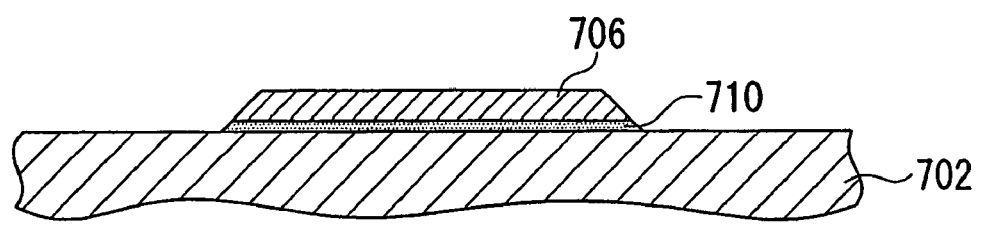
FIG. 83 is a cross-sectional view showing the structure for use in manufacture of the magnetic sensor of the seventh embodiment in step J5.

Next, it proceeds to resist removal (see step J5), wherein as shown in FIG. 83, the resist film 711X is removed using a washing liquid such as acetone, N-methyl-2-pyrolidone, so that the surface of the bias magnetic layer 706 is washed upon removal of the resist film 711X.

Figure 84:
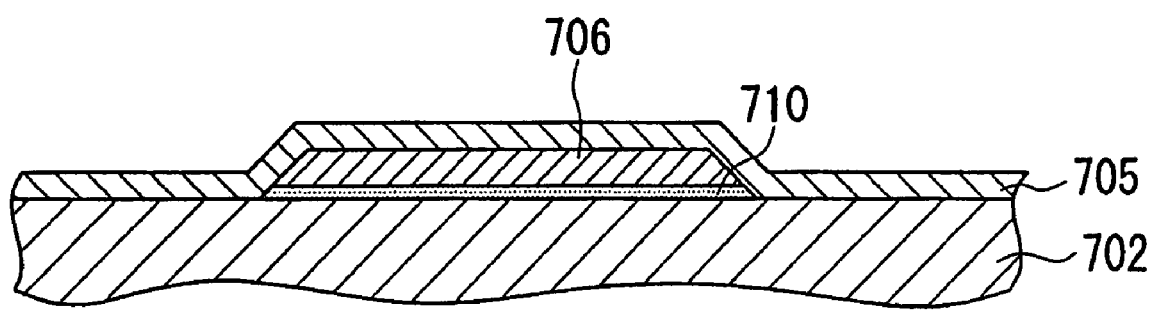
FIG. 84 is a cross-sectional view showing the structure for use in manufacture of the magnetic sensor of the seventh embodiment in step J6.

Next, it proceeds to GMR film formation (see step J6), wherein as shown in FIG. 84, an ion beam sputtering method or a magnetron sputtering method is performed on the upper surface of the substrate 702, the side surfaces of the embedded film 710, and the upper surface and side surfaces of the bias magnetic layer 706, thus forming a GMR element 705.

Next, it proceeds to magnet array set (see step J7), wherein a magnet array provided in the external space is arranged at a prescribed position relative to the bias magnetic layer 706, so that a magnetic field is applied to the pin layer of the GMR element 705 in a prescribed direction.

Next, it proceeds to ordering heat treatment (see step J8), wherein the magnet array and the bias magnetic layer 706 are fixed in arrangement and is heated at 280° C. for four hours under the vacuum condition. This actualize the ordering heat treatment with respect to the pinning layer within the pin layer of the GMR element 705, whereby the magnetization direction of the pinned layer is pinned (or fixed) in the short-side direction of the GMR element 705.

Next, the magnet array is removed from the prescribed position (see step J9).

Figure 85:
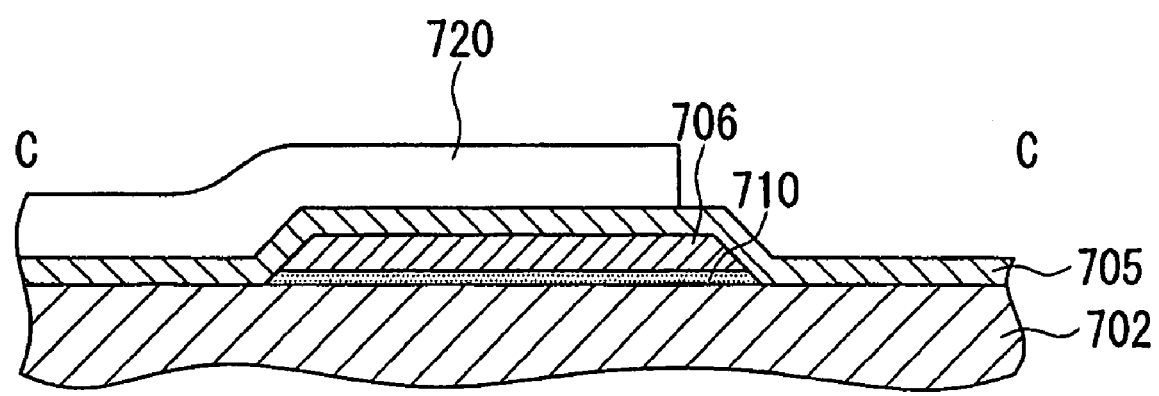
FIG. 85 is a cross-sectional view showing the structure for use in manufacture of the magnetic sensor of the seventh embodiment in step J10.

Next, it proceeds to GMR pattern formation (see step J10), wherein as shown in FIG. 85, a spin-coat method or a dip-coat method is performed on the upper surface of the GMR element 705 so as to apply a photoresist whose thickness ranges from 0.3 μm to 5 μm. The surface of the photoresist is accompanied with a mask of an arbitrary pattern and is then subjected to exposure; thereafter, a development process is performed to remove unnecessary portions of the photoresist, thus forming a resist film 720. Line C-C in FIG. 85 matches line C-C in FIG. 86A. By defining the thickness of the photoresist being applied to the GMR element 705 in the aforementioned range, it is possible to reduce an inclination angle β of a resist film 720X after resist reflow. Incidentally, the width of the resist in line D-D in FIG. 86A ranges from 6 μm to 8 μm, for example.

Next, it proceeds to resist reflow (see step J11), wherein the resist film 720 is heated at a certain temperature (ranging from 120° C. to 180° C. for a certain time (ranging from 1 min to 30 min so as to cause resist reflow, whereby the all ends of the resist film 720 lying in the longitudinal direction and short-side direction are adequately curved, thus forming a resist film 720X having slopes. Herein, the resist film 720 is heated at a higher temperature compared with the foregoing heating temperature of 100° C., and the heating time is defined in the aforementioned range, whereby it is possible to reduce the inclination angle β of the side surfaces of the resist film 720X lying in the longitudinal direction.

Figure 86A:
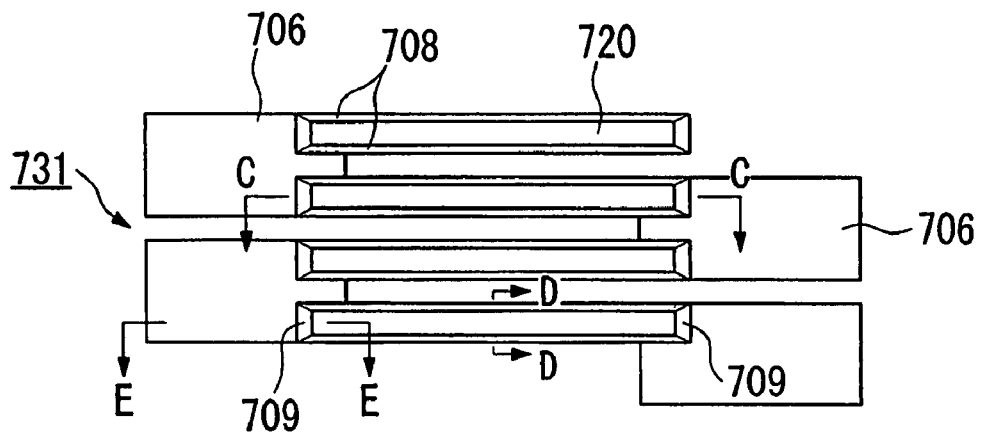
FIG. 86A is a plan view showing GMR elements and resist films after step J10 and J11.
Figure 86B:
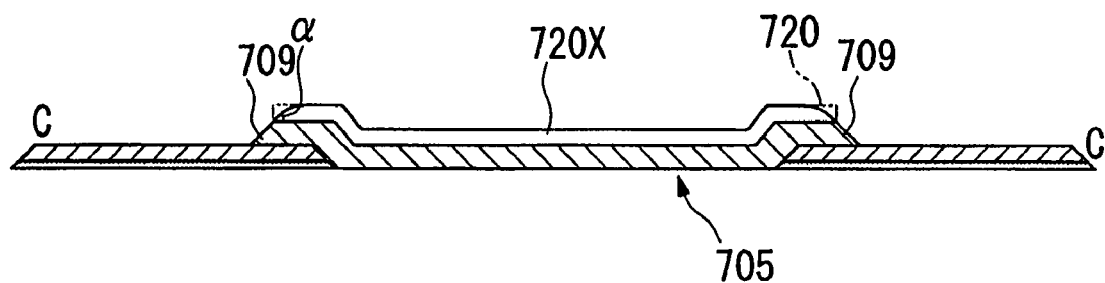
FIG. 86B is a cross-sectional view taken along line C-C in FIG. 86A.
Figure 86C:
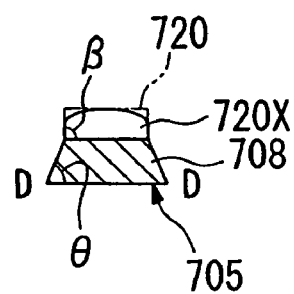
FIG. 86C is a cross-sectional view taken along line D-D in FIG. 86A.
Figure 87A:
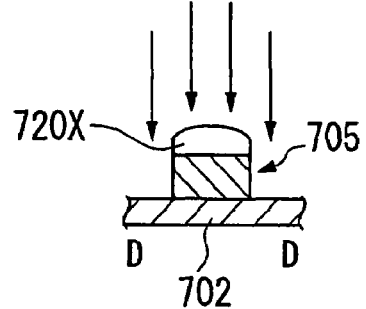
FIG. 87A is cross-sectional view showing the GMR element taken along line D-D to which ion beams are applied in a vertical direction.
Figure 87B:
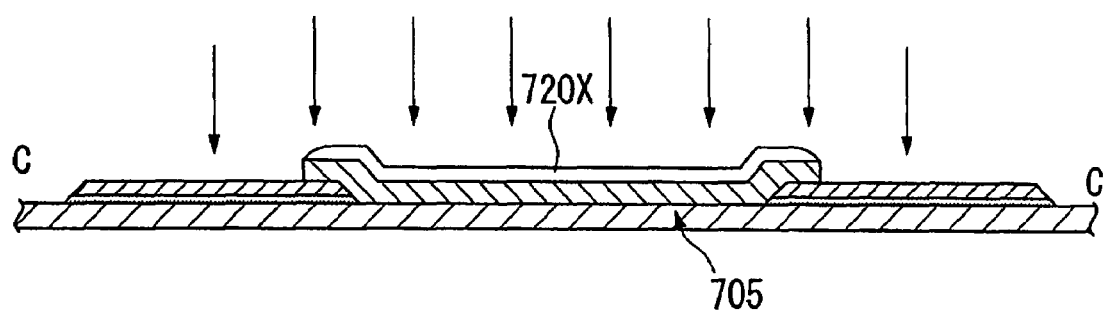
FIG. 87B is a cross-sectional view showing the GMR element taken along line C-C to which ion beams are applied in the vertical direction.
Figure 88A:
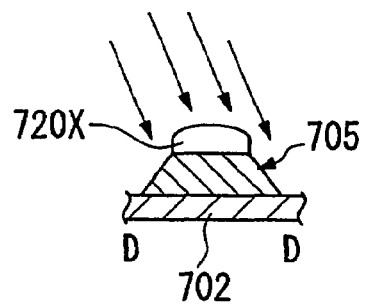
FIG. 88A is a cross-sectional view showing the GMR element taken along line D-D to which ion beams are applied in a slanted direction.
Figure 88B:
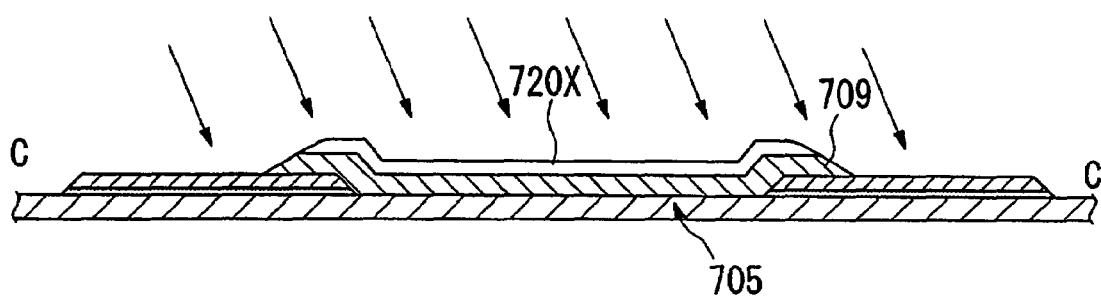
FIG. 88B is a cross-sectional view showing the GMR element taken along line C-C to which ion beams are applied in the slanted direction.
Figure 89A:
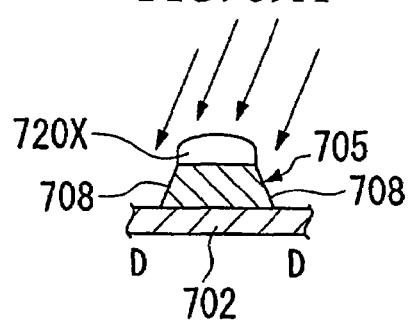
FIG. 89A is cross-sectional view showing the GMR element taken along line D-D to which ion beams are applied in a slanted direction.
Figure 89B:
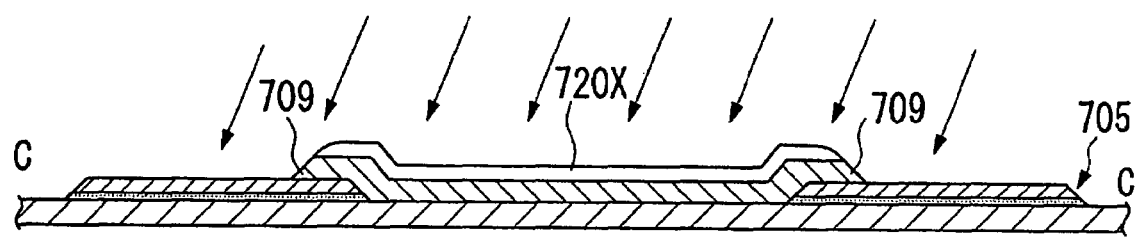
FIG. 89B is a cross-sectional view showing the GMR element taken along line C-C to which ion beams are applied in the slanted direction.

FIGS. 86A to 86C show relationships between the GMR element 705, the resist film 720, and the resist film 720X after reflow after execution of the GMR pattern formation (see step J10) and the resist reflow (see step J11), wherein FIG. 86A is a plan view showing the X-axis magnetic sensor 731, FIG. 86B is a cross-sectional view taken along line C-C in FIG. 86A, and FIG. 86C is a cross-sectional view taken along line D-D in FIG. 86A.

The resist film 720 after step J10 has a rectangular parallelopiped shape (designated by dotted lines in FIGS. 86B and 86C), wherein both of the inclination angles α and β of the side surfaces of the resist film 720X, which are slanted to the substrate 702 and which lie in the short-side direction and the longitudinal direction respectively, are set to 90°.

The aforementioned resist film 720 is heated to cause resist reflow, which is actualized in the overall surface of the substrate 702; hence, it is heated in the same conditions with respect to both of the short-side direction and longitudinal direction, wherein the shapes of the side surfaces of the resist film 720X depend upon the pattern of the photoresist. In the cross-sectional views of FIGS. 86A and 86B, the shape of the resist film 720X after reflow is drawn using solid lines. As shown in FIG. 86B that is a cross-sectional view taken along line C-C in FIG. 86A, the inclination angle α formed between the substrate 702 and the side surfaces of the resist film 720X lying in the short-side direction ranges from 30° to 80°. As shown in FIG. 86C that is a cross-sectional view taken along line D-D in FIG. 86A, the inclination angle β formed between the substrate 702 and the side surfaces of the resist film 720X lying in the longitudinal direction ranges from 50° to 85°.

Next, it proceeds to GMR milling (see step J12), wherein an ion beam is applied to the substrate 702 in a slanted direction so as to perform milling on the GMR element 705, whereby prescribed portions of the GMR element 705, which are not covered with the resist film 720X after reflow, are removed, and the side surfaces 708 of the GMR element 702 lying in the longitudinal direction are subjected to tapered formation.

In step J12, ion milling is performed in response to the curved shapes of the ends of the resist film 720X lying in the short-side direction and longitudinal direction respectively so that the side surfaces 708 of the GMR element 705 lying in the longitudinal direction and the side surfaces 709 of the GMR element 705 lying in the short-side direction are respectively slanted to the substrate 702 with different tapered angles.

It is possible to use a prescribed beam using argon gas, oxygen, $CF_4$, etc. for use in the ion milling, wherein argon gas is the most preferable. The incident angle of the beam is slanted to the substrate 702, wherein it is preferably slanted by 5° to 30° with respect to the normal line of the wafer surface. In addition, the ion milling is performed under prescribed conditions where the pressure ranges from 0.01 Pa to 0.1 Pa, the acceleration voltage ranges from 0.3 kV to 0.8 kV, and the milling time ranges from 1 min to 3 min.

When the ion milling is performed using an ion beam that is applied to the substrate 702 in the vertical direction (forming 90° to the surface of the substrate 702), in other words, when the so-called vertical ion milling is performed, it becomes difficult for the side surfaces 708 of the GMR element 705 lying in the longitudinal direction to be subjected to tapered formation since the inclination angle β applied to the side surfaces of the resist film 720X lying in the longitudinal direction is relatively great, whereby the tapered angle θ may become approximately identical to 90°. By applying the ion beam to the substrate 702 in a slanted direction whose angle belongs to the aforementioned range, in other words, by performing the so-called slanted-beam-incidence ion milling, the side surfaces 708 of the GMR element 705 lying in the longitudinal direction can be subjected to tapered formation in which θ ranges from 50° to 85°. Due to the tapered formation of the side surfaces 708 of the GMR element 705 lying in the longitudinal direction, it is possible to align the magnetization direction of the free layer of the GMR element 705 in a prescribed direction, which matches the longitudinal direction in the initial state in which no external magnetic field is applied to the magnetic sensor.

The side surfaces 708 of the GMR element 705 lying in the longitudinal direction cannot be processed to have the tapered angle θ belonging to the aforementioned range even though the slanted-beam-incidence ion milling is performed on the resist film 720 before reflow. This is because the side surfaces of the resist film 720 lying in the longitudinal direction are each slanted by the inclination angle β of 90°, so that even though the slanted-beam-incidence ion milling is performed, the side surfaces 708 must have the tapered angle θ of approximately 90°. That is, it is necessary that the resist film 720 is subjected to resist reflow so as to change the overall shape of the resist film 720X whose inclination angle β belongs to the aforementioned range; then, the slanted-beam-incidence ion milling is performed on the resist film 720X after reflow so as to form the side surfaces 708 of the GMR element 705 lying in the longitudinal direction in which θ ranges from 50° to 85°.

The other side surfaces 709 of the GMR element 705 lying in the short-side direction are subjected to tapered formation by executing the resist flow (see step J11) and the GMR milling (see step J12), wherein the inclination angle thereof ranges from 30° to 80°.

There is a problem in that when the vertical ion milling is performed, materials being cut by the ion milling must be easily re-adhered to the side surfaces 708 of the GMR element 705 lying in the longitudinal direction. In the present embodiment, before the slanted-beam-incidence ion milling is performed, the substrate 702 is rotated in such a way that as shown in FIGS. 87A and 87B, FIGS. 88A and 88B, and FIGS. 89A and 89B, the slanted-beam-incidence ion milling is performed in all directions so as to avoid occurrence of the re-adhesion of the unwanted materials, thus improving the processing accuracy.

Since the GMR element 705 is made of a metal or a magnetic substance, the ion milling speed therefor is relatively high compared with the resist film 720X after reflow. Compared with the vertical ion milling, the slanted-beam-incidence ion milling is advantageous in that the side surfaces of the GMR element 705 can be speedily subjected to tapered formation, thus improving the throughput in manufacture.

When the inclination angle formed between the substrate 702 and the resist film 720X after reflow is relatively great, even if the slanted-beam-incidence ion milling is performed, prescribed side surfaces of the GMR element 705 corresponding to shadow portions to which ion beams are not irradiated may be trailed in bases, whereby these portions are easy to re-adhere the materials being cut by the ion milling. When the slanted-beam-incidence ion milling is performed while the substrate 702 is rotated, it is possible to remove the re-adhesions.

In order to improve the GMR element 705 so that the side surfaces are not trailed in bases, after the slanted-beam-incidence ion milling is performed, it is necessary to perform the ion milling on the GMR element 705 by applying the ion beam to the substrate 762 in the vertical direction (see step J12). Even though the vertical ion milling is performed after the slanted-beam-incidence ion milling, it is possible to prevent the materials being cut by the ion milling from being re-adhered to the side surfaces 708 of the GMR element 705 lying in the longitudinal direction because the side surfaces 708 have been already subjected to tapered formation.

Next, it proceeds to resist removal (see step J13), wherein the washing liquid composed of acetone, N-methyl-2-pyrolidone is used to partially remove the resist film 720X so that the surface of the GMR element 705 is washed.

Figure 90:
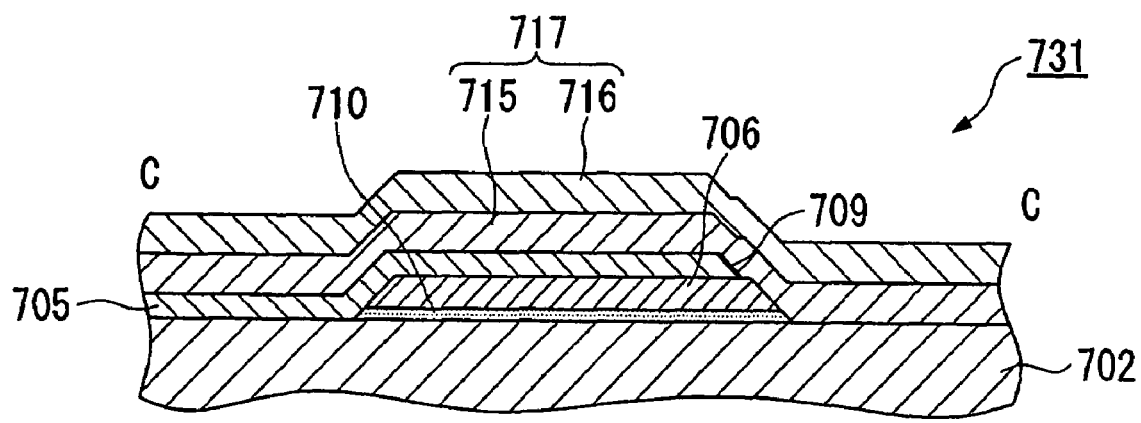
FIG. 90 is a cross-sectional view showing the GMR element along line C-C, which is subjected to SiOx film formation in step J14.

Next, it proceeds to SiOx film formation (see step J14), wherein as shown in FIG. 90, the plasma CVD method is performed on the upper surface of the GMR element 705 so as to form a first protective film 715 composed of a silicon oxide film of about 150 nm thickness.

Next, it proceeds to SiN film formation (see step J15), wherein the plasma CVD method is performed on the upper surface of the first protective film 715 so as to form a second protective film 716 composed of a silicon nitride film of about 300 nm thickness.

The first protective film 715 and the second protective film 716 can be collectively referred to as a protective film 717. It is possible to additionally form a third protective film composed of a polyimide resin on the first protective film 715 and the second protective film 716.

Next, it proceeds to aftertreatment process (see step J16), wherein openings are formed at prescribed positions on the first protective film 715 and the second protective film 716; pads are formed; then, the substrate 702 is subjected to dicing so as to separate individual chips, each of which is then enclosed in a resin.

The magnetic sensor of the present embodiment is advantageous in that it is possible to sufficiently control the magnetic anisotropy of the GMR element rendering the external magnetic field; it is possible to secure the output stability of the magnetic sensor rendering the external magnetic field by improving the uniformity of the magnetization of the free layer; and it is possible to precisely restore the original magnetization direction of the free layer established in the initial state even after an intense magnetic field is applied to the magnetic sensor.

According to the manufacturing method of the magnetic sensor according to the present embodiment, it is possible to improve the output stability of the magnetic sensor rendering the external magnetic field without substantially changing the film structure of the GMR element and the formation pattern of the magnetic sensor.

Next, the present embodiment will be described in further details by way of samples, which are actually produced for the purpose of experiments and measurements.

In accordance with the manufacturing method of the magnetic sensor according to the seventh embodiment, various samples of magnetic sensors having GMR elements whose thickness is 40 nm are produced, wherein each sample of the magnetic sensor comprises GMR elements each having a band-like shape whose aspect ratio is set to '16', and wherein bias magnetic layers are arranged on both ends of the GMR element, side surfaces of which are subjected to tapered formation (where $\theta$ is set to 75°) in the longitudinal direction.

In the experiment, an external magnetic field is applied to the magnetic sensor and is then forced to disappear; thereafter, an initial magnetic field of 40 Oe is applied in the free layer easy axis direction (i.e., the longitudinal direction of the GMR element), then, the output of the magnetic sensor is measured so as to detect variations of the output compared with the output of the magnetic sensor placed in the initial state. Results show that when the output variations counted from the initial state becomes small, the magnetization direction of the free layer can be precisely restored to match the longitudinal direction of the GMR element in the initial state.

Figure 91:
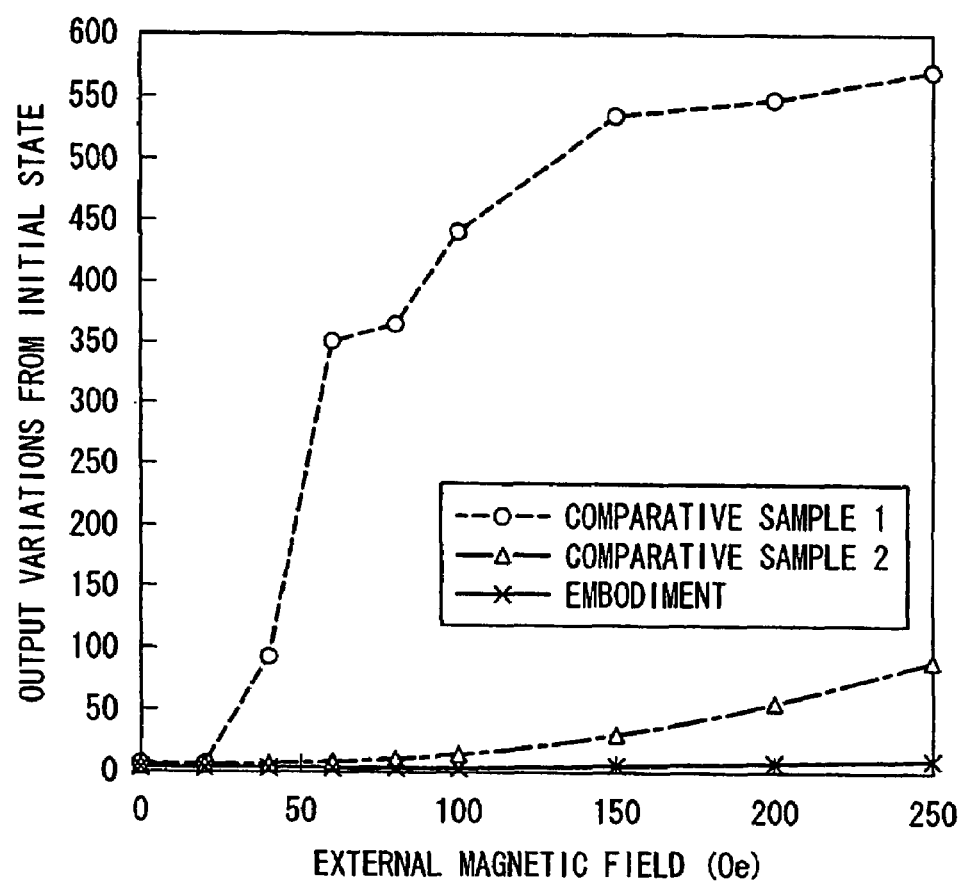
FIG. 91 is a graph showing relationships between an external magnetic field and variations of output of magnetic sensors according to various samples.

FIG. 91 shows relationships between the externally applied magnetic field and the variations of the outputs produced by various samples of magnetic sensors as follows:

Comparative Sample 1 is produced in accordance with the aforementioned manufacturing method, wherein it realizes a magnetic sensor having GMR elements whose thickness is 40 nm, in which the GMR element having a band-like shape is designed to have an aspect ratio '16'. Then, variations of the output of the magnetic sensor of Comparative Sample 1 are measured as described above. Results are plotted by small circle marks connected with dotted lines in FIG. 91.

Comparative Sample 2 is produced in accordance with the aforementioned manufacturing method, wherein it realizes a magnetic sensor having GMR elements whose thickness is 40 nm, in which the GMR element is designed to have an aspect ratio '16', and wherein bias magnetic layers are arranged on both ends of the GMR element. Then, variations of the output of the magnetic sensor of Comparative Sample 2 are measured. Results are plotted by small triangular marks connected with dashed lines in FIG. 91.

In addition, variations of the output of the magnetic sensor according to the present embodiment are also measured, and results are plotted by 'x' marks connected with solid lines in FIG. 91.

FIG. 91 shows that both of the magnetic sensors of Comparative Sample 1 and Comparative Sample 2 must be deviated in the magnetization direction of the free layer after an intense magnetic field is applied thereto compared with the longitudinal direction originally established in the initial state. In contrast, the magnetic sensor of the present embodiment, in which side surfaces of the GMR element are subjected to tapered formation in the longitudinal direction, is advantageous in that the magnetization direction of the free layer can be precisely restored to the initial state even after an intense magnetic field is applied thereto.

Next, various modifications of the seventh embodiment will be described.

Figures 93A, 93B:
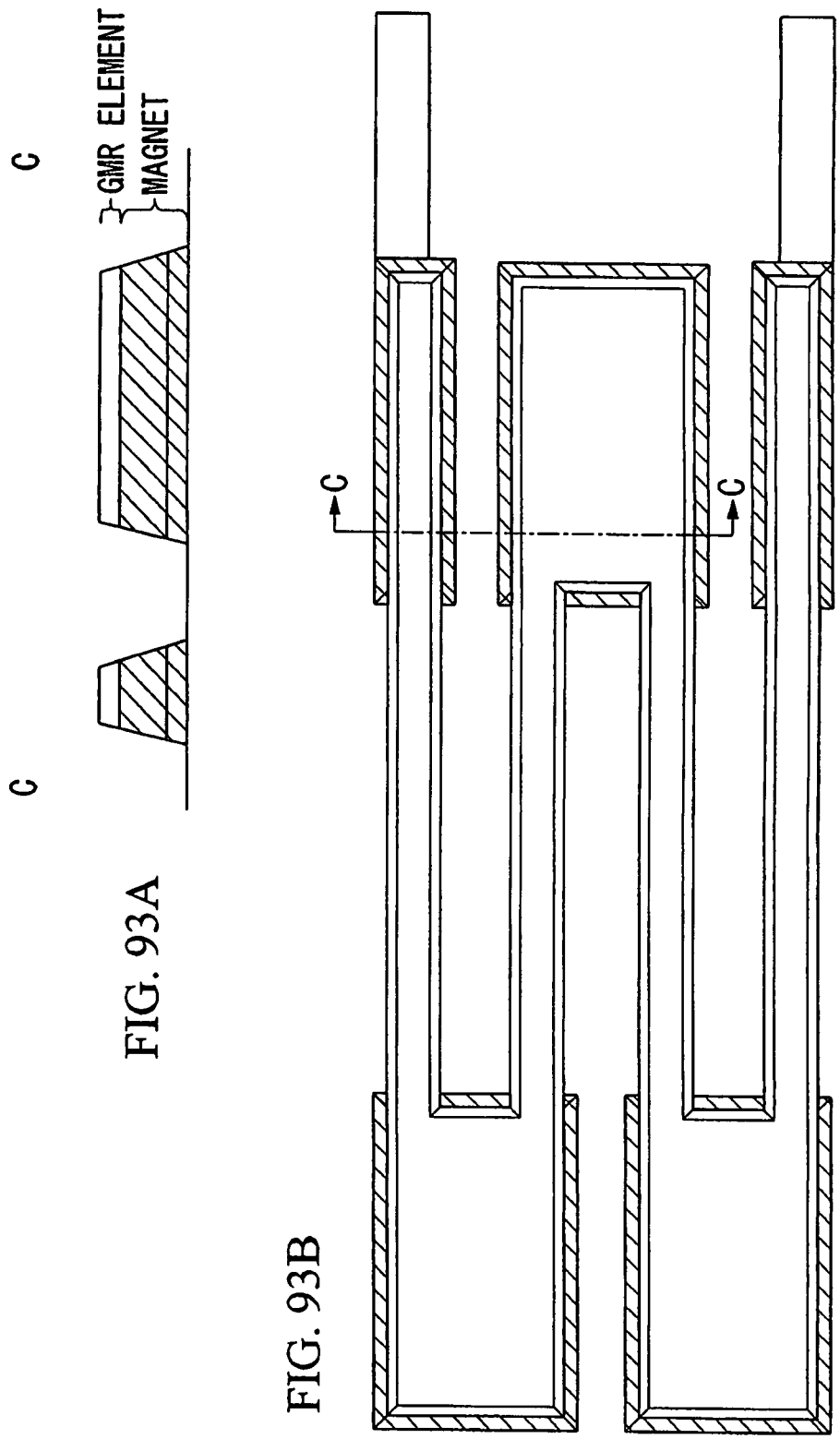
FIG. 93A is a cross-sectional view showing a GMR element along line C-C in accordance with a first modification of the seventh embodiment.
FIG. 93B is a plan view showing an arrangement pattern of GMR elements in accordance with the first modification of the seventh embodiment.

A first modification (see FIGS. 93A and 93B) is designed to improve the adhesion of the bias magnetic layers by employing a zigzag GMR pattern for covering the upper surface of the bias magnetic layer, wherein the GMR element can be subjected to tapered formation.

Figure 94A:
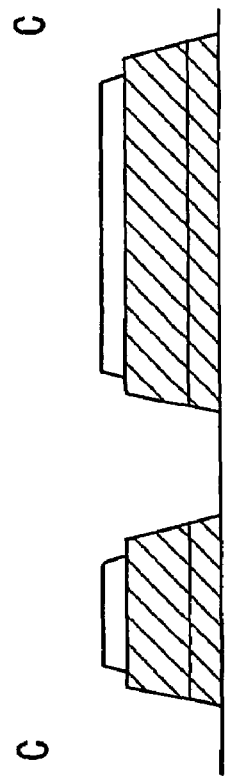
FIG. 94A is a cross-sectional view showing a GMR element along line C-C in accordance with a second modification of the seventh embodiment.
Figure 94B:
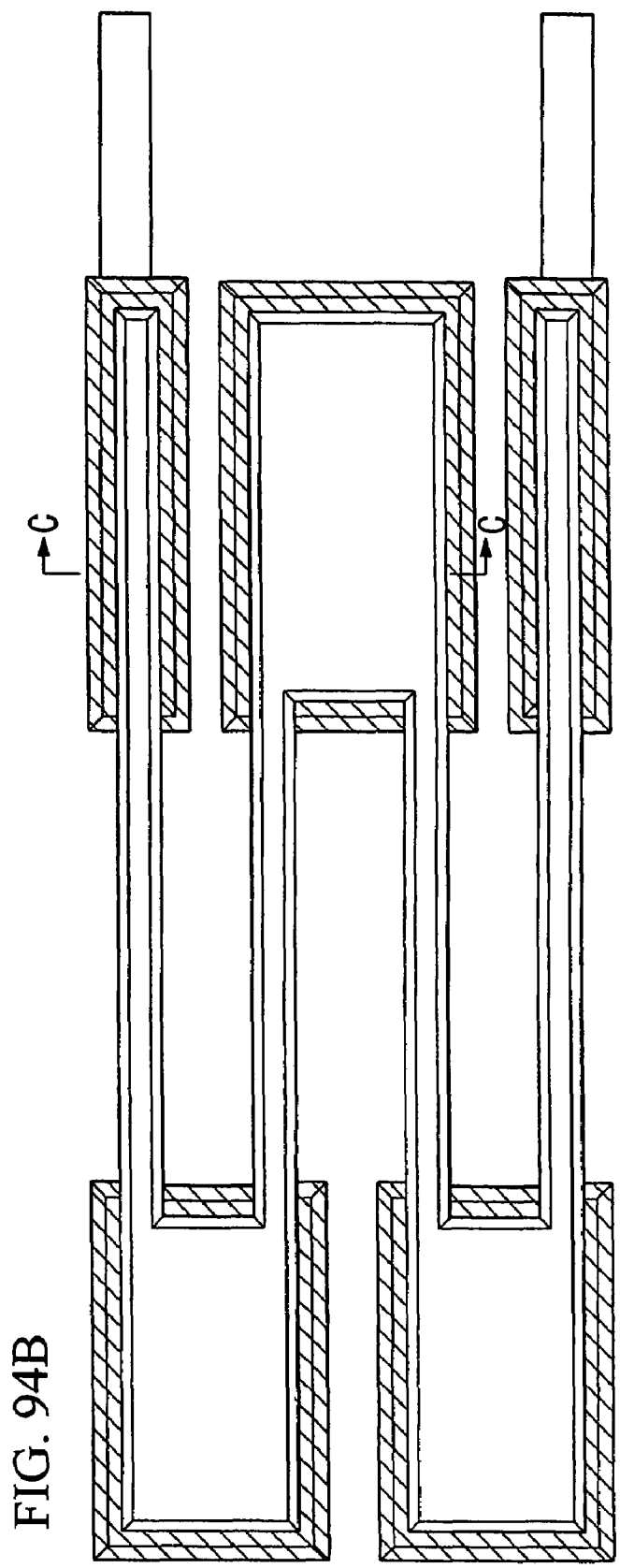
FIG. 94B is a plan view showing an arrangement pattern of GMR elements in accordance with the second modification of the seventh embodiment.

A second modification (see FIGS. 94A and 94B) is designed to provide a certain margin in the positioning accuracy for forming GMR elements on the bias magnetic layer by employing a zigzag GMR pattern in which bend portions of GMR elements are arranged inside of the bias magnetic layer, wherein the GMR element can be subjected to tapered formation.

A third modification (see FIGS. 95A and 95B) is designed to improve the uniformity in the magnetization of the free layer at both ends of GMR elements by employing a zigzag GMR pattern in which cutouts are formed inside of the bent portions of GMR elements, wherein the GMR element can be subjected to tapered formation.

A fourth modification (see FIGS. 96A, 96B, and 96C) is designed to employ a zigzag GMR pattern in which prescribed portions outside of the bent portions of GMR elements are arranged outside of the bias magnetic layer so as to cover the upper surface and side surfaces of the bias magnetic layer, wherein cutouts are formed inside of the bent portion of GMR elements, and wherein the GMR element can be subjected to tapered formation.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A magnetic sensor comprising:
    a substrate;
    a magnetoresistive element of a spin-valve type arranged on the substrate;
    a bias magnetic layer composed of a permanent magnet film, which is connected with both ends of the magnetoresistive element, which are arranged to cover a part of the bias magnetic layer;
    an intermediate layer arranged to cover a part of an upper surface of the bias magnetic layer, which is not covered with the magnetoresistive element; and
    a protective film arranged to cover the magnetoresistive element and the bias magnetic layer respectively;
    wherein the intermediate layer is arranged between the bias magnetic layer, and the protective film.

2. The magnetic sensor according to claim 1, wherein a part of the magnetoresistive element and a part of the substrate are directly connected to each other.

3. The magnetic sensor according to claim 1, wherein both end surfaces of the bias magnetic film have an inclined surface.

4. The magnetic sensor according to claim 1, further comprising an embedded film directly connected to a part of the substrate, and wherein the embedded film is between the bias magnetic film and the substrate.

* * * * *